United States Patent
Tachimori

(10) Patent No.: US 6,388,519 B1
(45) Date of Patent: May 14, 2002

(54) MULTI-INPUT DIFFERENTIAL AMPLIFIER CIRCUIT

(75) Inventor: Hiroshi Tachimori, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/442,404

(22) Filed: Nov. 18, 1999

(30) Foreign Application Priority Data

Nov. 19, 1998 (JP) .......................................... P10-329976

(51) Int. Cl.[7] .................................................. H03F 3/45
(52) U.S. Cl. ........................ 330/253; 330/252; 330/257
(58) Field of Search ................................ 330/252, 253, 330/257, 283

(56) References Cited

U.S. PATENT DOCUMENTS

| | | | | | |
|---|---|---|---|---|---|
| 4,586,000 A | * | 4/1986 | Wagner | ........................ | 330/253 |
| 6,034,568 A | * | 3/2000 | Bonaccio et al. | ........... | 330/253 |

FOREIGN PATENT DOCUMENTS

| | | | | |
|---|---|---|---|---|
| JP | 0100645 | * | 8/1979 | .................. 330/283 |
| JP | P09-93052 | | 4/1997 | |

OTHER PUBLICATIONS

Carl David Todd "FETs as voltage–variable resistors" Application Notes Electronic Design vol. 13 #19 Sep. 13, 1965.*

* cited by examiner

Primary Examiner—Michael B Shingleton
(74) Attorney, Agent, or Firm—Ronald P. Kananen, Esq.; Rader, Fishman & Grauer, PLLC

(57) ABSTRACT

A multi-input differential amplifier circuit capable of maintaining the linear characteristic of the input voltage and the output voltage and capable of enhancing the dynamic range and the linear characteristic. A multi-input differential amplifier circuit configured by forming differential pairs by transistors $MI_{0i}$, $MI_{1i}$, (i=1, 2, . . . , n, n is an integer) with gates which are connected to positive and negative input terminals, the drains of the positive side transistors of the differential pairs being connected to the negative output terminals, the drains of the negative side transistor of the differential pairs being connected to the positive output terminals, and the sources of the transistors of the differential pairs being connected via resistors to current sources for supplying operating currents to the differential pair, whereby the dynamic range can be broadened in comparison with a differential amplifier circuit in which source resistors are not connected and whereby enhancement of the linear characteristic and improvement of the operating speed can be realized.

8 Claims, 49 Drawing Sheets

MULTI-INPUT DIFFERENTIAL AMPLIFIER CIRCUIT

BACKGROUND OF THE INVENTION

1. Field of the Invention

The present invention relates to a multi-input differential amplifier circuit having two or more pairs of positive and negative input terminals.

2. Description of the Related Art

In a differential amplifier circuit, particularly a multi-input type differential amplifier circuit having two or more pairs of positive and negative input terminals, use is made of a configuration in which an input dynamic range is broadened by connecting drains of transistors configuring a positive side input element to a common node, connecting drains of transistors configuring a negative side input element to another common node, and supplying an operating current by a different current source for every differential pair. A multi-input type differential amplifier circuit having such a configuration was disclosed in Japanese Unexamined Patent Publication (Kokai) No. 9-93052.

FIG. 49 is a circuit diagram of an example of the multi-input type differential amplifier circuit disclosed in Japanese Unexamined Patent Publication (Kokai) No. 9-93052. As illustrated, in this multi-input type differential amplifier circuit, n number of differential pairs are configured by MOS transistors $MI_{01}, \ldots, MI_{0n}$ and $MI_{11}, \ldots, MI_{1n}$. The gates of the transistors $MI_{01}, \ldots, MI_{1n}$ configure the positive side input terminals, while the gates of the transistors $MI_{01}, \ldots, MI_{0n}$ configure the negative side input terminals. The drains of the positive side transistors are connected to a common negative node $ND_N$, while the drains of the negative side transistors are connected to a common positive node $ND_P$. The node $ND_N$ is connected to w a supply line of a power supply voltage $V_{DD}$ via a load resistor circuit $RL_1$, while the node $ND_P$ is connected to the supply line of the power supply voltage $V_{DD}$ via a load resistor circuit $RL_0$. The sources of the two transistors such as the transistors $MI_{01}$ and $MI_{11}$, configuring each differential pair are connected to a common node, while operating currents are supplied to these nodes by different current sources. For example, the sources of the pair transistors $MI_{01}$ and $MI_{11}$ are connected to a node $VS_1$, while the sources of the pair transistors $MI_{0n}$ and $MI_{1n}$ are connected to a node $VS_n$. An operating current $ID_1$ is supplied to the node $VS_1$ by a current source $IS_1$, while an operating current $ID_n$ is supplied to the node $VS_n$ by a current source $IS_n$.

FIG. 50 is a view of an example of the multi-input type differential amplifier circuit shown in FIG. 49. Note that, here, a so-called 4-terminal input differential amplifier circuit having two positive and negative input terminals is shown.

As illustrated, in this differential amplifier circuit, an output load circuit is configured by a current mirror circuit configured by p-channel MOS transistors $ML_0$ and $ML_1$. Namely, both of the sources of the transistors $ML_0$ and $ML_1$ are connected to the supply line of the power supply voltage $V_{DD}$, the gates of these transistors are connected to each other, and a connection point thereof is connected to the drain of the transistor $ML_0$. The drain of the transistor $ML_0$ is connected to the common node $ND_P$ of the drains of the positive side transistors $MI_{01}$ and $M_{02}$, while the drain of the transistor $ML_{01}$ is connected to the common node $ND_N$ of the negative side transistors $MI_{11}$ and $MI_{12}$.

Further, the current source for supplying the operating current to each differential pair is configured by n-channel MOS transistors $MS_1$ and $MS_2$ to the gate of which a predetermined bias voltage is applied. For example, the drain of the transistor $MS_1$ is connected to the node $VS_1$, while the drain of the transistor $MS_2$ is connected to the node $VS_2$. A bias voltage $V_{BIAS}$ is input to the gates of these transistors $MS_1$ and $MS_2$. Note that the bias voltage $V_{BIAS}$ is created by the current source $IS_0$ and the nMOS transistor $MS_0$.

The node ND, and the node $ND_N$ configure a non-inverted output terminal DFO(+) and an inverted output terminal DFO(−) of the differential amplifier circuit. The output signal of the inverted output terminal DFO(−) is input to a push-pull output stage configured by transistors $PT_1$ and $NT_1$ via a source follower configured by transistors $ML_2$ and $MS_3$. The output signal of the source follower is amplified by the push-pull output stage and output to the output terminal OUT. Note that a resistance element $R_1$ and a capacitor $C_1$ forming a phase compensation circuit are connected in series between the inverted output terminal DFO(−) of the differential amplifier circuit and the output terminal OUT of the push-pull output stage.

FIG. 51 is a view of an example of another configuration of the multi-input type differential amplifier circuit. As illustrated, the differential amplifier circuit of the present example is a 6-terminal input differential amplifier circuit configured by three differential pairs. The configuration of the circuit of the example is substantially the same as the 4-terminal input differential amplifier circuit shown in FIG. 50 except that it has three differential pairs. Note that in this circuit, the current amplification rates of the transistors configuring the differential pairs are set to different values, therefore an amplification signal weighted with respect to the input signal is obtained.

When the current amplification rate of transistors $MI_{01}$ and $MI_{11}$ is $\beta_1$, the current amplification rate of the transistors $MI_{02}$ and $MI_{12}$ is $\beta_2$, the current amplification rate of transistors $MI_{03}$ and $MI_{13}$ is $\beta_3$, and the ratio of the current amplification rates of the transistors $MS_1$, $MS_2$, and $MS_3$ is $\beta_1:\beta_2:\beta_3$, the differential signal input to each differential pair is weighted in accordance with the current amplification rate of the transistors configuring each differential pair, thus the amplification signal is obtained.

In the multi-input type differential amplifier circuit mentioned above, when the differential amplifier circuit is used by supplying a negative feedback between the input and the output, the usual differential amplifier circuit having only one pair of positive and negative input terminals operates based on a state where the voltage of the positive side input terminal and the voltage of the negative side input terminal are equal (virtual ground), but in contrast, in a multi-input type differential amplifier circuit, the voltage of the positive side input terminal and the voltage of the negative side input terminal do not have to be equal for every pair, so it operates based on a state where the summation of voltages of the positive side input terminals and the summation of voltages of the negative side input terminals become equal.

Namely, a multi-input type differential amplifier circuit must operate even in a case where voltages of the positive side input terminal and the negative side input terminal are different for every differential pair. When looking at the drain voltage of the transistor configuring a current source for supplying an operating current to a differential input pair, however, this becomes the output voltage of an OR type source follower circuit using positive and negative input terminals as two input terminals. For this reason, when there is a difference between the voltages of the positive and negative input terminals of more than the threshold voltage of the transistors configuring an input element, the output voltage of the OR type source follower circuit becomes a voltage shifted from the gate voltage of the transistor which is further turned on between the two transistors configuring the input element by the value of the threshold voltage $V_{th}$, so a voltage required for turning on the related transistor will not be supplied between the gate and the source of the transistor configuring the other input element.

As a result, when the voltages of the positive and negative input terminals are separated from each other more than the value of the threshold voltage $V_{th}$ of the transistors configuring the input element, a state where a current regulated by a constant current source flows through the transistors configuring one input element, while no current flows through the transistors configuring the other input element is exhibited, so there is the disadvantage that it no longer appears as a change of the current. This means that the voltage change of the node to which the drains of the transistors configuring the positive side input element, that is, the output of the differential input circuit, are commonly connected and the other node to which the drains of the transistors configuring the negative side input element are commonly connected, that is, the inverted output terminal and the non-inverted output terminal of the differential input circuit, deviates from the output voltage expected from a multi-input differential amplifier circuit.

Note that, in the multi-input type differential amplifier circuit mentioned above, in the case of an operational amplifier circuit configured by supplying negative feedback between the input and the output, the voltage difference between the positive and negative output nodes of the differential input circuit is small, and each voltage becomes substantially constant.

On the other hand, in the case of a comparison and judgment circuit using a multi-input differential amplifier circuit without supplying a negative feedback, at least one of the positive and negative output nodes of the differential input circuit has amplitude, therefore the voltage conditions under which transistors configuring all input elements and constant current sources have a linear characteristic become further narrower. For this reason, there is the disadvantage that, in the case of the comparison and judgment circuit, the expected characteristics cannot be obtained by just an above multi-input type differential amplifier circuit supplying operating currents by different current sources for every differential input.

SUMMARY OF THE INVENTION

An object is to provide a multi-input type differential amplifier circuit capable of maintaining the linear characteristic of the input voltage and the output voltage even in a case where there is a difference between the input voltages of the differential input terminals of more than the threshold voltage of the transistors configuring the differential pair and capable of enhancing the dynamic range and the linear characteristic.

To achieve the above object, a multi-input type differential amplifier circuit of the present invention is a multi-input differential amplifier circuit having at least two pairs of positive and negative input terminals, comprising at least two differential pairs each comprising a first and a second transistor with control gates which are respectively connected to said positive and negative input terminals, with one terminals which are connected to first and second output terminals, and with other terminals which are connected to current supply nodes via first and second resistors, and at least two current sources for supplying operating currents to said current supply nodes in said differential pairs, first and second load circuits being connected between said first and second output terminals and a supply line of a first power supply voltage.

Further, a multi-input type differential amplifier circuit of the present invention has at least two differential pairs each comprising a first and a second transistor with control gates which are respectively connected to said positive and negative input terminals, with one terminals which are connected to first and second output terminals, and with other terminals which are connected to current supply nodes via third and fourth resistors, and at least two current sources for supplying operating currents to said current supply nodes in said differential pairs, first and second load circuits being connected between said first and second output terminals and a supply line of a first power supply voltage, a predetermined bias voltage being applied to the control gates of said third and fourth transistors.

Further, in the present invention, preferably said current sources for supplying the operating currents to said each differential pair are each configured by a transistor to the control gate of which the predetermined bias voltage is applied, with one terminal which is connected to said current supply node, and with another terminal which is connected to the supply line of a second power supply voltage.

Further, in the present invention, preferably, said first and second load circuits are configured by resistors connected between said first and second output terminals and the supply line of said first power supply voltage or said first and second load circuits are configured by first and second load configuring transistors which are connected between said first and second output terminals and the supply line of said first power supply voltage and configure a current mirror circuit.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Below, preferred embodiments will be described with reference to the accompanying drawings.

First Embodiment

Figure 1:
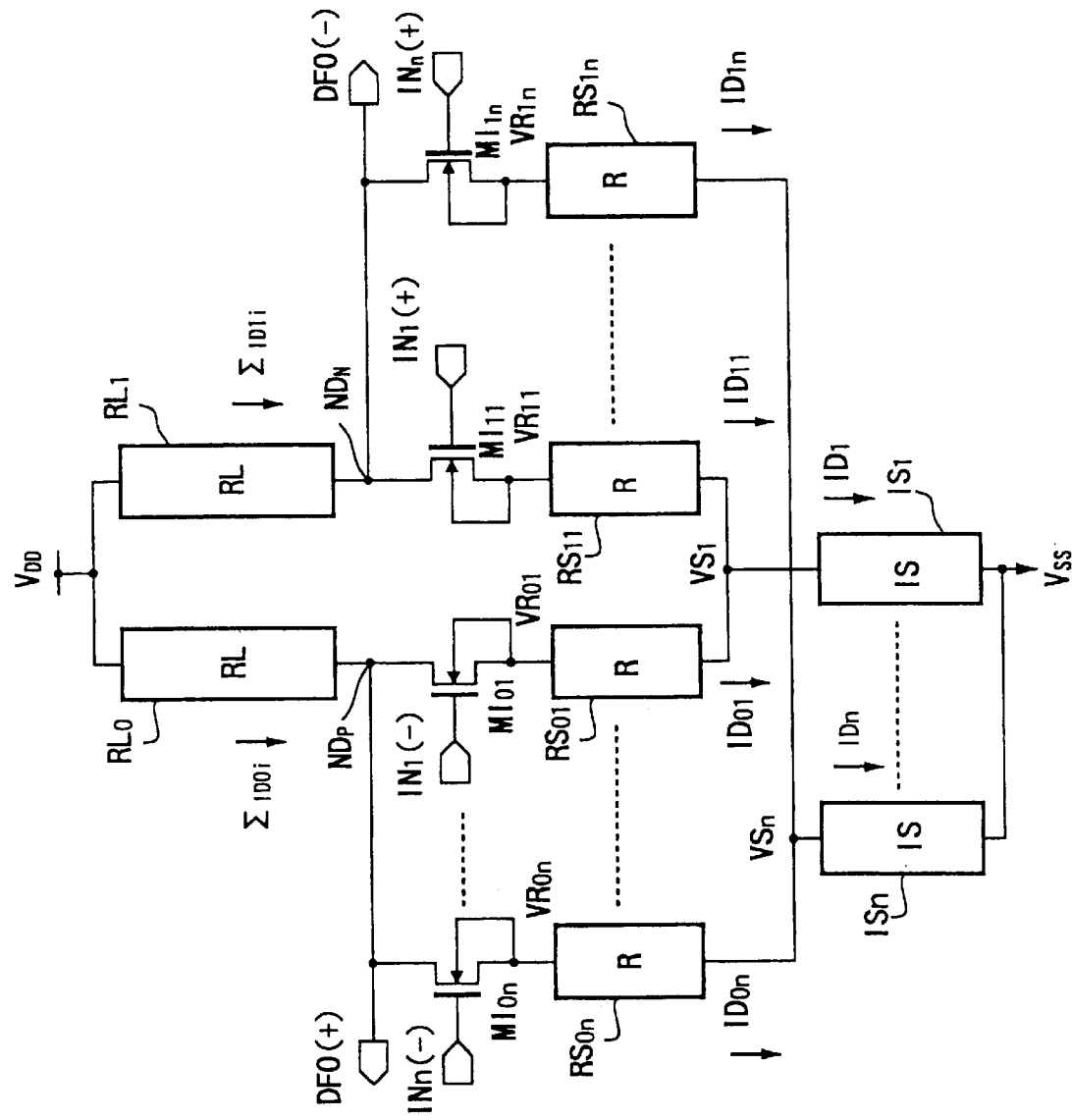
FIG. 1 is a circuit diagram of a first embodiment of a multi-input type differential amplifier circuit according to the present invention.

FIG. 1 is a circuit diagram of a first embodiment of a multi-input type differential amplifier circuit according to the present invention. As illustrated, the multi-input type differential amplifier circuit of the present embodiment has n number of differential pairs configured by n pairs of MOS transistors $MI_{01}, \ldots, MI_{0n}$, and $MI_{11}, \ldots, MI_{1n}$. The gates of the transistors $MI_{11}, \ldots, MI_{1n}$ configure the positive side input terminals, while the gates of the transistors $MI_{01}, \ldots, MI_{0n}$ configure the negative side input terminals. The drains of the positive side transistors are connected to the common node $ND_N$, while the drains of the negative side transistors are connected to the common node $ND_P$. The node $ND_N$ is connected to the supply line of the power supply voltage $V_{DD}$ via the output load resistor circuit $RL_1$, while the node $ND_P$ is connected to the supply line of the power supply voltage $V_{DD}$ via the output load resistor circuit $RL_0$. The node $ND_P$ is connected to the non-inverted output terminal DFO(+) of the multi-input differential amplifier circuit, while the node $ND_N$ is connected to the inverted output terminal DFO(−) of the multi-input differential amplifier circuit.

The sources of the transistors configuring each differential pair are connected to the constant current source via resistance elements. For example, the sources of the transistors $MI_{01}$ and $MI_{11}$ are connected to the node $VS_1$ via the resistance elements $RS_{01}$, and $RS_{11}$. The sources of the transistors $MI_{0n}$ and $MI_{1n}$ are connected to the node $VS_n$ via the resistance elements $RS_{0n}$, and $RS_{1n}$. The node $VS_1$ is connected to the constant current source $IS_1$, while the node $VS_n$ is connected to the constant current source $IS_n$.

For explaining the principle of the operation of the multi-input type differential amplifier circuit of the present embodiment, first, an explanation will be made of the configuration and the operation of a 2-terminal input differential amplifier circuit, that is, the basic configuration of a 2n-terminal input differential amplifier circuit.

Figure 2:
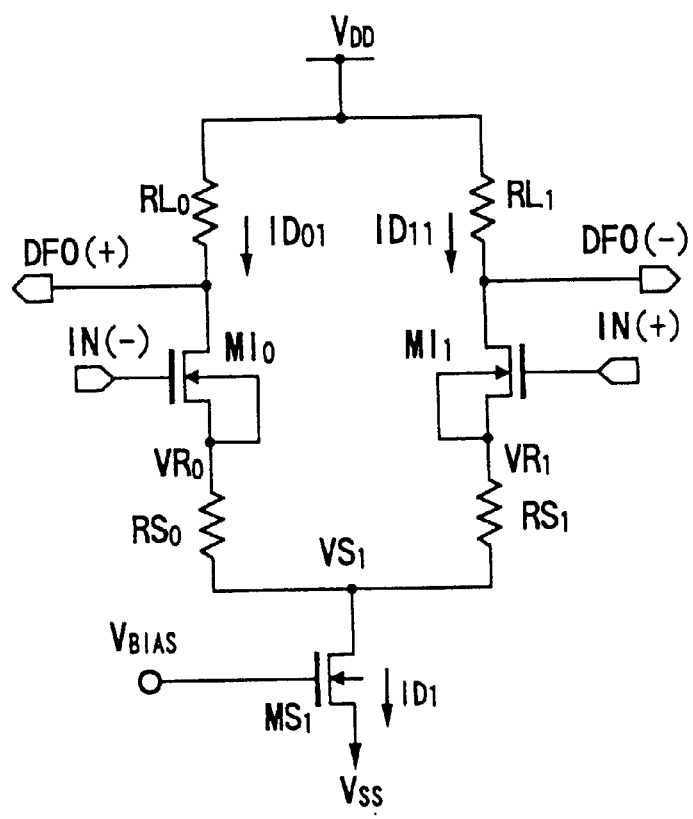
FIG. 2 is a circuit diagram of an example of the configuration of a 2-input differential amplifier circuit.
Figure 3:
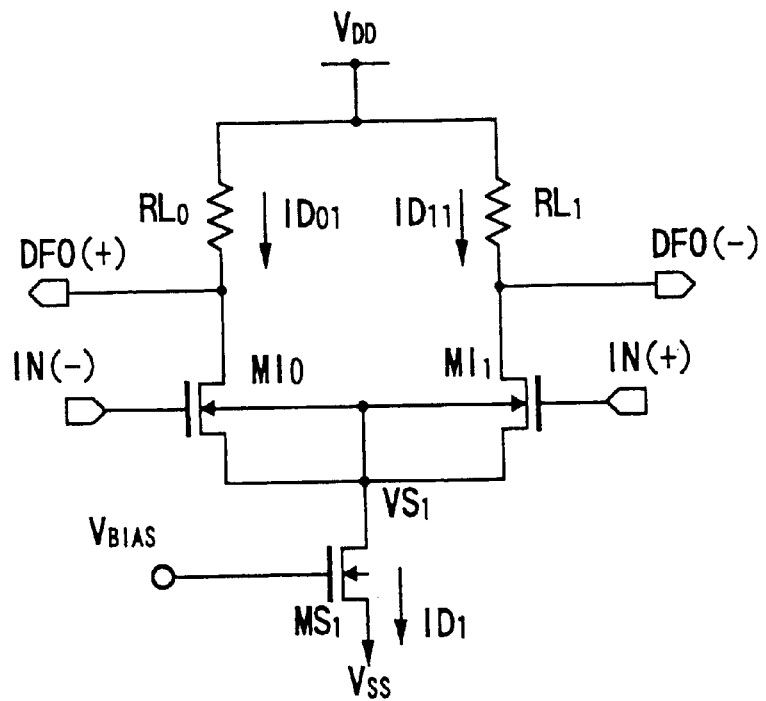
FIG. 3 is a circuit diagram of an example of a conventional 2-input differential amplifier circuit.

FIG. 2 is a circuit diagram of an example of the configuration of a 2-terminal input differential amplifier circuit—a basic element of the configuration of the multi-input type differential amplifier circuit of the present invention. Note that, for comparison with this, an example of the configuration of the conventional 2-terminal input differential amplifier circuit is shown in FIG. 3 together.

As shown in FIG. 2, this 2-terminal input differential amplifier circuit is configured by a differential pair comprising nMOS transistors $MI_0$ and $MI_1$, resistance elements $RL_0$ and $RL_1$ configuring the output load circuits of that differential pair, resistance elements $RS_0$ and $RS_1$ connected to the source side of the transistors $MI_0$ and $MI_1$, and the nMOS transistor $MS_1$ configuring the current source for supplying an operating current to the differential pair.

The gates of the transistors $MI_0$ and $MI_1$ are connected to the differential input terminals IN(−) and IN(+). The drain of the transistor $MI_0$ is connected to the supply line of the power supply voltage $V_{DD}$ via the resistance element $RL_0$, while the drain of the transistor $MI_1$ is connected to the supply line of the power supply voltage $V_{DD}$ via the resistance element $RL_1$. The sources of the transistors $MI_0$ and $MI_1$ are connected to the node $VS_1$ via the resistance elements $RS_0$ and $RS_1$. The substrates of the transistors $MI_0$ and $MI_1$ are connected to the sources of the transistors $MI_0$ and $MI_1$.

The drain of the transistor $MS_1$ is connected to the node $VS_1$, the source thereof is connected to a common voltage $V_{SS}$, and the gate is connected to the input terminal of the bias voltage $V_{BIAS}$. Note that the bias voltage $V_{BIAS}$ is set so that the transistor $MS_1$ operates in a saturation state.

The connection point of the drain of the transistor $MI_0$ and the resistance element RL, forms the non-inverted output terminal DFO(+), while the connection point of the drain of the transistor $MI_1$ and the resistance element $RL_1$ forms the inverted output terminal DFO(−).

On the other hand, in the conventional 2-terminal input differential amplifier circuit shown in FIG. 3, the resistor is not connected to the source side of the transistors $MI_0$ and $MI_1$ configuring the differential pair. Namely, the sources of the transistors $MI_0$ and $MI_1$ are connected to the node $VS_1$, while the substrates of the transistors $MI_0$ and $MI_1$ are connected to the node $VS_1$.

Figure 4:
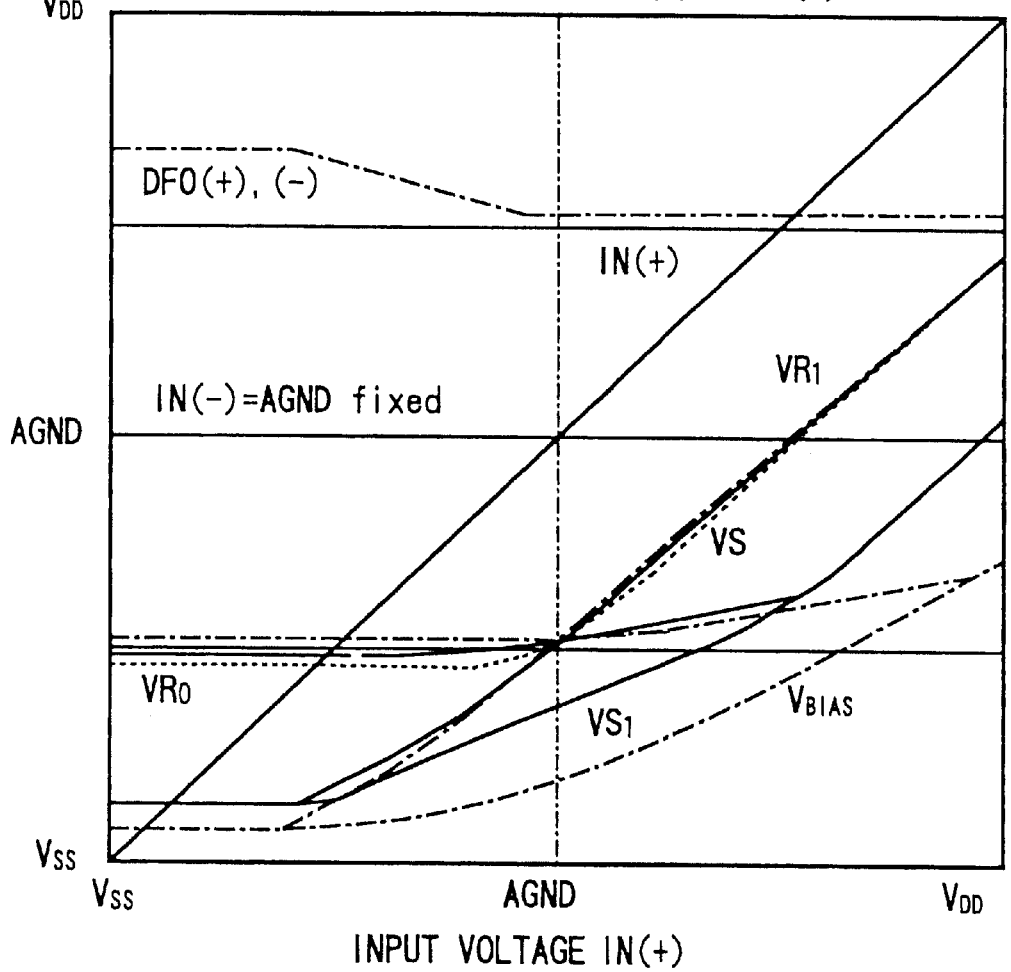
FIG. 4 is a graph of the change of the internal operating voltage-input voltage dependency due to the source resistance of a processing circuit supplying negative feedback between the input and the output of a 2-input differential amplifier circuit.

FIG. 4 is a graph showing the relationship between the change of the input voltage and the changes of the internal circuit voltages of the 2-terminal input differential amplifier circuits shown in FIGS. 2 and 3, when the circuits of FIGS. 2 and 3 are operated as the operational circuits where the negative feed back between the input and the output is performed and the values of the source resistance elements are varied.

An abscissas of FIG. 4 shows the change of the non-inverted input voltage IN(+) of the 2-terminal input differential amplifier circuits in FIGS. 2 and 3 where the non-inverted input voltage IN(+) is varied between the voltage $V_{SS}$ and the voltage $V_{DD}$. In this example, the inverted input voltage IN(−) is fixed at an intermediate voltage AGND between the voltage $V_{SS}$ and the voltage $V_{DD}$, namely, IN(−)=AGND fixed. The voltage AGND is 0V, for example.

An ordinates of FIG. 4 shows the voltage changes of the following internal voltages in the 2-terminal input differential amplifier circuits in FIGS. 2 and 3.

Curves DFO(+) and DFO(−): The voltages at the output terminals DFO(+) and DFO(−).

Curve $VR_1$: The voltage at the source of the transistor $MI_1$ in FIG. 2.

Curve $VR_0$: The voltage at the source of the transistor $MI_0$ in FIG. 2.

Curve $VS_1$: The voltage at the node $VS_1$ of FIG. 2.

Curve VS: The voltage at the node VS of FIG. 3.

Curve $V_{BIAS}$: The bias voltage applied to the circuits in FIG. 2 and 3.

The curves shown by the dotted lines show the results when the resistance elements are not provided to the sources of the transistors $MI_1$ and $MI_1$ in the circuit of FIG. 2, and the results of the circuit of FIG. 3 where the resistance elements are not provided.

The curves shown by the solid and one dot lines show the results when the value of the resistance elements connected to the sources of the transistors $MI_0$ and $MI_1$ in the circuit of FIG. 2 is the maximum value. The curves shown by the solid lines show the results when the values of the resistance elements connected to the sources of the transistors $MI_0$ and $MI_1$ in the circuit of FIG. 2 is the middle value between the maximum value and 0.

Figure 5:
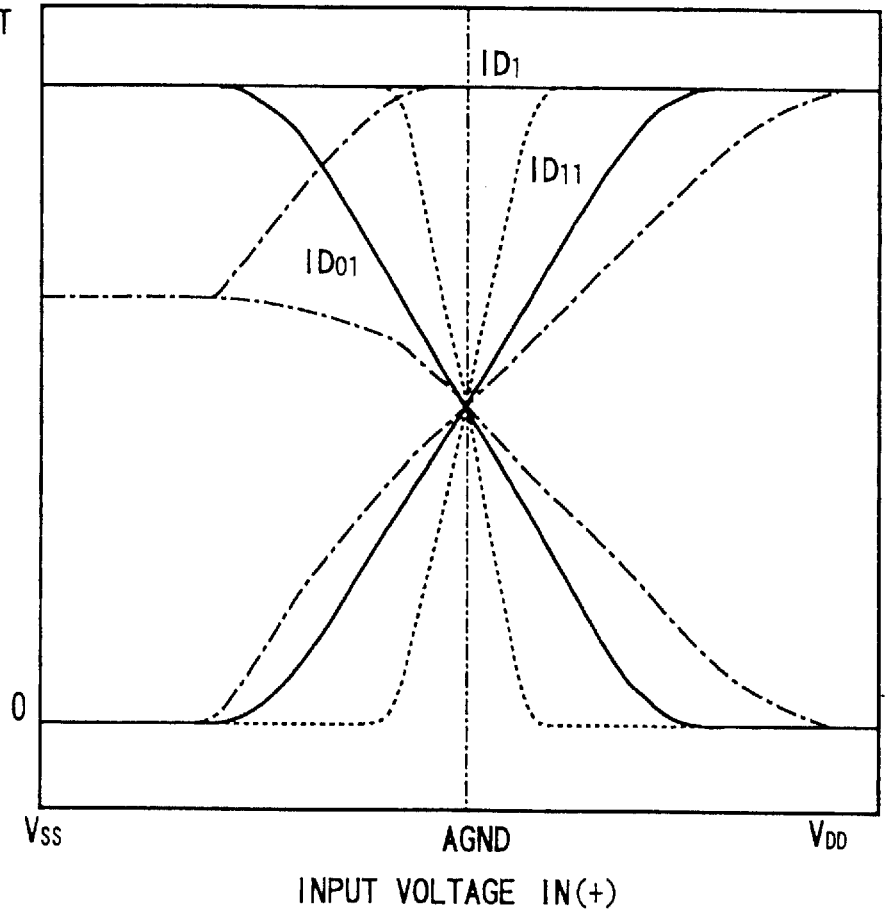
FIG. 5 is a graph of the change of the current-input voltage dependency due to the source resistance of a processing circuit supplying negative feedback between the input and the output of the 2-input differential amplifier circuit.

FIG. 5 is a graph showing the relationship between the change of the input voltage and the changes of the internal currents of the 2-terminal input differential amplifier circuit shown in FIGS. 2 and 3.

An abscissas of FIG. 5 shows the change of the non-inverted input voltage IN(+) of the 2-terminal input differential amplifier circuits in FIGS. 2 and 3.

An ordinate of FIG. 5 shows the current changes of the following internal currents of the circuit in FIGS. 2 and 3 when the circuits in FIGS. 2 and 3 are operated under the conditions of FIG. 5.

Curve $ID_1$: The current passing-through the current source (the transistor $MS_1$).

Curve $ID_0$: The current passing-through the load resistance element $RL_0$.

Curve $ID_{11}$: The current passing-through the load resistance element $RL_1$.

The dotted curves, the solid curves and the solid-one dot lines show the results when the resistance elements are not connected to the sources of the transistors $MI_0$ and $MI_1$, when the values of the resistance elements are middle, and when the values of the resistance elements are the maximum.

Note that the readings of the curves of FIGS. 4 and 5 are applied to the following similar drawings.

Figure 6:
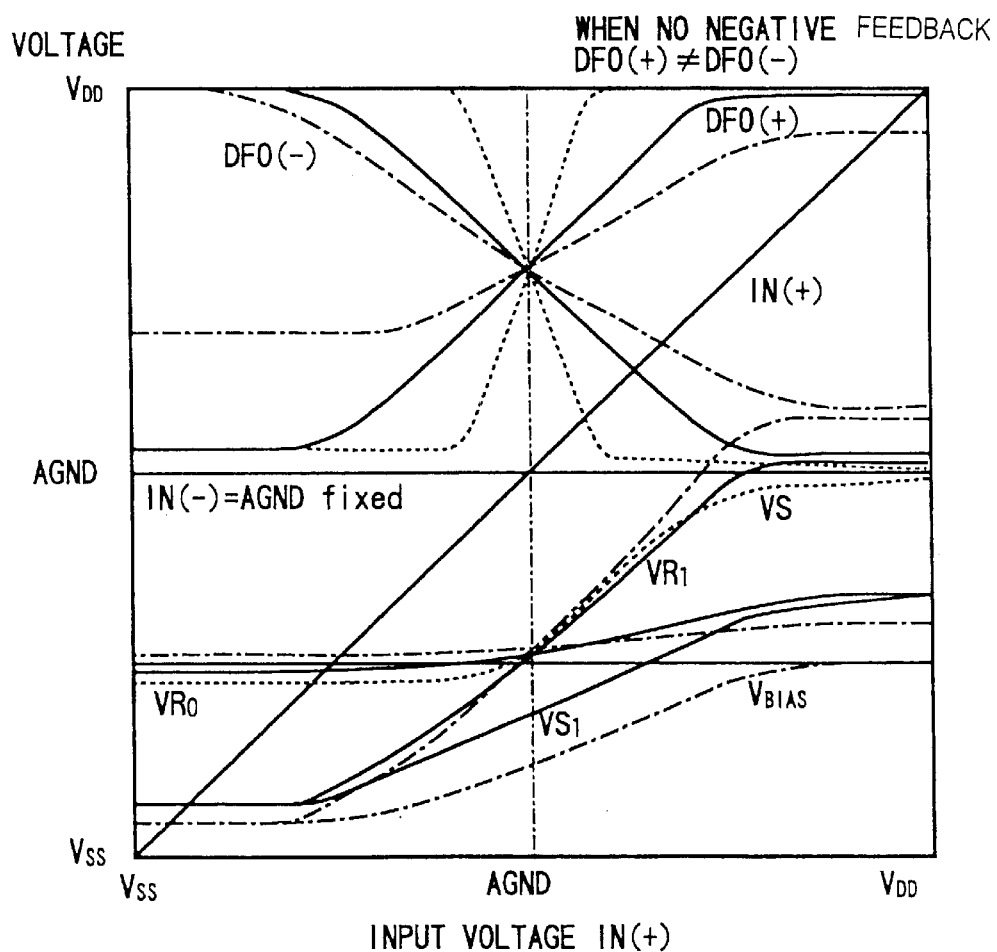
FIG. 6 is a graph of the change of the internal voltage-input voltage dependency due to the source resistance of a comparison and judgment circuit in which there is no negative feedback between the input and the output of the 2-input differential amplifier circuit.
Figure 7:
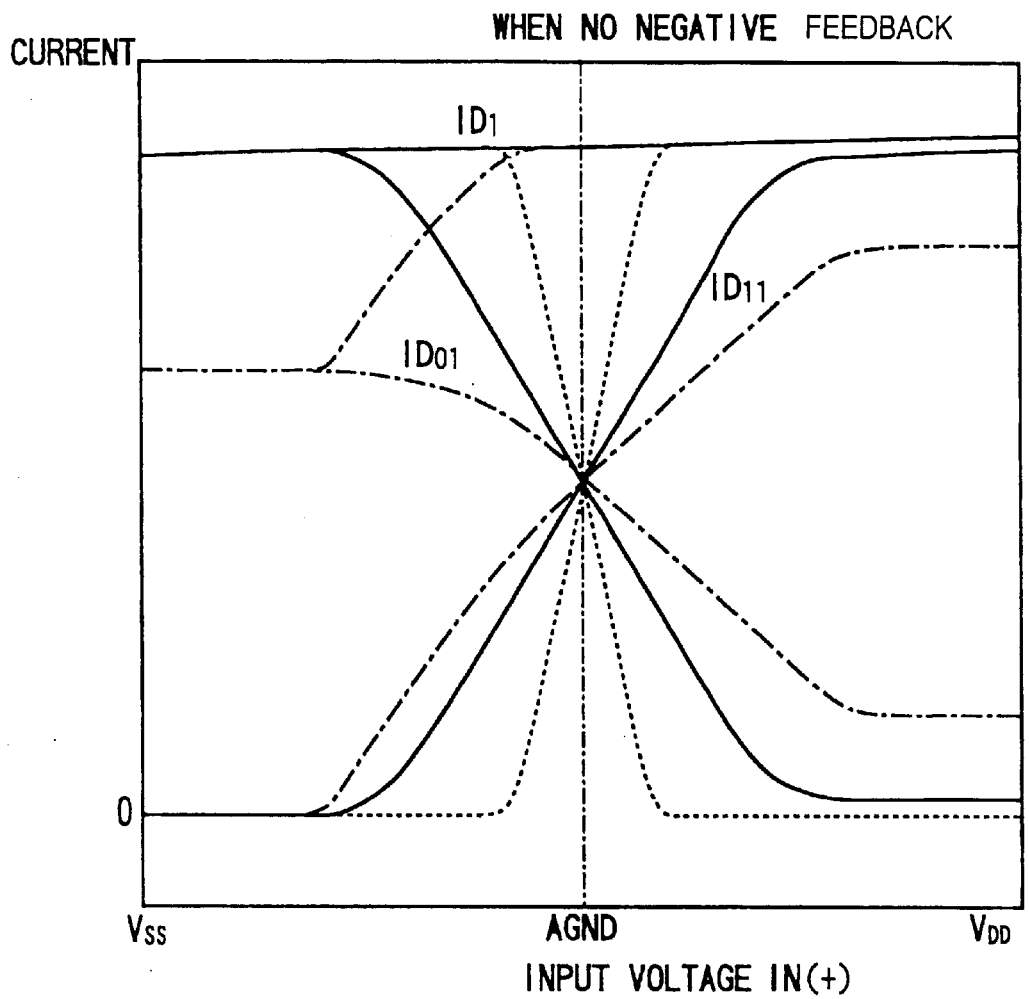
FIG. 7 is a graph of the change of the current-input voltage dependency due to the source resistance of a comparison and judgment circuit in which there is no negative feedback between the input and the output of the 2-input differential amplifier circuit.

FIGS. 6 and 7 are graphs of the change of the internal operating voltage-input voltage dependency of the differential amplifier circuit due to the source resistance value and the change of the current-input voltage dependency due to the source resistance value where there is no above negative feedback.

Figure 8:
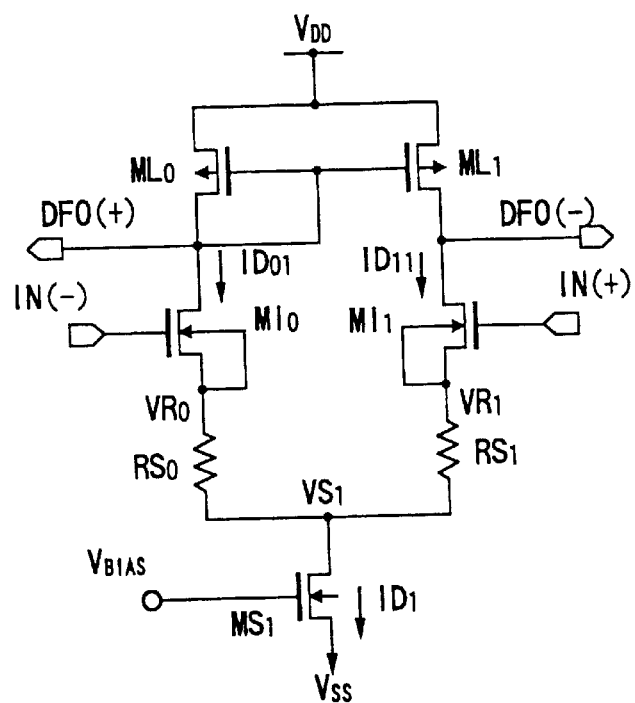
FIG. 8 is a circuit diagram of another example of the configuration of the 2-input differential amplifier circuit.

FIG. 8 shows an example of another configuration of a 2-terminal input differential amplifier circuit. As illustrated, in this 2-terminal input differential amplifier circuit, the current mirror circuit comprising the pHOS transistors $ML_0$ and $ML_0$ configures the output load circuit of the differential amplifier circuit. As illustrated, both of the sources of the transistors $ML_0$ and $ML_1$ are connected to the supply line of the power supply voltage $V_{DD}$, the gates are connected to each other, and the connection point thereof is connected to the drain of the transistor $ML_0$. Further, the drain of the transistor $ML_0$ is connected to the drain of the transistor $MI_0$ configuring the differential pair, the connection point thereof forms the non-inverted output terminal DFO(+), the drain of the transistor $ML_1$ is connected to the drain of the transistor $MI_1$ configuring the differential pair, and the connection point thereof forms the inverted output terminal DFO(−).

The other components besides the load circuit are the same as the components of the 2-terminal input differential amplifier circuit shown in FIG. 2. Namely, the resistance element $RS_0$ is connected between the source of the transistor $MI_0$ and the node $VS_1$, while the resistance element $RS_1$ is connected between the source of the transistor $MI_1$ and the node $VS_1$. The operating current is supplied to the node $VS_1$ by the current source configured by the transistor $MS_1$ to the gate of which the bias voltage $V_{BIAS}$ is supplied.

Figure 9:
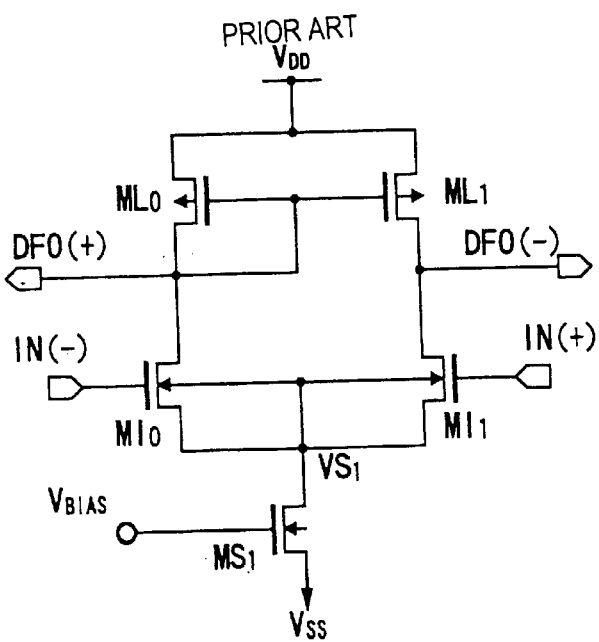
FIG. 9 is a circuit diagram of another example of the configuration of a conventional 2-input differential amplifier circuit.

FIG. 9 shows an example of a conventional 2-terminal input differential amplifier circuit for comparison. As illustrated, in this differential amplifier circuit, resistors are not connected to the source side of the transistors $MI_1$ and $MI_1$ configuring the differential pair. The sources of the transistors $MI_0$ and $MI_1$ are connected to each other, and the operating current is supplied from the current source comprised of the transistor $MS_1$ to the node $VS_1$ of the connection point thereof.

Figure 10:
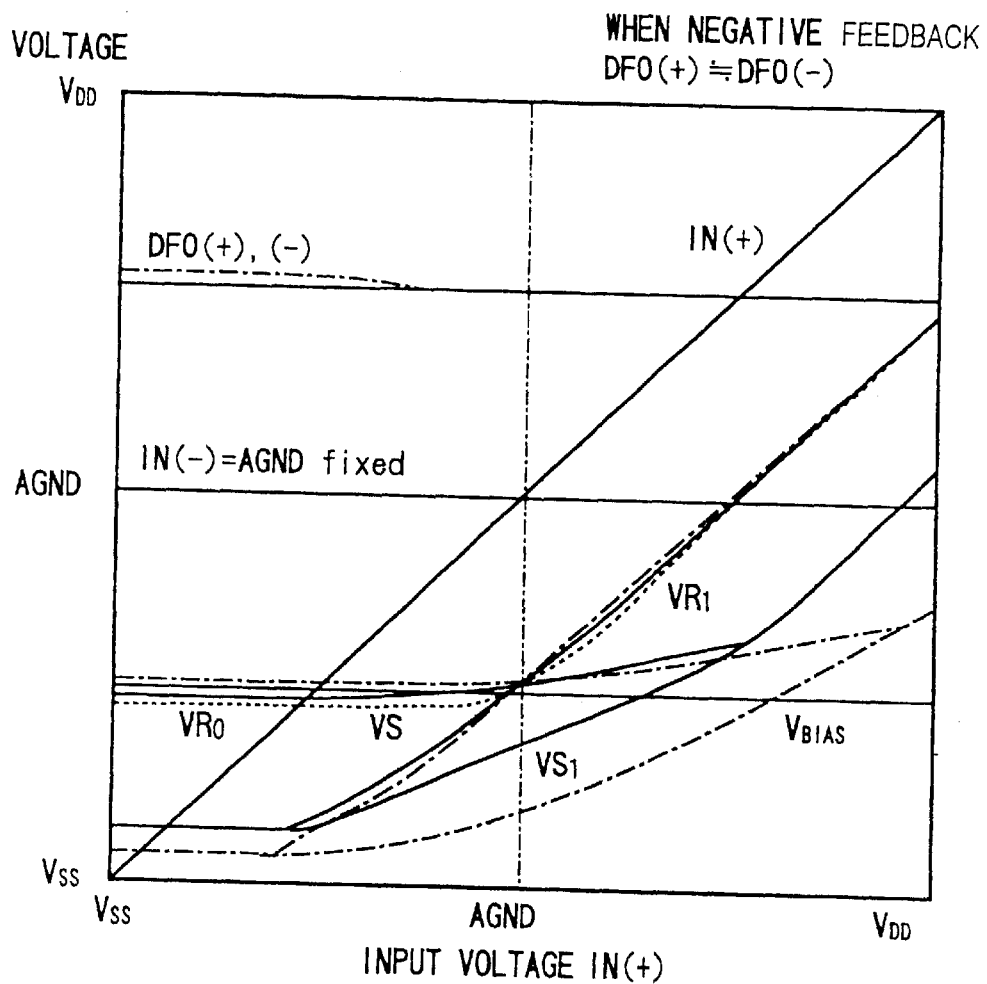
FIG. 10 is a graph of the change of the internal voltage-input voltage dependency due to the source resistance of a processing circuit supplying negative feedback between the input and the output of a 2-input differential amplifier circuit.
Figure 11:
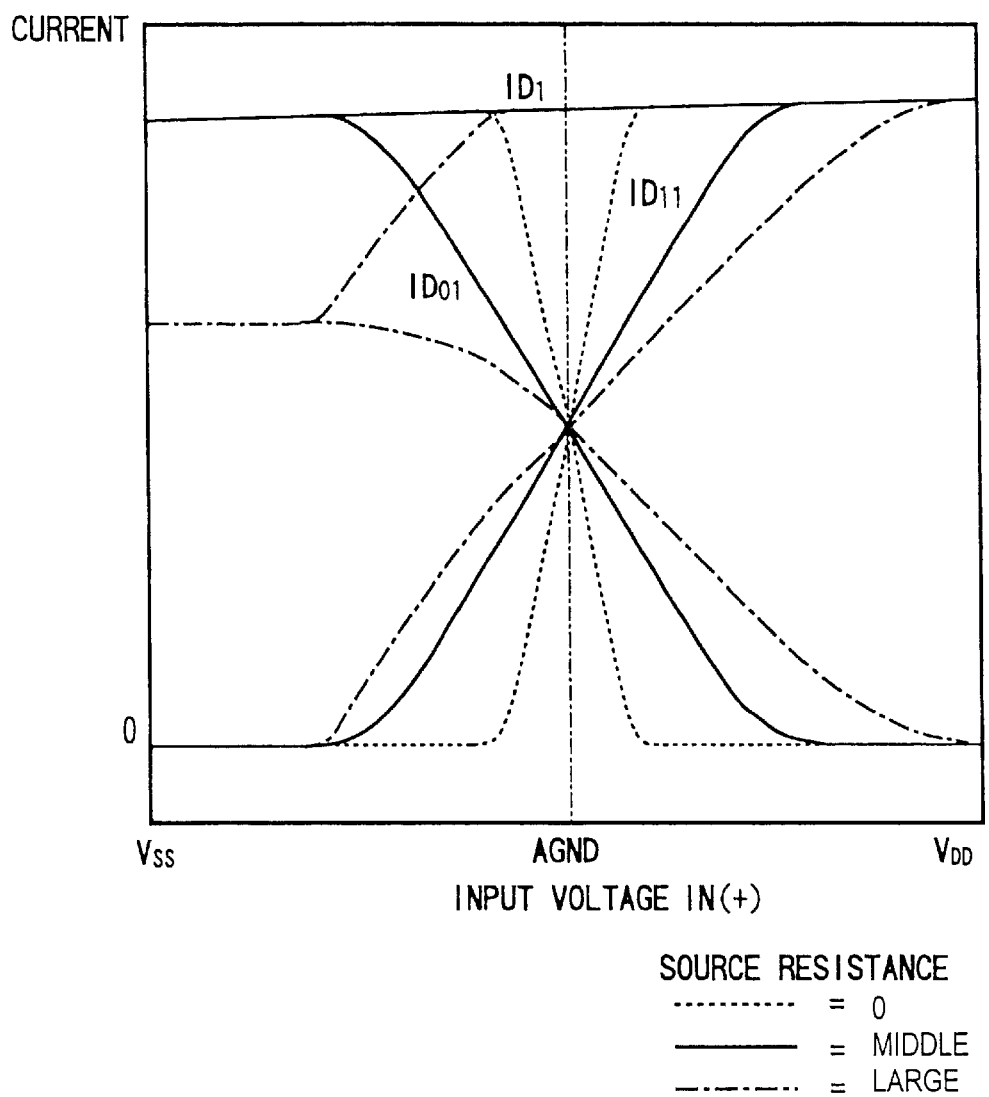
FIG. 11 is a graph of the change of the current-input voltage dependency due to the source resistance of a processing circuit supplying negative feedback between the input and the output of a 2-input differential amplifier circuit.

FIG. 10 is a graph of the change of the internal operating voltage-input voltage dependency of a differential amplifier circuit due to the source resistance value in the case where the differential amplifier circuit shown in FIG. 8 and FIG. 9 is operated as a processing circuit supplying negative feedback between the input and the output. Further, FIG. 11 is a graph of the change of the operating current-input voltage dependency due to the source resistance value in this case.

Figure 12:
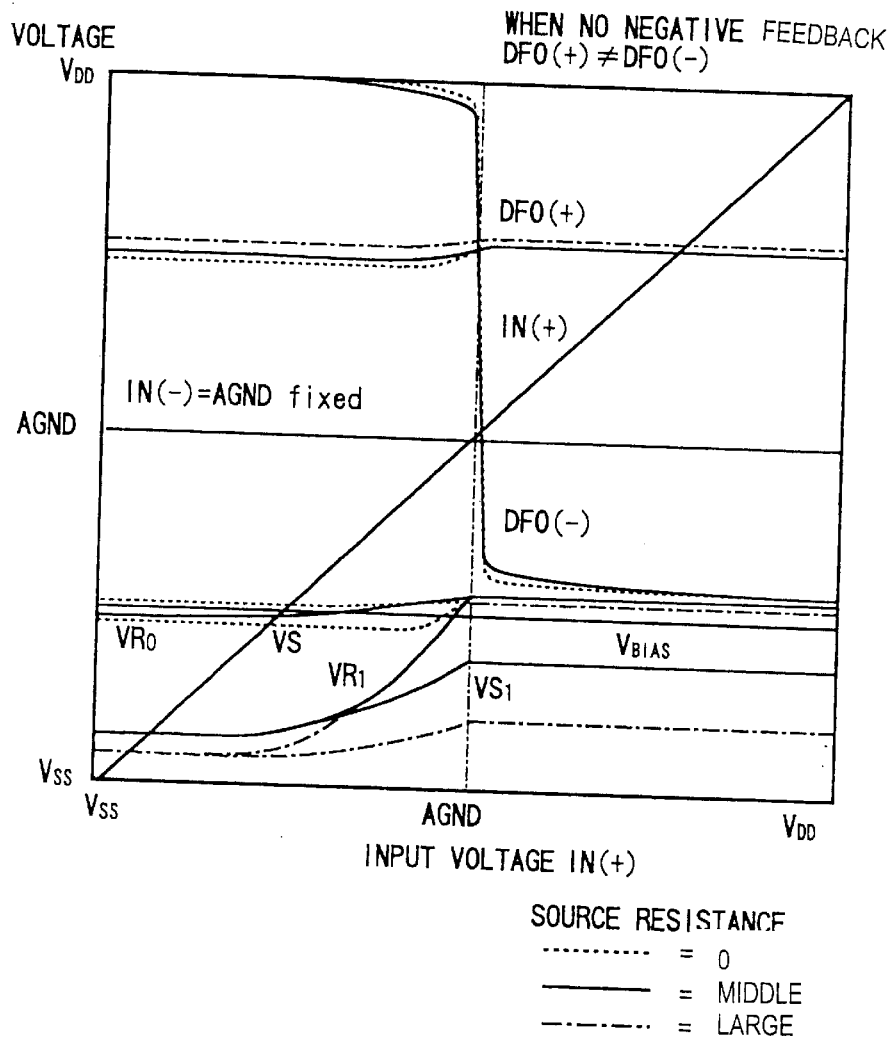
FIG. 12 is a graph of the change of the internal voltage-input voltage dependency due to the source resistance of a comparison and judgment circuit in which there is no negative feedback between the input and the output of the 2-input differential amplifier circuit.

FIG. 12 is a graph of the change of the internal operating voltage-input voltage dependency of the differential amplifier circuit due to the source resistance value in the case where the differential amplifier circuit shown in FIG. 8 and FIG. 9 is operated as a comparison and judgment circuit not supplying negative feedback between the input and the output. Further, FIG. 13 is a graph of the change of the operating current-input voltage dependency due to the source resistance value in this case.

Figure 14:
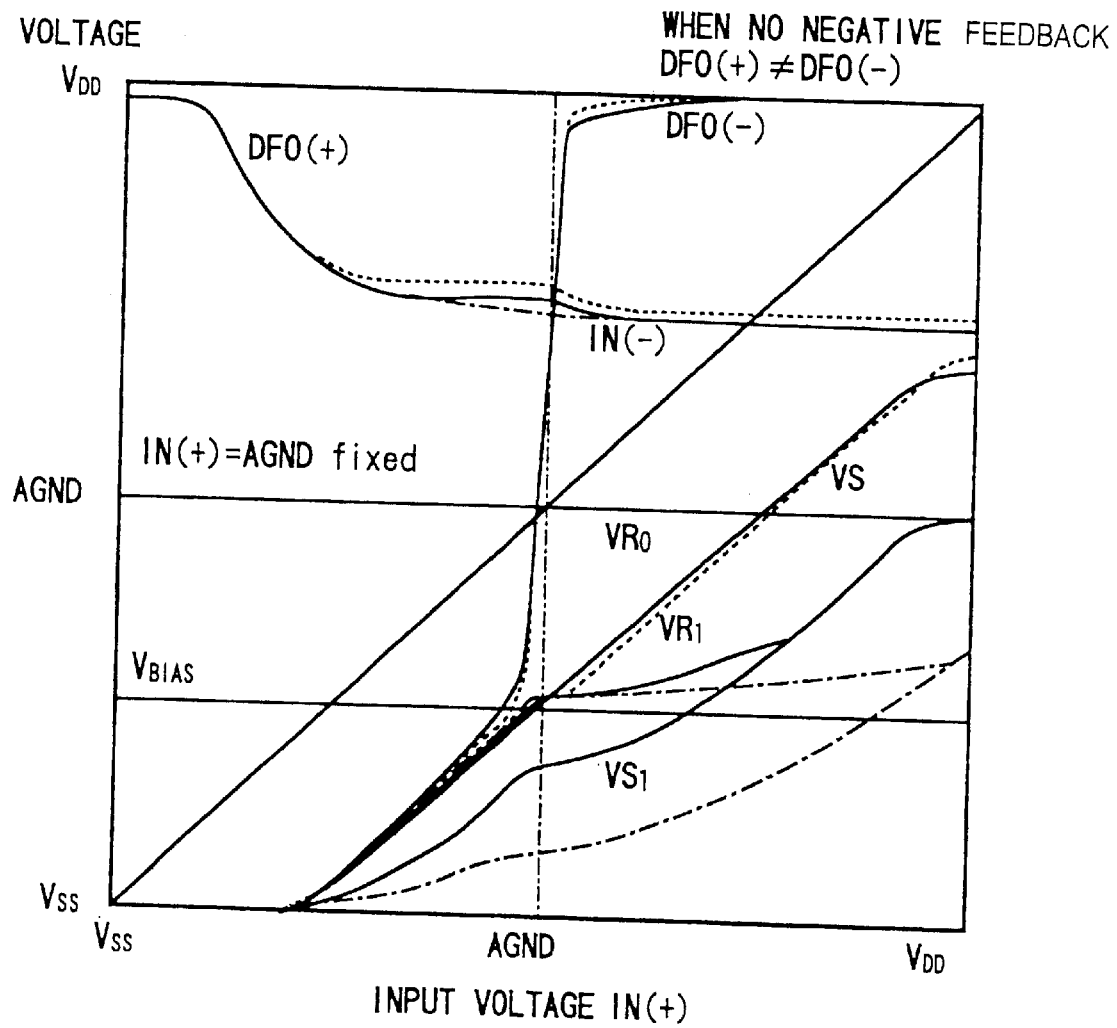
FIG. 14 is a graph of the change of the internal voltage-input voltage dependency due to the source resistance of a comparison and judgment circuit in which there is no negative feedback between the input and the output of a 2-input differential amplifier circuit.

FIG. 14 is a graph of the change of the internal operating voltage-input voltage dependency of the differential amplifier circuit due to the source resistance value in the case where the differential amplifier circuit shown in FIG. 8 and FIG. 9 is operated as a comparison and judgment circuit not supplying negative feedback between the input and the output. Further, FIG. 15 is a graph of the change of the operating current-input voltage dependency due to the source resistance value in this case.

Figure 13:
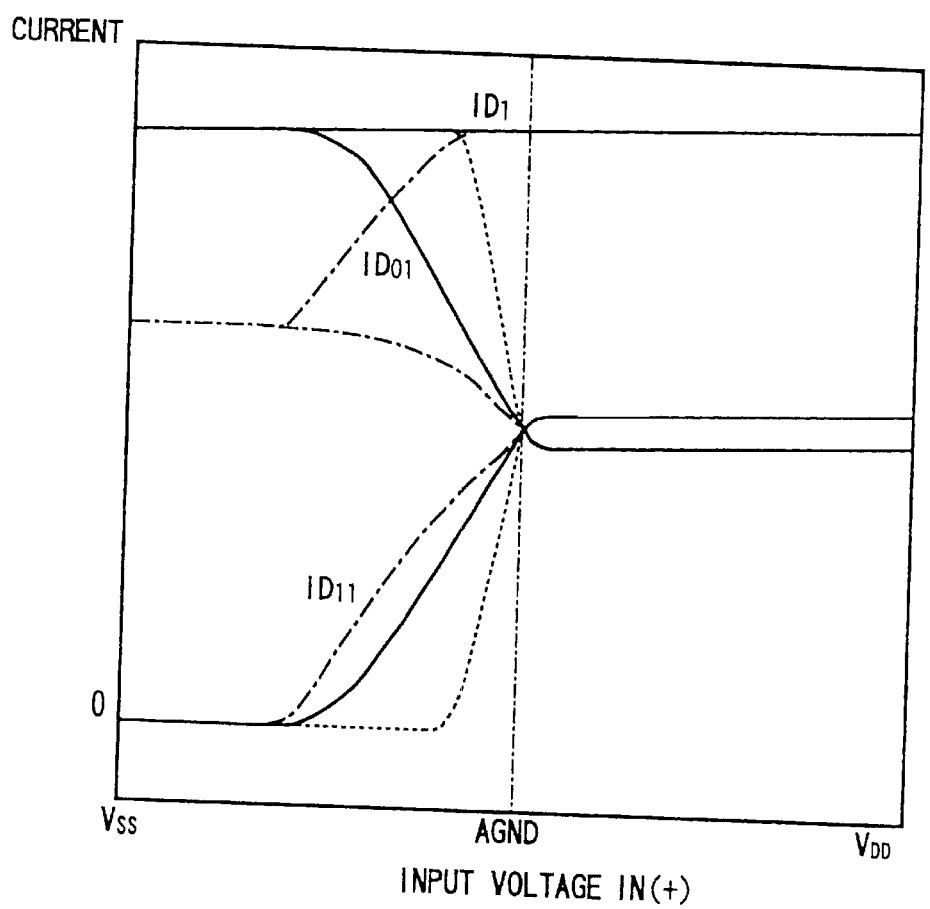
FIG. 13 is a graph of the change of the current-input voltage dependency due to the source resistance of a comparison and judgment circuit in which there is no negative feedback between the input and the output of a 2-input differential amplifier circuit.
Figure 15:
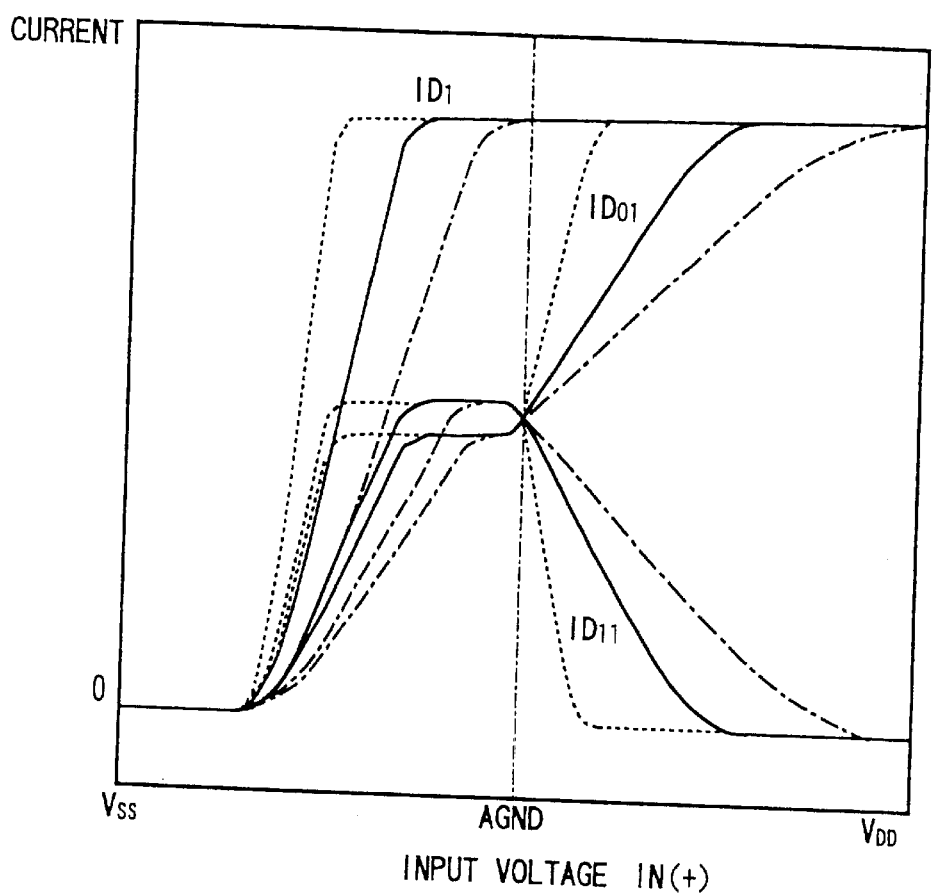
FIG. 15 is a graph of the change of the current-input voltage dependency due to the source resistance of a comparison and judgment circuit in which there is no negative feedback between the input and the output of a 2-input differential amplifier circuit.

Note that in FIG. 12 and FIG. 13, the abscissa indicates an input signal voltage to the non-inverted output terminal DFO(+) of the differential amplifier circuit, while in FIG. 14 and FIG. 15, the abscissa indicates the input signal voltage to the inverted output terminal DFO(−) of the differential amplifier circuit.

As mentioned above, in the present invention, by providing the resistors between the source side of the transistors configuring the differential pair and the current source for supplying the operating current, improvement of the input-output linear characteristic of the differential amplifier circuit and expansion of the dynamic range are achieved.

The inverted and non-inverted output signals of the differential amplifier circuit mentioned above do not have large output amplitudes since when the processing circuit supplies negative feedback between the input and the output, the amplitude of the output stage divided by the amplification rate of the output stage becomes the output amplitude of the differential amplifier circuit. For this reason, in both of the cases of the input-output characteristic of the resistance load type 2-terminal input differential amplifier circuit shown in FIG. 4 and the input-output characteristic of the current mirror circuit load type 2-terminal input differential amplifier circuit shown in FIG. 10, the output signal levels of the non-inverted output terminal DFO(+) and the inverted output terminal DFO(−) become almost equal. These output terminals are connected to the drains of the transistors configuring the differential pair and the drain voltage of the transistors are slightly high and substantially constant, therefore both of two input transistors configuring the differential pair operate in the saturation region or one of them operates in the saturation region and the other one is turned off.

When the comparison and judgment circuit does not supply negative feedback between the input and the output, output signals having a certain large amplitude are output from the inverted and non-inverted output terminals of the differential amplifier circuit. For this reason, there are also voltage conditions where one of the two input transistors operates in the non-saturation region.

Below, the internal operation of the 2-terminal input differential amplifier circuit in the case where it operates as a processing circuit supplying negative feedback between the input and the output will be explained in further detail.

When the differential amplifier circuit supplies negative feedback between the input and the output, a state where both of the two transistors configuring the differential pair operate in the saturation region or one operates in the saturation region and the other one is turned off is exhibited.

When resistances are not connected to the source side of the transistors, that is, in the case of the 2-terminal input differential amplifier circuit shown in FIG. 3 or FIG. 9, the voltage $V_{Si}$ (in the 2-terminal input differential amplifier circuit, i=1) of the node $VS_1$ to which sources of the transistors are connected becomes the output voltage of the source follower for the input voltage $V_{INi}(+)$ or $V_{INi}(-)$ as described later.

Here, in the two transistors $MI_0$ and $MI_1$ configuring the differential pair, where the current flowing through the transistor $MI_1$ is $ID_{0i}$, the current flowing through the transistor $MI_1$ is $ID_{1i}$, and the summation of the currents $ID_{0i}$ and $ID_{1i}$ is $ID_i$, in the case where $V_{INi}(+) \ll V_{INi}(-)$, $ID_i$ becomes equal to $ID_{0i}$, and $ID_{1i}$ becomes equal to 0. Note that the current $ID_i$ is equal to the operating current supplied to the differential pair. For example, in the 2-terminal input differential amplifier circuit shown in FIG. 2 or FIG. 8, it becomes equal to the current flowing through the transistor $MS_1$ acting as the current source.

When the current amplification rate of the transistor $MI_0$ is $\beta_i$ and the current amplification rate of the transistor MS1 acting as the current source is $\beta_{Si}$, the following equation is obtained based on $ID_i = ID_{0i}$:

$$(\tfrac{1}{2})\beta_{Si}(V_{BIAS}-V_{th})^2 = (\tfrac{1}{2})\beta_i(V_{INi}(-)-V_{Si}-V_{th})^2 \tag{1}$$

By equation (1), the following equation is further found:

$$V_{Si}=V_{INi}(-)-V_{th}-(\beta_{Si}/\beta_i)^{(\tfrac{1}{2})}\times(V_{BIAS}-V_{th}) \tag{2}$$

When signals having substantially the same level are input to the inverted input terminal $IN_i(-)$ and the non-inverted input terminal $IN_i(+)$ of the differential amplifier circuit, that is, when $V_{INi}(-) \approx V_{INi}(+)$, the result is $ID_i = ID_{0i} + ID_{1i}$, $ID_{0i} \neq 0$, and $ID_{1i} \neq 0$. This can be represented by the following equation:

$$(\tfrac{1}{2})\beta_{Si}(V_{BIAS}-V_{th})^2 = (\tfrac{1}{2})\beta_i(V_{INi}(-)-V_{Si}-V_{th})^2 + (\tfrac{1}{2})\beta_i(V_{INi}(+)-V_{Si}V_{th})^2 \tag{3}$$

When signals having equal levels are input to the inverted input terminal $IN_i(-)$ and the non-inverted input terminal $IN_i(+)$ of the differential amplifier circuit, that is, when $V_{INi}(-)=V_{INi}(+)$, the result is $ID_i=ID_{0i}+ID_{1i}$, $ID_{0i}=ID_{1i}=ID_i/2$. This is represented by the following equation:

$$(\tfrac{1}{2})\beta_{Si}(V_{BIAS}-V_{th})^2 = \beta_i(V_{INi}(-/+)-V_{Si}-V_{th})^2 \tag{4}$$

From equation (4), the voltage $V_{Si}$ (i=1) of the node $VS_1$ can be represented by the following equation:

$$V_{Si}=V_{INi}(-/+)-V_{th}(\beta_{Si}/2\beta_i)^{(\tfrac{1}{2})}\times(V_{BIAS}-V_{th}) \tag{5}$$

On the other hand, when $V_{INi}(+) \gg V_{INi}(-)$, $ID_i$ becomes equal to $ID_{1i}$, and $ID_{0i}$ becomes equal to 0, therefore the following equation is obtained:

$$(\tfrac{1}{2})\beta_{Si}(V_{BIAS}-V_{th})^2 = (\tfrac{1}{2})\beta_i(V_{INi}(+)-V_{Si}-V_{th})^2 \tag{6}$$

From equation (6), the following equation is further found:

$$V_{Si}=V_{INi}(+)-V_{th}-(\beta_{Si}/\beta_i)^{(\tfrac{1}{2})}\times(V_{BIAS}-V_{th}) \tag{7}$$

The above equations indicate the internal operating voltages in accordance with the input signals where resistances are not connected to the source side of the transistors configuring the differential pair. Next, an explanation will be made of the internal operating voltage in the case where the resistors are connected to the source side of the transistors configuring the differential pair. In such a case, the source voltages $VR_{0i}$ and $VR_{1i}$ of the transistors $MI_0$ and $MI_1$ become the output voltages of the source follower with respect to the input signal voltages $V_{INi}(-)$ and $V_{INi}(+)$ as described below.

First, where $V_{INi}(+) \ll V_{INi}(-)$, $ID_i$ becomes equal to $ID_{0i}$, and $ID_{1i}$ becomes equal to 0. According to this, the following equation is found:

$$(\tfrac{1}{2})\beta_{Si}(V_{BIAS}-V_{th})^2 = (\tfrac{1}{2})\beta_i(V_{INi}(-)-VR_{0i}-V_{th})^2 \tag{8}$$

From equation (8), the following equation is further found:

$$VR_{0i}=V_{INi}(-)-V_{th}-(\beta_{Si}/\beta_i)^{(\tfrac{1}{2})}\times(V_{BIAS}-V_{th})$$

$$V_i=VR_{0i}-R_i\cdot ID_i$$

$$VR_{1i}=V_{Si} \tag{9}$$

When $V_{INi}(-) \approx V_{INi}(+)$, $ID_i=ID_{0i}+ID_{1i}$, $ID_{0i} \neq 0$, and $ID_{1i} \neq 0$ stand. This can be represented by the following equation:

$$(\tfrac{1}{2})\beta_{Si}(V_{BIAS}-V_{th})^2 = (\tfrac{1}{2})\beta_i(V_{INi}(-)-VR_{0i}-V_{th})^2 + (\tfrac{1}{2})\beta_i(V_{INi}(+)-VR_{1i}-V_{th})^2$$

$$VR_{0i}=V_{Si}+R_i\cdot ID_{0i}$$

$$VR_{1i}=V_{Si}+R_i\cdot ID_{1i} \tag{10}$$

When signals having equal levels are input to the inverted input terminal $IN_i(-)$ and the non-inverted input terminal $IN_i(+)$ of the differential amplifier circuit, that is when $V_{INi}(-)=V_{INi}(+)$, $ID_i=ID_{0i}+ID_{1i}$ and $ID_{0i}=ID_{1i}=ID_i/2$ stand. This is represented by the following equation:

$$(\tfrac{1}{2})\beta_{Si}(V_{BIAS}-V_{th})^2=\beta_i(V_{INi}(-/+)-VR_{0/1i}-V_{th})^2 \quad (11)$$

Based on equation (11), the source voltage of the transistors $MI_0$ and $MI_1$ and the voltage $V_{Si}$ of the node $VS_1$ are found by the following equation:

$$VR_{0/1i}=V_{INi}(-/+)-V_{th}-(\beta_{Si}/2\beta_i)^{(\tfrac{1}{2})}\times(V_{BIAS}-V_{th})$$

$$V_{Si}=VR_{0/1i}-R_i \cdot ID_i/2 \quad (12)$$

Next, when $V_{INi}(+)>>V_{INi}(-)$, $ID_i$ becomes equal to $ID_{1i}$ and $ID_{0i}$ becomes equal to 0, so the following equation is obtained:

$$(\tfrac{1}{2})\beta_{Si}(V_{BIAS}-V_{th})^2=(\tfrac{1}{2})\beta_i(V_{INi}(+)-VR_{1i}-V_{th})^2 \quad (13)$$

From equation (13), the following equation is further found:

$$VR_{1i}=V_{INi}(+)-V_{th}-(\beta_{Si}/\beta_i)^{(\tfrac{1}{2})}\times(V_{BIAS}-V_{th})$$

$$V_{Si}=VR_{1i}-R_i \cdot ID_i$$

$$VR_{0i}=V_{Si} \quad (14)$$

Next, a further detailed explanation will be made of the case where signals having almost equal voltage levels are input to the inverted input terminal $IN_i(-)$ and the non-inverted input terminal $IN_i(+)$ of the 2-terminal input differential amplifier circuit, that is, $V_{INi}(-) \approx V_{INi}(+)$.

As in FIG. 3 and FIG. 9, in the case where resistances are not connected to the source side of the transistors configuring the differential pair, equations (15) to (18) shown next are obtained:

$$ID_{0i}+ID_{1i}=ID_i \quad (15)$$

$$ID_i=(\tfrac{1}{2})\beta_{Si}(V_{BIAS}-V_{th})^2 \quad (16)$$

$$ID_{0i}=(\tfrac{1}{2})\beta_i(V_{INi}(-)-V_{Si}V_{th}) \quad (17)$$

$$ID_{1i}=(\tfrac{1}{2})\beta_i(V_{INi}(+)-V_{Si}-V_{th}) \quad (18)$$

From equation (17) and equation (18), the following equation is further found:

$$ID_{0i}^{(\tfrac{1}{2})}=(\beta_i/2)^{(\tfrac{1}{2})}\times(V_{INi}(-)-V_{Si}-V_{th}) \quad (19)$$

$$ID_{1i}^{(\tfrac{1}{2})}=(\beta_i/2)^{(\tfrac{1}{2})}\times(V_{INi}(+)-V_{Si}V_{th}) \quad (20)$$

When performing subtraction between equation (19) and equation (20), the following equation is obtained:

$$ID_{1i}^{(\tfrac{1}{2})}-ID_{0i}^{(\tfrac{1}{2})}=(\beta_i/2)^{(\tfrac{1}{2})}\times(V_{INi}(+)-V_{INi}(-)) \quad (21)$$

Here, where $V_{INi}(+)-V_{INi}(-)=V_X$, $V_X$ can be calculated by the following equation:

$$V_X=(2/\beta_i)^{(\tfrac{1}{2})}\times\{ID_{1i}^{(\tfrac{1}{2})}-ID_{0i}^{(\tfrac{1}{2})}\} \quad (22)$$

Further, when differentiating equation (22) by $ID_{1i}$ by considering $ID_{0i}=ID_i-ID_{1i}$, the following equation is obtained:

$$dV_X/dID_{1i}=(2/\beta_i)^{(\tfrac{1}{2})}\times(\tfrac{1}{2})\{ID_{1i}^{(-\tfrac{1}{2})}+(ID_i-ID_{1i})^{(-\tfrac{1}{2})}\} \quad (23)$$

When $V_X=0$, that is, the input signal levels to the inverted input terminal $IN_i(-)$ and the non-inverted input terminal $IN_i(+)$ of the 2-terminal input differential amplifier circuit are equal, $ID_{0i}=ID_{1i}=ID_i/2$, the inclination $d(V_X)/d(ID_{1i})$ near $V_X=0$ is found by the following equation:

$$dV_X/dID_{1i}=(2/\beta_i)^{(\tfrac{1}{2})}\times(ID_i/2)^{(-\tfrac{1}{2})} \quad (24)$$

The current values of $ID_{0i}$ and $ID_{1i}$ change in a range from 0 to $ID_i$ and a range from $ID_i$ to 0 about $ID_i/2$ as the center. Namely, they change by $(ID_i/2) \pm (ID_i/2)$.

The amount of change of one side of the current value is $\Delta I=ID_i/2$, therefore the amount of change $\Delta V$ of the voltage corresponding to this is found by the following equation:

$$\Delta V=\Delta I \times dV_X/dID_{1i}$$

$$=(2/\beta_i)^{(\tfrac{1}{2})}\times(ID_i/2)^{(\tfrac{1}{2})}$$

$$=(\beta_{Si}/2\beta_i)^{(\tfrac{1}{2})}\times(V_{BIAS}-V_{th}) \quad (25)$$

Above, an explanation was made of the internal signals at the time of operation of the conventional differential amplifier circuit shown in FIG. 3 or FIG. 9. Below, an explanation will be made, while deriving equations, of the internal signals at the time of operation of the 2-terminal input differential amplifier circuit of the present invention shown in FIG. 2 or FIG. 8, that is, the differential amplifier circuit in which the resistances are connected to the source side of the transistors configuring the differential pair.

In the differential amplifier circuit of the present invention shown in FIG. 2 and FIG. 8, resistances are connected to the source side of the transistors configuring the differential pair. In the 2-terminal input differential amplifier circuit configured in this way, when input signal levels to the input terminals $IN_i(-)$ and $IN_i(+)$ are equal, that is, where $V_{INi}(-)=V_{INi}(+)$, the currents $ID_{0i}$ and $ID_{1i}$ flowing through the transistors $MI_0$ and $MI_1$, the current $ID_i$ flowing through the transistor $MS_1$ acting as the current source, the source voltages $VR_{0i}$ and $VR_{1i}$ of the transistors $MI_0$ and $MI_1$, and the voltage $V_{Si}$ of the node $VS_1$ are found by the following equations (26) to (31):

$$ID_{0i}+ID_{1i}=ID_i \quad (26)$$

$$ID_i=(\tfrac{1}{2})\beta_{Si}(V_{BIAS}-V_{th})^2 \quad (27)$$

$$ID_{0i}=(\tfrac{1}{2})\beta_i(V_{INi}(-)-VR_{0i}-V_{th})^2 \quad (28)$$

$$ID_{1i}=(\tfrac{1}{2})\beta_i(V_{INi}(+)-VR_{1i}-V_{th})^2 \quad (29)$$

$$VR_{0i}-V_{Si}=R_i \times ID_{0i} \quad (30)$$

$$VR_{1i}-V_{Si}=R_i \times ID_{1i} \quad (31)$$

From equations (28) and (29), the following equation is found:

$$ID_{0i}^{(\tfrac{1}{2})}=(\beta_i/2)^{(\tfrac{1}{2})}\times(V_{INi}(-)-VR_{0i}-V_{th}) \quad (32)$$

$$ID_{1i}^{(\tfrac{1}{2})}=(\beta_i/2)^{(\tfrac{1}{2})}\times(V_{INi}(+)-VR_{1i}-V_{th}) \quad (33)$$

When performing subtraction of equations (32) and (33), the following equation is obtained:

$$ID_{1i}^{(\tfrac{1}{2})}-ID_{0i}^{(\tfrac{1}{2})}$$

$$=(\beta_i/2)^{(\tfrac{1}{2})}\times\{(V_{INi}(+)-V_{INi}(-))-(VR_{1i}-VR_{0i})\}$$

$$=(\beta_i/2)^{(\tfrac{1}{2})}\times\{(V_{INi}(+)-V_{INi}(-))-R_i(ID_{1i}-ID_{0i})\} \quad (34)$$

Here, where $V_{INi}(+)-V_{INi}(-)=V_X$, $V_X$ is calculated by the following equation:

$$V_X=(2/\beta_i)^{(\tfrac{1}{2})}\times\{ID_{1i}^{(\tfrac{1}{2})}-ID_{0i}^{(\tfrac{1}{2})}\}+R_i(ID_{1i}-ID_{0i})\} \quad (35)$$

When comparing the right sides of equation (35) and equation (22), only $R_i(ID_{1i}-ID_{0i})$ of the second term are different. When differentiating equation (35) by $ID_{1i}$ by considering $ID_{0i}=ID_i-ID_{1i}$, the following equation is obtained:

$$dV_x/dID_{1i}=(2/\beta_i)^{(1/2)}\times(1/2)\{ID_{1i}^{(-1/2)}+(ID_i-ID_{1i})^{(-1/2)}\}\times 2R_i \qquad (36)$$

When $V_x=0$, that is, the input signal levels to the inverted input terminal $IN_i(-)$ and the non-inverted input terminal $IN_i(+)$ of the 2-terminal input differential amplifier circuit are equal, $ID_{0i}=ID_{1i}=ID_i/2$, therefore the inclination $dV_x/dID_{1i}$ near $V_x=0$ is found by the following equation:

$$dV_x/dID_{1i}=(2/\beta_i)^{(1/2)}\times(ID_i/2)^{(1/2)}+2R_i \qquad (37)$$

The current value of $ID_{0i}$ and $ID_{1i}$ changes in a range from 0 to $ID_i$ and a range from $ID_i$ to 0 about $ID_i/2$ as the center. Namely, it changes by $(ID_i/2)\pm(ID_i/2)$.

The amount of change of one side of the current value is $\Delta I=ID_i/2$, therefore the amount of change $\Delta V$ of the voltage corresponding to this is found by the following equation:

$$\Delta V = \Delta I \times dV_x/dID_{1i}$$

$$=(2/\beta_i)^{(1/2)}\times(ID_i/2)^{(1/2)}+2R_i\cdot ID_i$$

$$=(\beta_{Si})^{(1/2)}\times(V_{BIAS}-V_{th})+R_i\cdot ID_i \qquad (38)$$

When comparing the right sides of equation (25) and equation (38), only $(R_i\cdot ID_i)$ of the second term is different. Namely, this means that, by connecting resistances to the source side of the transistors configuring the differential pair, the voltage range where the change of the output current has a linear relationship with respect to the change of the input voltage at each differential pair becomes broader by exactly $(R_i\cdot ID_i)$.

The above explanation was based on the condition that the transistors configuring the differential pair and the transistor configuring the current source operate in the saturation region and that equation (16) and equation (17) stand particularly in a case where the transistor configuring the current source operates in the saturation region.

When resistances are inserted at the source side of the transistors configuring the differential pair, however, the drain of the transistor configuring the current source, that is, the voltage $V_{Si}$ of the node VS, shown in FIG. 2 and FIG. 6, is lowered from that of the case when resistances are not inserted by an amount of the voltage drop $(R_i\cdot ID_i)$ due to the inserted resistances. When the resistance values of the resistances inserted at the source side of the transistors configuring the differential pair are large, if both of the inverted and non-inverted input terminals $IN_i(-)$ and $IN_i(+)$ are lowered to the bias voltage $V_{BIAS}$ side from the level of the analog ground voltage AGND, $(V_{Si}<V_{BIAS}-V_{th})$ stands and the transistor acting as the current source operates in the non-saturation region. Namely, when the voltage difference between the gate and the source of the transistor acting as the current source is $V_{GS}$, the drain current of the transistor is $I_{DS}$, and the voltage between the drain and the source is $V_{DS}$, the operating point of the related transistor shifts from the saturation region to the non-saturation region on an $I_{DS}-V_{DS}$ characteristic curve when $V_{GS}=V_{BIAS}$ is fixed, so $ID_i$ will be reduced.

When the input signal levels of the input terminals $IN_i(+)$ and $IN_i(-)$ are smaller than the analog ground voltage AGND and the input signal level to the input terminal $IN_i(+)$ is much smaller than the inverted input terminal $IN_i(-)$, that is, when $V_{INi}(+)<<V_{INi}(-)<AGND$, $ID_i$, becomes approximately equal to $ID_i$, $ID_{1i}$ becomes approximately equal to 0, and the following equation is obtained based on this:

$$(1/2)\beta_{Si}(V_{BIAS}-V_{th})^2\approx(1/2)\beta_i(V_{INi}(-)-VR_{0i}-V_{th})^2 \qquad (39)$$

From equation (39), the following equation is obtained:

$$VR_{0i}\approx V_{INi}(-)-V_{th}-(\beta_{Si}/\beta_i)^{(1/2)}\times(V_{BIAS}-V_{th})$$

$$V_{Si}\approx VR_{0i}-R_i\cdot ID_i \qquad (40)$$

The condition of the operation of the transistors configuring the differential pair in the saturation region is $(V_{Si}>V_{BIAS}-V_{th})$. Namely, it is necessary to satisfy the following equation:

$$VR_{0i}-R_i\cdot ID_i \geq V_{BIAS}-V_{th} \qquad (41)$$

The following equation is obtained from equation (40) and equation (41):

$$V_{INi}(-)-V_{th}-(\beta_{Si}/\beta_i)^{(1/2)}\times(V_{BIAS}-V_{th})-R_i\cdot ID_i \geq V_{BIAS}-V_{th} \qquad (42)$$

The following equation is found based on equation (42):

$$V_{INi}(-) \geq V_{th}+\{(\beta_{Si}/\beta_i)^{(1/2)}+1\}\times(V_{BIAS}-V_{th})+R_i\cdot ID_i \qquad (43)$$

When the amplitude is corrected with the analog ground voltage AGND as a reference, the following equation is derived:

$$|V_{INi}(-)| \leq AGND-[V_{th}+\{(\beta_{Si}/\beta_i)^{(1/2)}+1\}\times(V_{BIAS}-V_{th})+R_i\cdot ID_i \qquad (44)$$

Further, even at the time when $V_{INi}(+)<V_{INi}(-)<AGND$, the source resistance value $R_{ic}$ of the limit of the operation of the transistors configuring the differential pair in the saturation region is found by the following equation where $V_{INi}(-)=AGND$:

$$R_{ic}\cdot ID_i/2=[AGND-V_{th}-\{(\beta_{Si}\beta_i)^{(1/2)}+1\}\times(V_{BIAS}-V_{th})]/2 \qquad (45)$$

When the input signal levels to the input terminals $IN_i(+)$ and $IN_i(-)$ are almost equal and these input signal levels do not exceed the analog ground voltage AGND, that is, when $V_{INi}(+)\approx V_{INi}(-)\leq AGND$, $ID_{0i}\approx ID_{1i}\approx ID_i/2$ stands and the following equation is obtained based on this:

$$(1/2)\beta_{Si}(V_{BIAS}-V_{th})^2\approx\beta_i(V_{INi}(-/+)-VR_{0/1i}-V_{th})^2 \qquad (46)$$

From equation (46), the following equation is obtained:

$$VR_{0/1i}\approx V_{INi}(-/+)-V_{th}-(\beta_{Si}/2\beta_i)^{(1/2)}\times(V_{BIAS}-V_{th})$$

$$V_{Si}\approx VR_{0/1i}-R_i\cdot ID_i/2 \qquad (47)$$

The condition of the operation of the transistors configuring the differential pair in the saturation region is $(V_{Si}>V_{BIAS}-V_{th})$. Namely, it is necessary to satisfy the following equation:

$$VR_{0/i1}-R_i\cdot ID_i/2 \geq V_{BIAS}-V_{th} \qquad (48)$$

From equation (47) and equation (48), the following equation is obtained:

$$V_{INi}(-/+)-V_{th}-(\beta_{Si}/2\beta_i)^{(1/2)}\times(V_{BIAS}-V_{th})-R_i\cdot ID_i/2 \geq V_{BIAS}-V_{th} \qquad (49)$$

Based on equation (49), the following equation is found:

$$V_{INi}(-/+) \geq V_{th}+\{(\beta_{Si}/2\beta_i)^{(1/2)}\}\times(V_{BIAS}-V_{th})-R_i\cdot ID_i/2 \qquad (50)$$

When the amplitude of equation (50) is corrected with the analog ground voltage AGND as a reference, the following equation is derived:

$$|V_{INi}(-/+)| \leq AGND - [V_{th} + \{(\beta_{Si}/2\beta_i)^{(1/2)} + 1\} \times (V_{BIAS} - V_{th}) + R_i \cdot ID_i]$$ (51)

Even in a case where $V_{INi}(+)V_{INi}(-) \leq AGND$, the source resistance value $R_{ic2}$ of the limit of the operation of the transistors configuring the differential pair in the saturation region is as shown in the following equation when $V_{INi}(+/-) \approx AGND$:

$$R_{ic2} \cdot ID_i/2 = AGND - V_{th} - \{(\beta_{Si}/2\beta_i)^{(1/2)} + 1\} \times (V_{BIAS} - V_{th})$$ (52)

When the channel width of the transistors configuring the differential pair is W, the channel length is L, the channel width of the transistor configuring the power supply is $2^{1/2}W$, and the channel length is L, the following equations are obtained from equation (42) and equation (52):

$$R_{ic} \cdot ID_i/2 = [AGND - V_{th} - 2.189 \times (V_{BIAS} - V_{th})]/2$$ (53)

$$R_{ic2} \cdot ID_i/2 = AGND - V_{th} - 1.841 \times (V_{BIAS} - V_{th})$$ (54)

When comparing equations (53) and (54), $R_{ic2} \approx 2R_{ic}$. In the characteristic curves in the figures of the internal operating voltage-input voltage dependency and the figures of the operating current-input voltage dependency of FIG. 4 to FIG. 7 and FIG. 10 to FIG. 15 mentioned above, "in source resistance" and "source resistance is large" correspond to $(R_i \approx R_{ic})$ and $(R_i \approx R_{ic2})$.

In a circuit in which only one amplitude has meaning in terms of the operation with respect to the analog ground voltage AGND, it can be set based on $(R_i \approx R_{ic2})$.

As explained above, in the differential amplifier circuit of the present invention, by inserting resistances between sources of the transistors configuring the differential pair and the drain of the transistor configuring the current source and separating the sources of the transistors configuring the differential pair, when the voltage level of the input signal is higher than the analog ground voltage AGND, that is, when the transistors configuring the differential pair are turned on more, the voltage range in which the level change of the input signal and the change of the output current have a linear relationship is expanded by exactly an amount of $(R_i \cdot ID_i)$ according to the resistance value $R_i$ of the source resistor and the supply current $ID_i$ of the transistor acting as the current source. Further, when the voltage level of the input signal is lower than the analog ground voltage AGND, that is, when the transistors configuring the differential pair are more turned off, any of the amplitudes given by above equation (38), equation (44), and equation (51) spreads to the small portion as the amplitude.

As mentioned above, when the resistance values of the resistances inserted at the source side of the transistors configuring the differential pair are set large, sometimes the input voltage range in which the linear input characteristic is obtained is only the power supply voltage $V_{DD}$ side from the analog ground voltage AGND or the common voltage VSS side from the analog ground voltage AGND, therefore, it is necessary to appropriately set the resistance values of the resistances inserted at the source side.

It is possible to estimate the optimum resistance value $R_i$ by finding a resistance value $R_i$ that gives equal right sides of equation (38) and equation (44) or right sides of equation (38) and equation (51) and possible to avoid setting the resistance values to large.

Further, as seen from equation (37), by inserting resistances at the source side of the transistors configuring the differential pair, the value of $dV_x/dID_{1i}$ becomes large, therefore the value of $dID_{1i}/dV_x$ as a reciprocal thereof becomes small, so the amplification rate (gain) of the differential amplifier circuit sometimes becomes small. The multi-input differential amplifier circuit has a more complex circuit configuration than the usual 2-terminal input differential amplifier circuit, therefore the capacity component of the load driven by the output of the differential input circuit becomes large. For this reason, in the present invention, in the other embodiments mentioned later, a multi-input differential amplifier circuit that can secure a sufficient amplification rate and operating speed is configured by using the differential amplifier circuit as a differential input circuit and providing a push-pull output stage for driving the load circuit and an intermediate differential amplification stage.

Below, an explanation will be made of the configuration and the operation of the 4-terminal input differential amplifier circuit by referring to FIG. 16 to FIG. 29.

Figure 16:
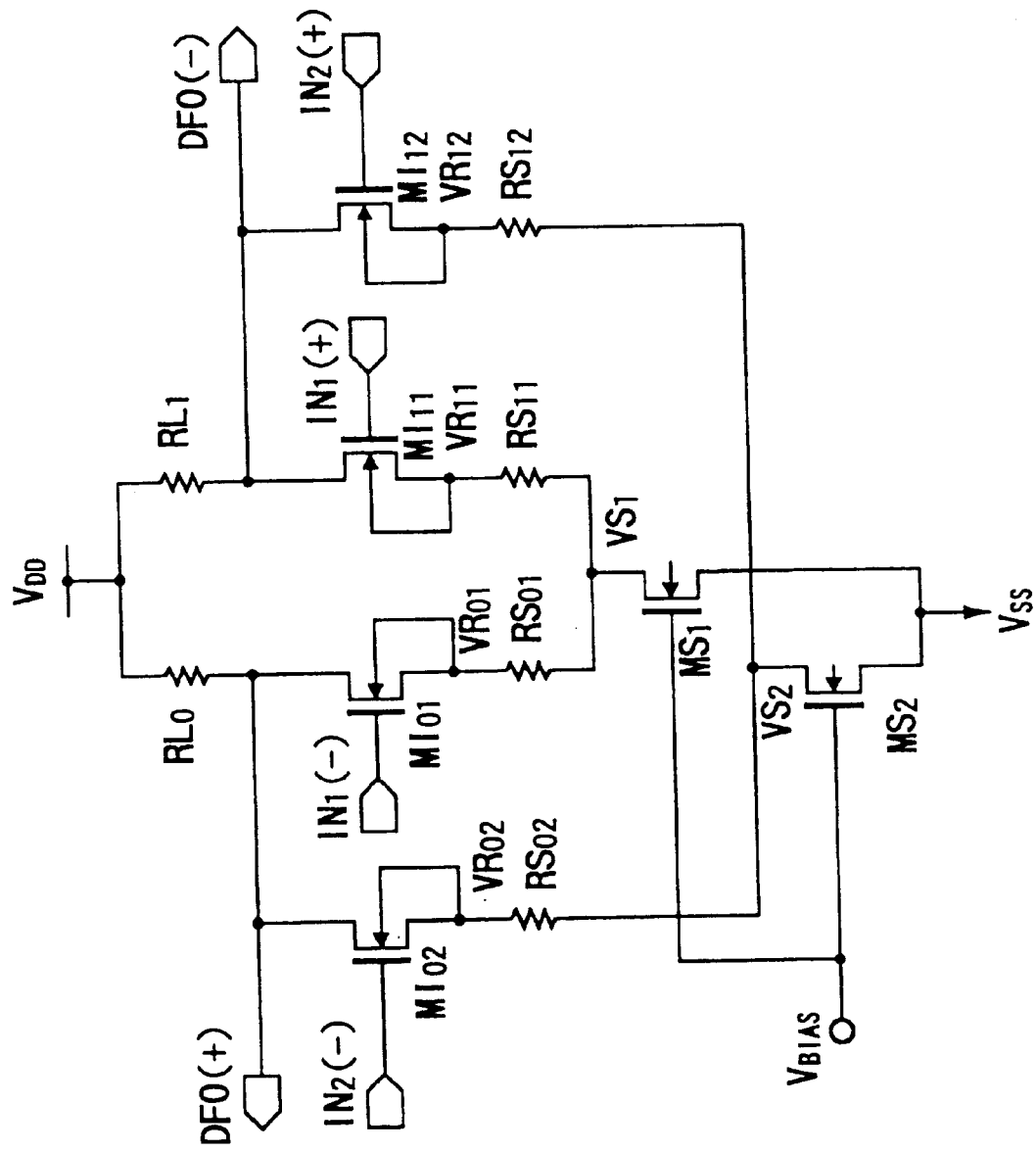
FIG. 16 is a circuit diagram of an example of the configuration of a 4-input differential amplifier circuit.
Figure 17:
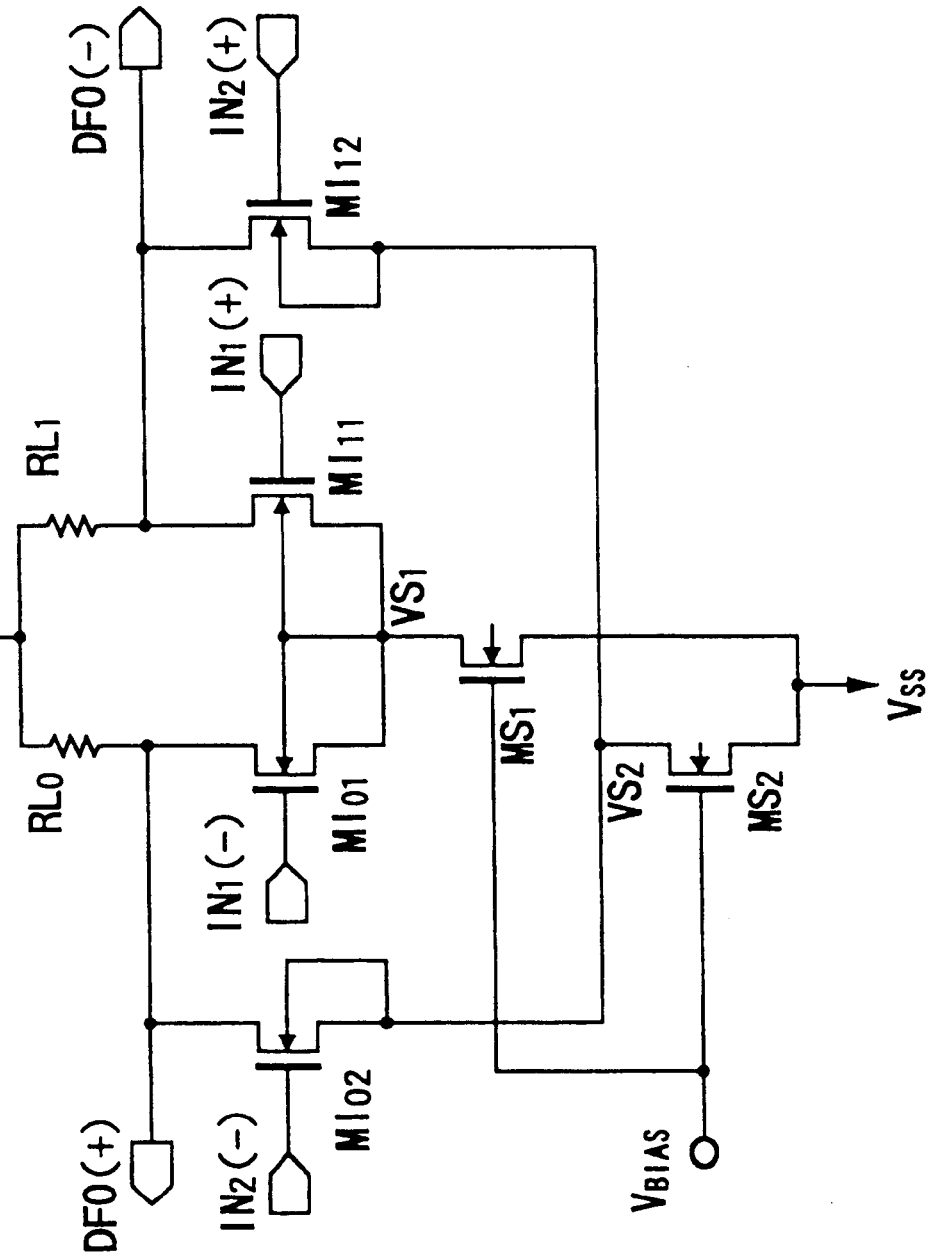
FIG. 17 is a circuit diagram of an example of a conventional 4-input differential amplifier circuit.

FIG. 16 is a circuit diagram of an example of a 4-input differential amplifier circuit having two differential pairs. Note that, FIG. 17 shows an example of a conventional 4-input differential amplifier circuit for comparison.

As shown in FIG. 16, the terminal input differential amplifier circuit of the present example has two differential pairs configured by transistors $MI_{01}$ and $MI_{11}$ and $MI_{02}$ and $MI_{12}$. The gates of the transistors $MI_{01}$ and $MI_1$ are connected to the differential input terminals $IN_1(-)$ and $IN_1(+)$, and the gates of the transistors $MI_{02}$ and $MI_{12}$ are connected to the differential input terminals $IN_2(-)$ and $IN_2(+)$. The sources of the transistors $MI_{01}$ and $MI_{11}$ are connected to the node $VS_1$ via the resistance elements $RS_{01}$ and $RS_{11}$, and the sources of the transistors $MI_{02}$ and $MI_{12}$ are connected to the node $VS_2$ via the resistance elements $RS_{02}$ and $RS_{12}$. The transistor $MS_1$ to the gate of which the bias voltage $V_{BIAS}$ is supplied is connected between the node $VS_1$ and the common voltage $V_{SS}$, while the transistor $MS_2$ to the gate of which the bias voltage $V_{BIAS}$ is supplied is connected between the node $VS_2$ and the common voltage $V_{SS}$. The bias voltage $V_{BIAS}$ is set in its voltage level so that the transistors $MS_1$ and $MS_2$ operate in the non-saturation region. The transistors $MS_1$ and $MS_2$ configure the current sources for supplying the operating currents to the differential pairs.

Both of the drains of the transistors $MI_{01}$ and $MI_{02}$ are connected to the non-inverted output terminal DFO(+), while both of the drains of the transistors $MI_{01}$ and $MI_{12}$ are connected to the inverted output terminal DFO(−). A resistance element $RL_1$ configuring the output load is connected between the non-inverted output terminal DFO(+) and the supply line of the power supply voltage $V_{DD}$, while a resistance element $RL_1$ configuring the output load is connected between the inverted output terminal DFO(−) and the supply line of the power supply voltage $V_{DD}$.

As mentioned above, in the 4-terminal input differential amplifier circuit of the present example, resistance elements are inserted between the sources of the transistors configuring the differential pairs and the current sources for supplying the operating currents. Namely, the sources of the transistors configuring the differential pair are separated by the inserted resistance elements.

Contrary to this, in the conventional 4-terminal input differential amplifier circuit shown in FIG. 17, the sources of the transistors configuring the differential pairs are directly connected to the drains of the transistors configuring the current sources not through the resistance elements.

Figure 18:
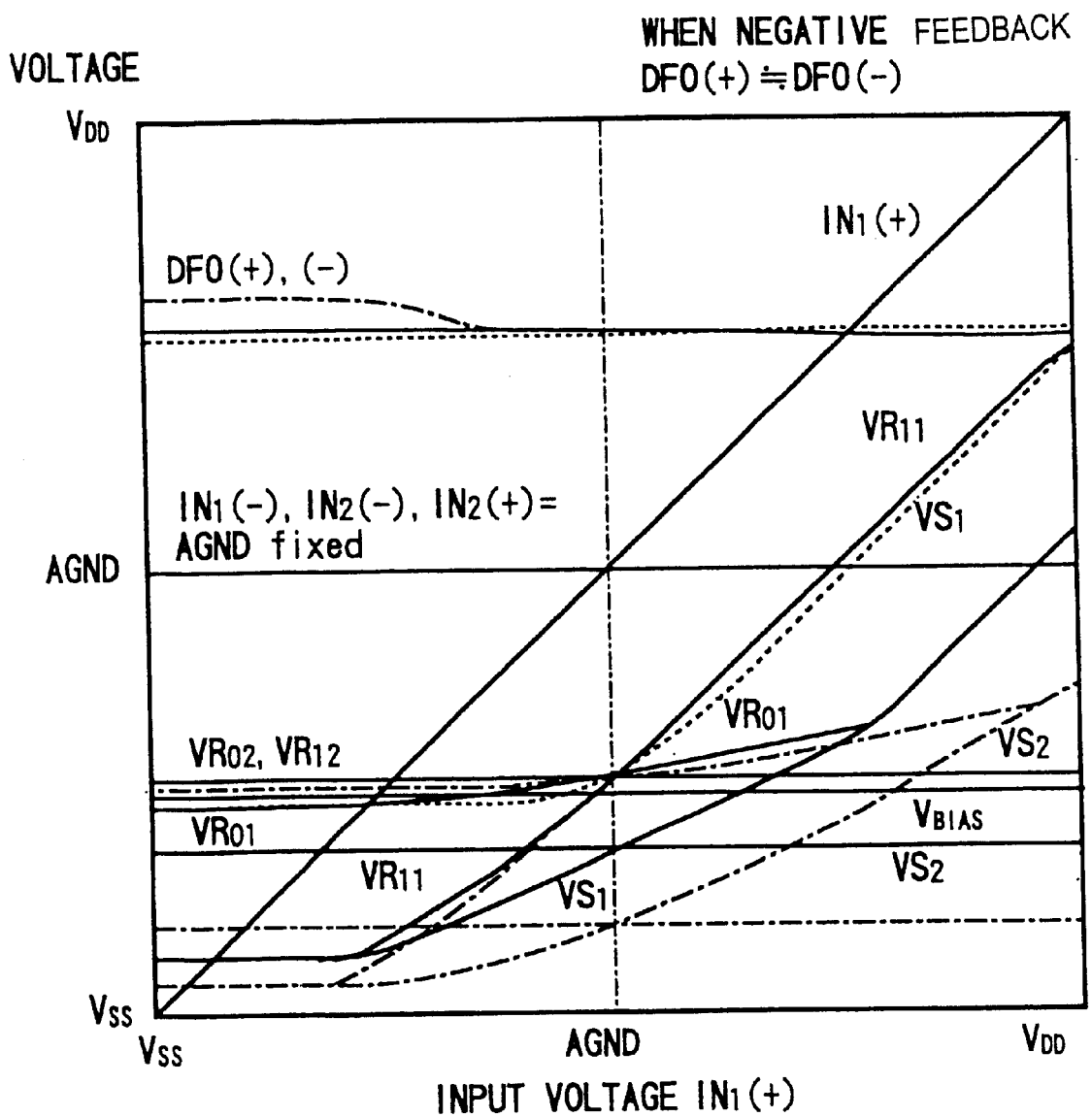
FIG. 18 is a graph of the change of the internal voltage-input voltage dependency due to the source resistance of a processing circuit supplying negative feedback between the input and the output of a 4-input differential amplifier circuit.
Figure 19:
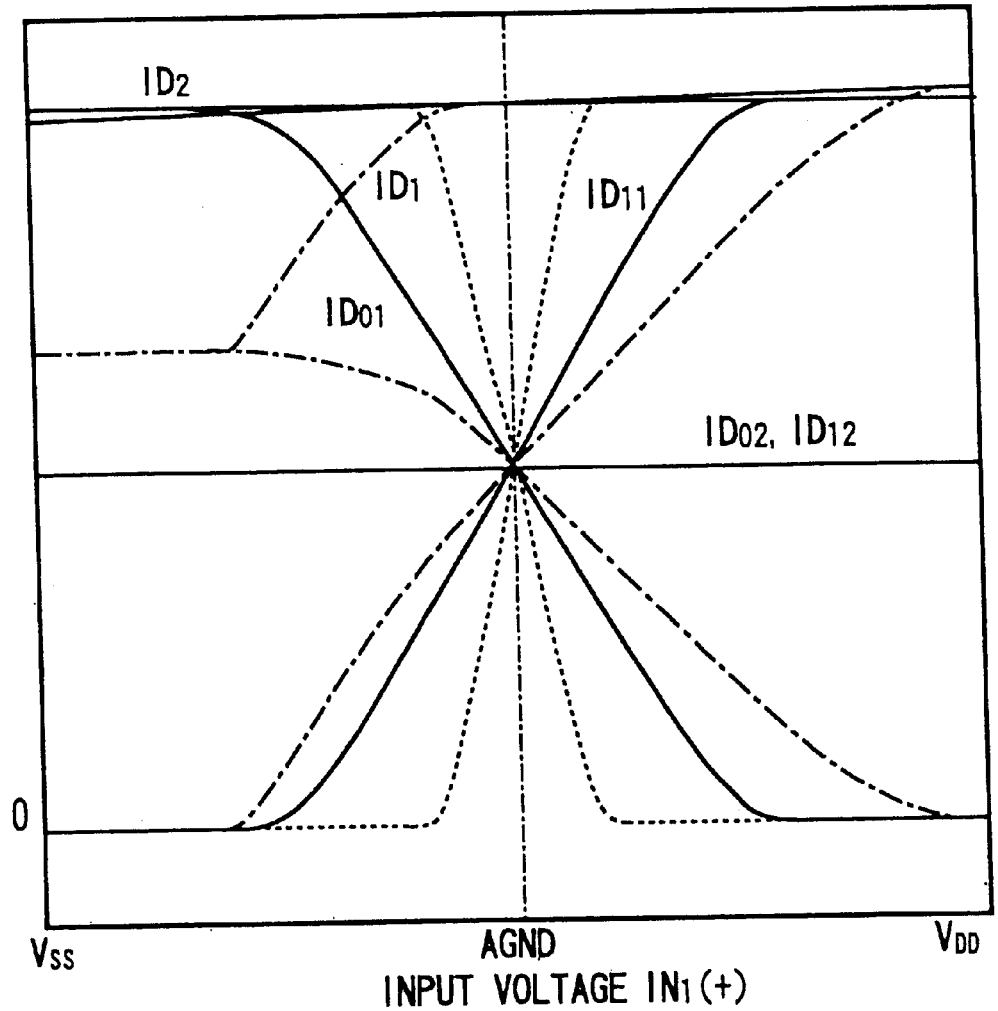
FIG. 19 is a graph of the change of the current-input voltage dependency due to the source resistance of a processing circuit supplying negative feedback between the input and the output of a 4-input differential amplifier circuit.

FIG. 18 is a graph of the change of the internal operating voltage-input voltage dependency due to the source resistance value in the case where the 4-terminal input differential amplifier circuit shown in FIG. 16 and FIG. 17 is operated as a processing circuit supplying negative feedback between the input and the output. Further, FIG. 19 is a graph of the change of the operating current-input voltage dependency due to the source resistance value in this case.

Figure 20:
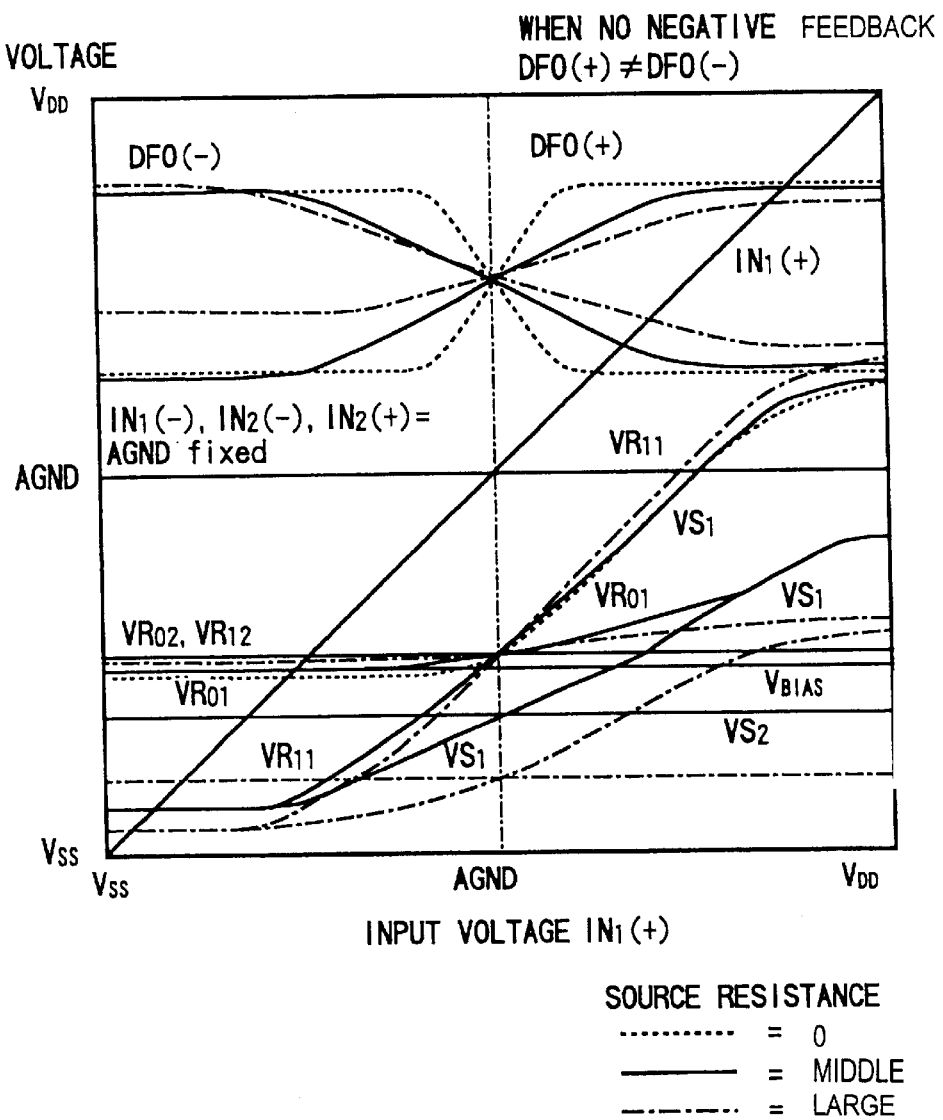
FIG. 20 is a graph of the change of the internal voltage-input voltage dependency due to the source resistance of a comparison and judgment circuit in which there is no negative feedback between the input and the output of a 4-input differential amplifier circuit.
Figure 21:
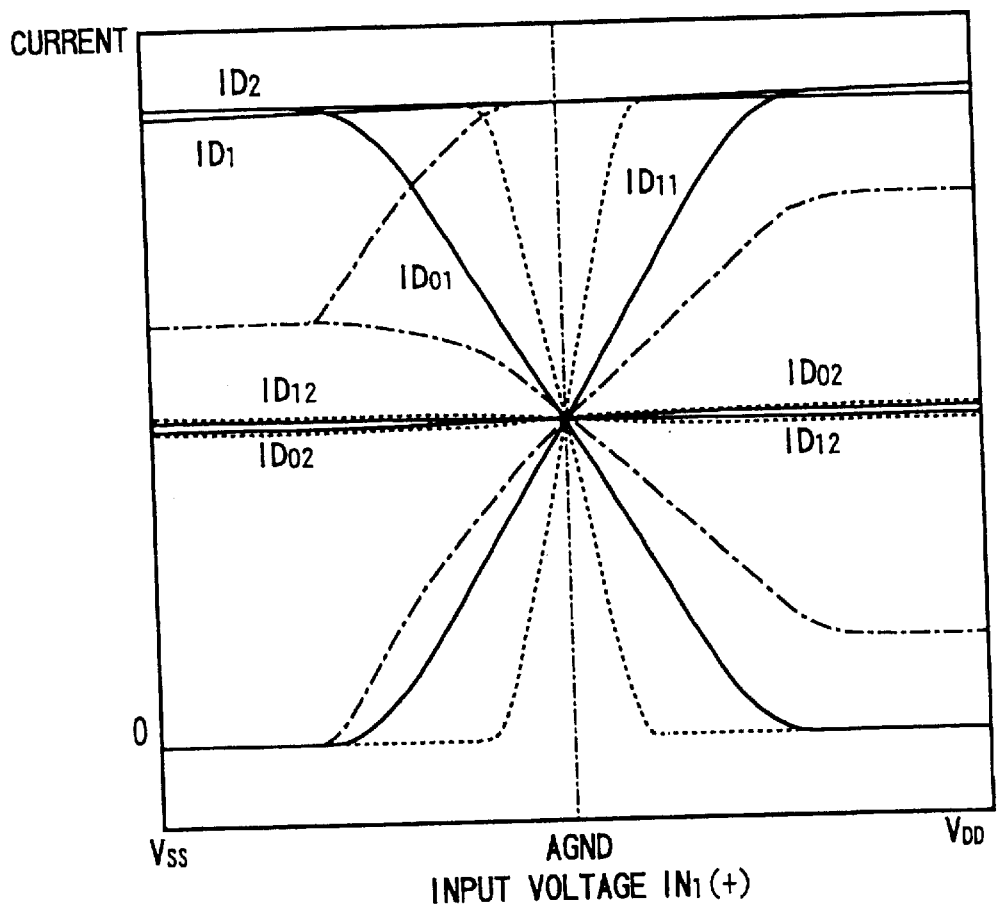
FIG. 21 is a graph of the change of the current-input voltage dependency due to the source resistance of a comparison and judgment circuit in which there is no negative feedback between the input and the output of a 4-input differential amplifier circuit.

FIG. 20 is a graph of the change of the internal operating voltage-input voltage dependency due to the source resistance value in the case where the 4-terminal input differential amplifier circuit shown in FIG. 16 and FIG. 17 is operated as a comparison and judgment circuit not supplying negative feedback between the input and the output. Further, FIG. 21 is a graph of the change of the operating current-input voltage dependency due to the source resistance value in this case.

Figure 22:
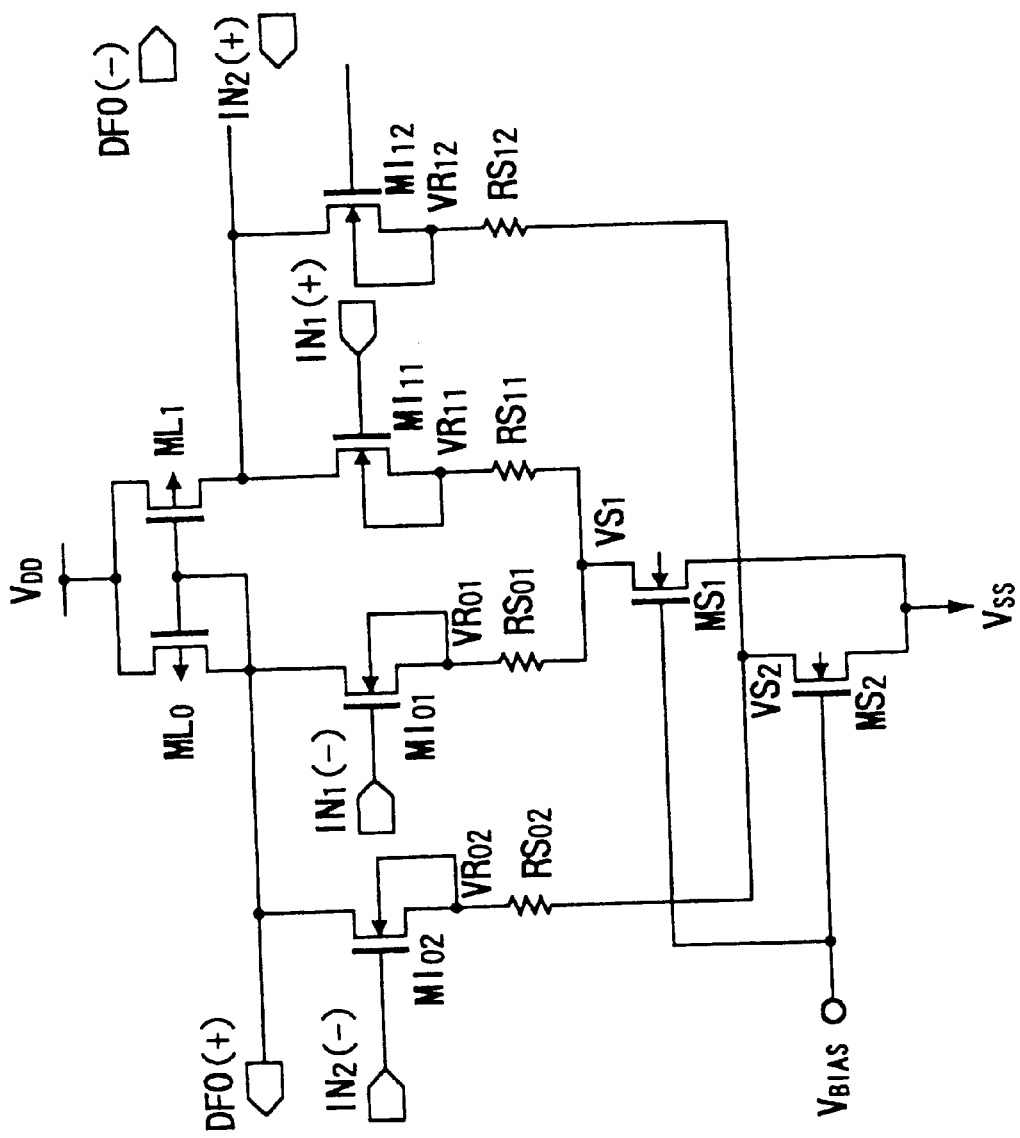
FIG. 22 is a circuit diagram of another example of the configuration of a 4-input differential amplifier circuit.

FIG. 22 shows another example of the configuration of a 4-terminal input differential amplifier circuit. As illustrated, in the 4-terminal input differential amplifier circuit of the present example, in comparison with the 4-terminal input differential amplifier circuit shown in FIG. 16, the load circuit is configured by a current mirror circuit comprising pMOS transistors $ML_0$ and $ML_0$ in place of the resistance elements $RL_0$ and $RL_1$. Except for the load circuit, the rest of the components are substantially the same as those of the 4-terminal input differential amplifier circuit exemplified in FIG. 16. Note that FIG. 23 shows for comparison an example of a conventional 4-terminal input differential amplifier circuit in which the load circuit is configured by a current mirror circuit.

Figure 23:
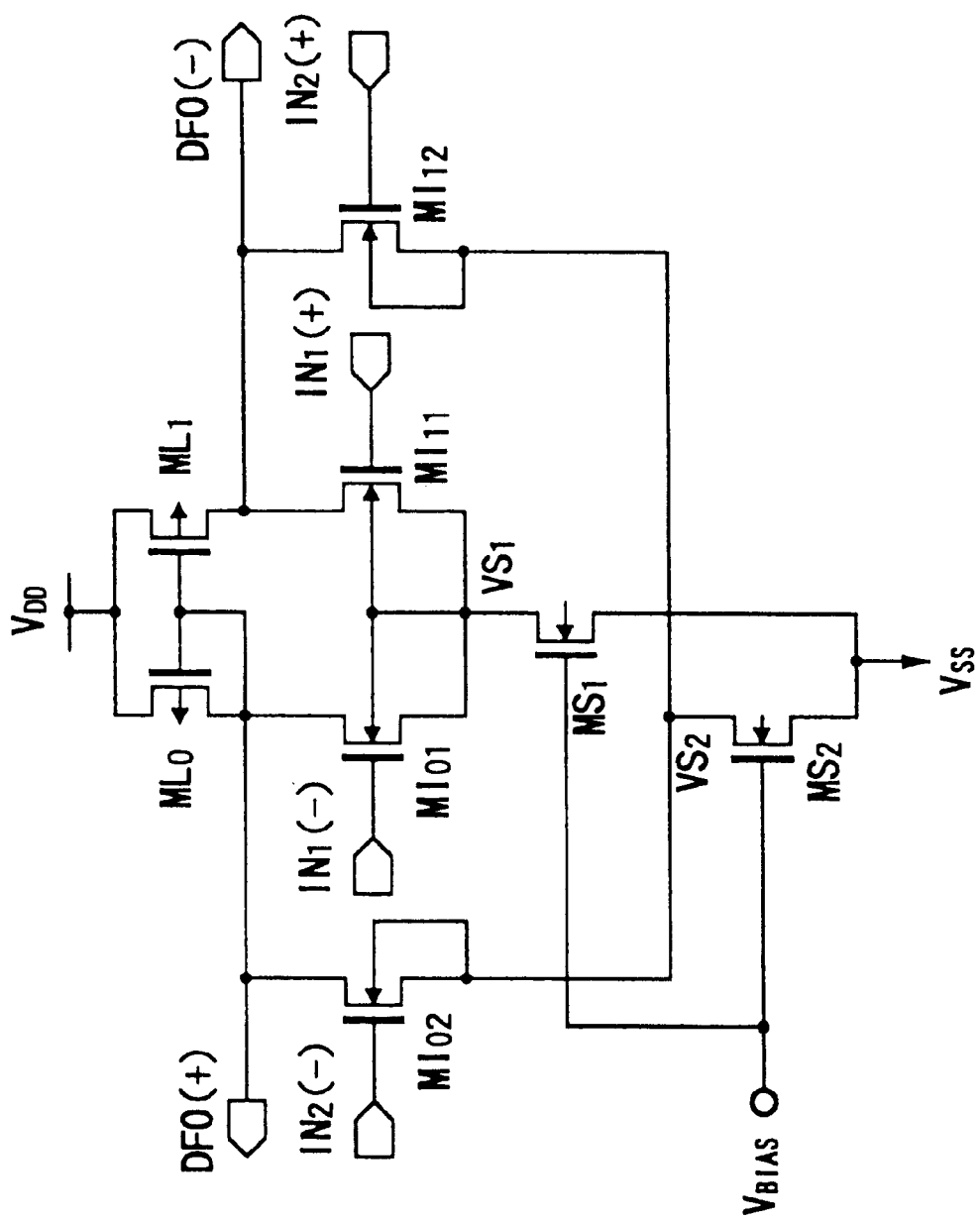
FIG. 23 is a circuit diagram of the example of another configuration of a conventional 4-input differential amplifier circuit.

As shown in FIG. 22 and FIG. 23, in the 4-terminal input differential amplifier circuit of the present example, resistance elements are inserted between the sources of the transistors configuring the differential pair and the transistor configuring the current source for supplying the operating current to each differential pair. Contrary to this, there are no resistance elements on the source side of the transistors configuring the differential pair in the conventional 4-terminal input differential amplifier circuit—the source of each transistor is directly connected to the transistor configuring the current source.

Figure 24:
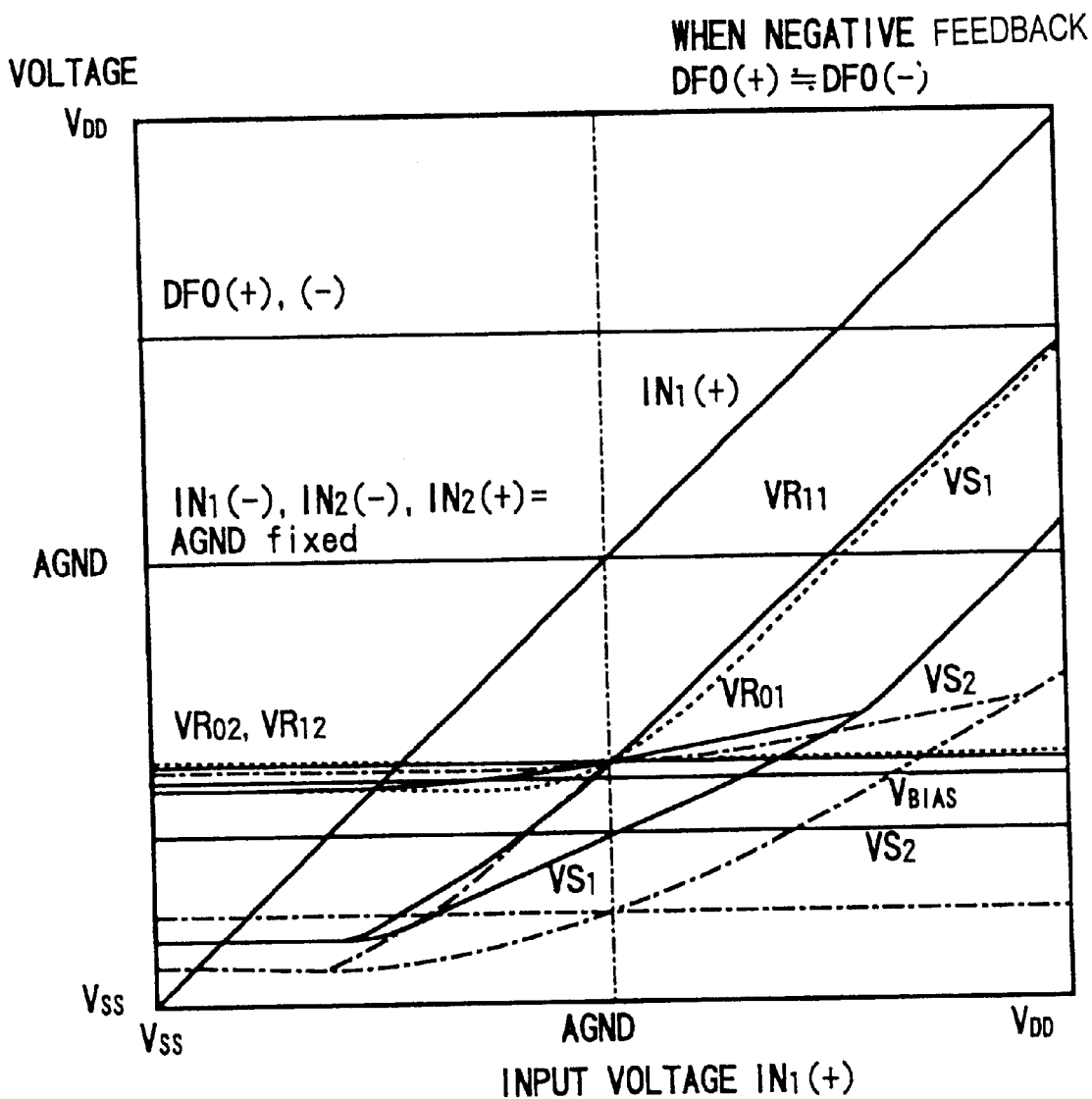
FIG. 24 is a graph of the change of the internal voltage-input voltage dependency due to the source resistance of the processing circuit supplying negative feedback between the input and the output of a 4-input differential amplifier circuit.
Figure 25:
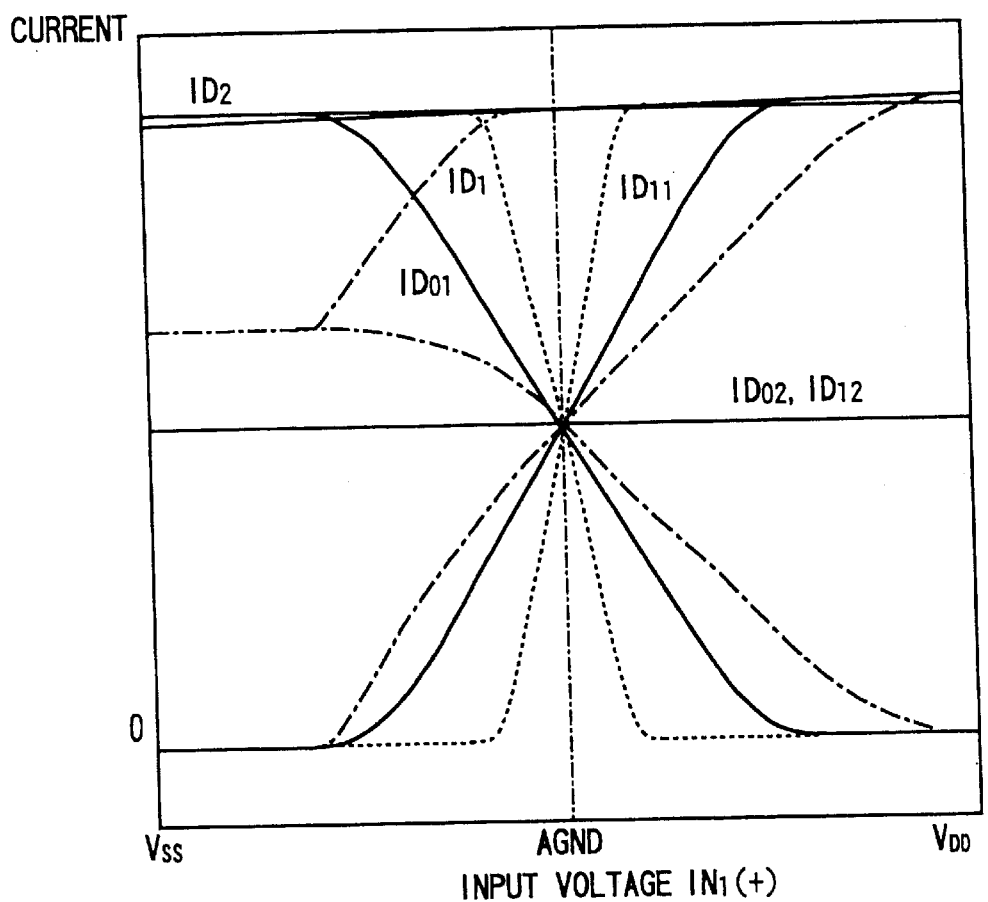
FIG. 25 is a graph of the change of the current-input voltage dependency due to the source resistance of a processing circuit supplying negative feedback between the input and the output of a 4-input differential amplifier circuit.

FIG. 24 is a graph of the change of the internal operating voltage-input voltage dependency due to the source resistance value in the case where the 4-terminal input differential amplifier circuit shown in FIG. 22 and FIG. 23 is operated as a processing circuit supplying negative feedback between the input and the output. Further, FIG. 25 is a graph of the change of the operating current-input voltage dependency due to the source resistance value in this case.

Figure 26:
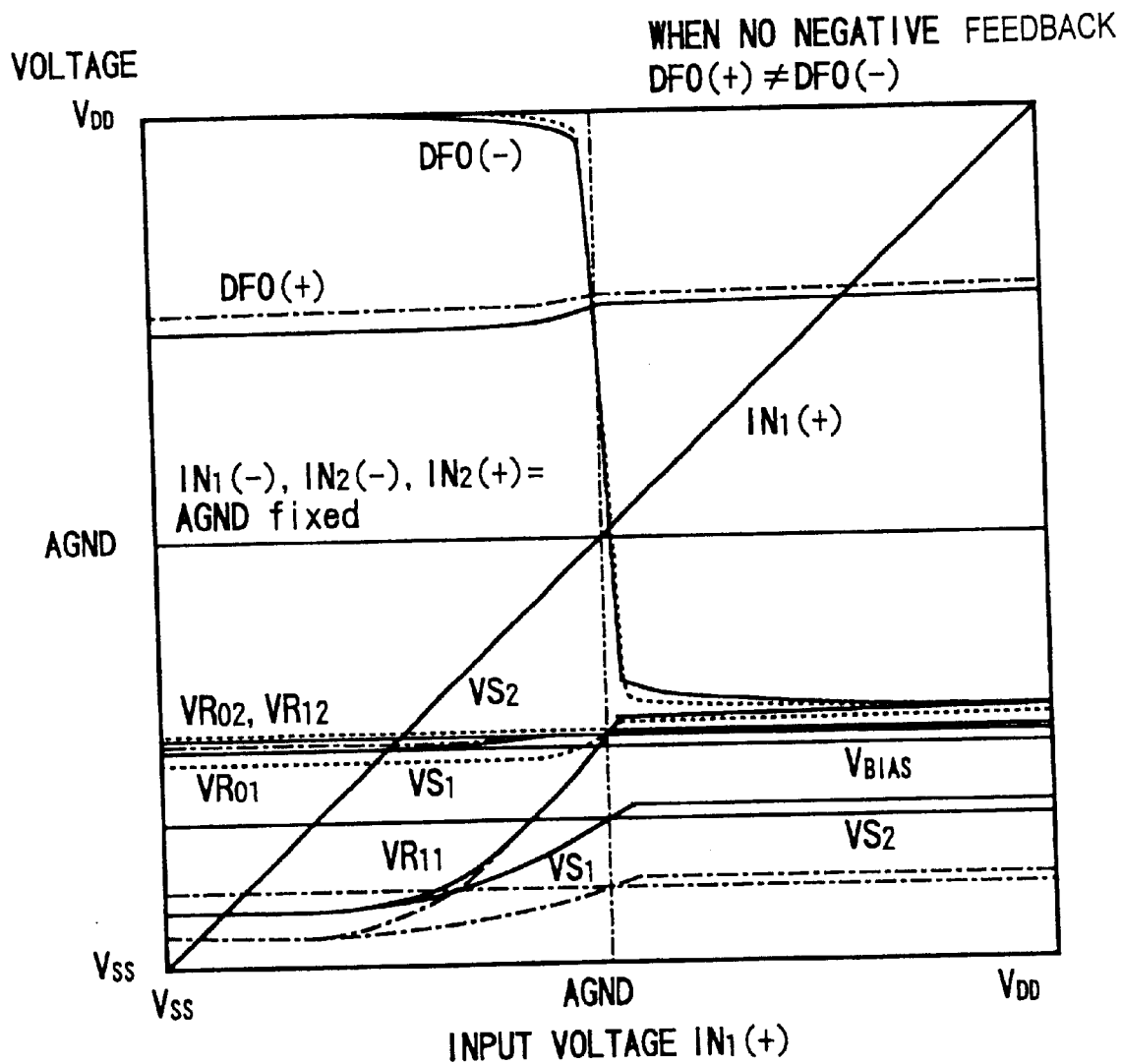
FIG. 26 is a graph of the change of the internal voltage-input voltage dependency due to the source resistance of a comparison and judgment circuit in which there is no negative feedback between the input and the output of a 4-input differential amplifier circuit.
Figure 27:
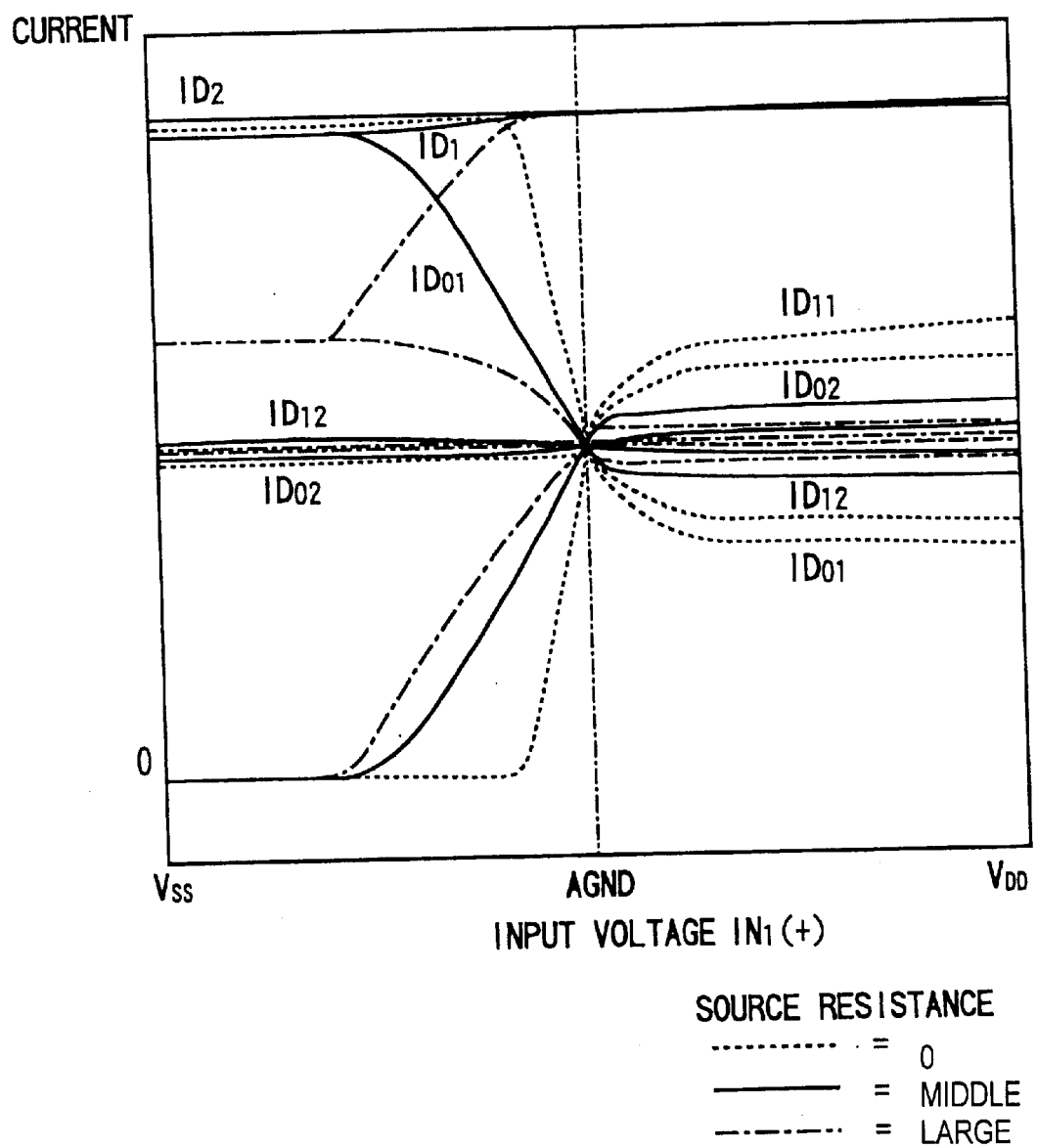
FIG. 27 is a graph of the change of the current-input voltage dependency due to the source resistance of a comparison and judgment circuit in which there is no negative feedback between the input and the output of a 4-input differential amplifier circuit.

FIG. 26 is a graph of the change of the internal operating voltage-input voltage dependency due to the source resistance value in the case where the 4-terminal input differential amplifier circuit shown in FIG. 22 and FIG. 23 is operated as a comparison and judgment circuit not supplying negative feedback between the input and the output. Further, FIG. 27 is a graph of the change of the operating current-input voltage dependency due to the source resistance value in this case.

Figure 28:
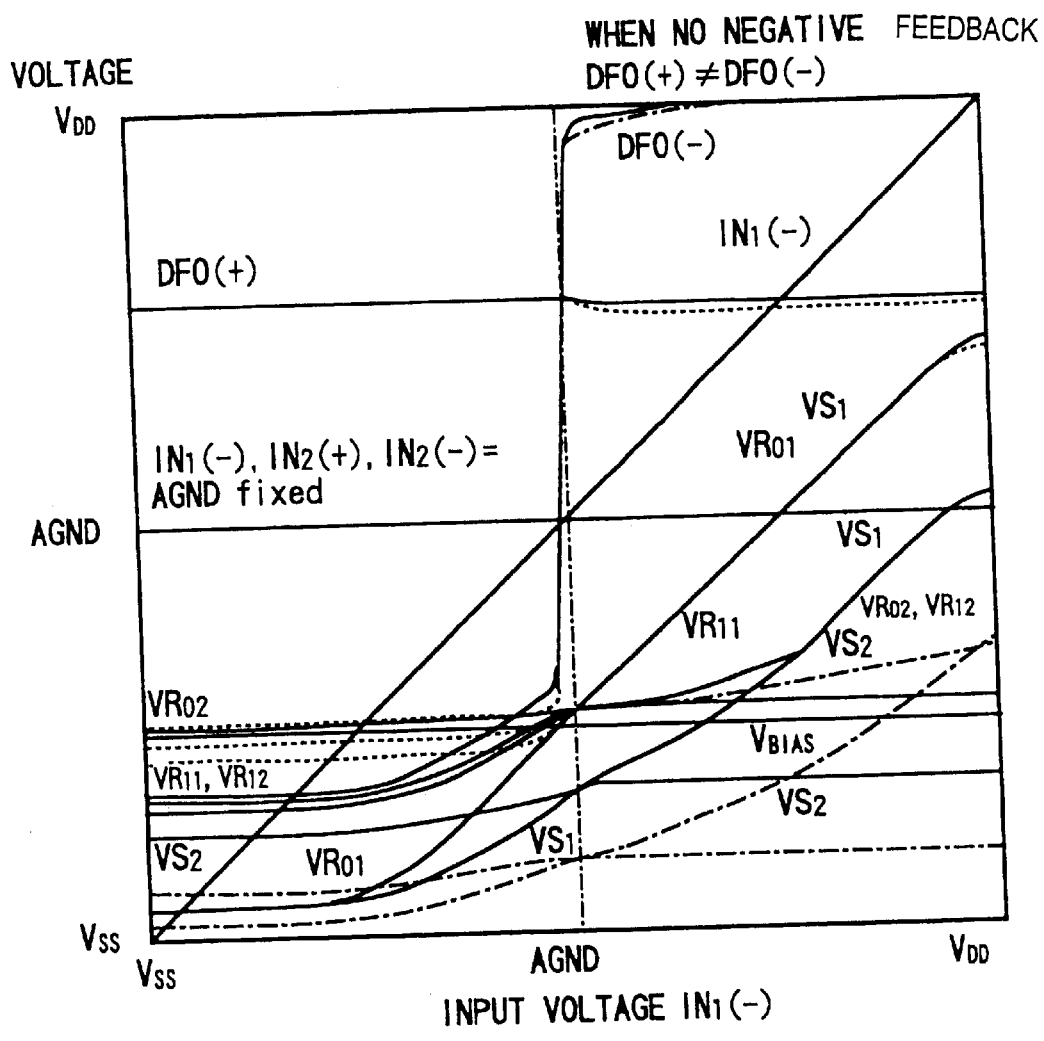
FIG. 28 is a graph of the change of the internal voltage-input voltage dependency due to the source resistance of a comparison and judgment circuit in which there is no negative feedback between the input and the output of a 4-input differential amplifier circuit.
Figure 29:
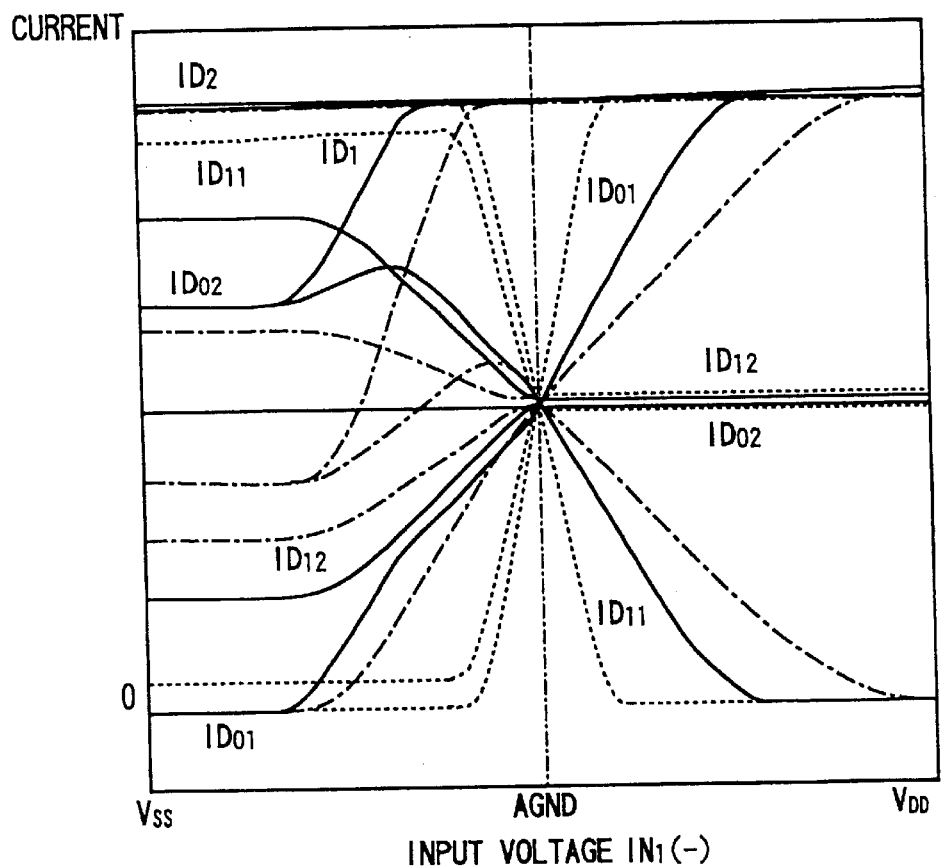
FIG. 29 is a graph of the change of the current-input voltage dependency due to the source resistance of a comparison and judgment circuit in which there is no negative feedback between the input and the output of a 4-input differential amplifier circuit.

FIG. 28 is a graph of the change of the internal operating voltage-input voltage dependency due to the source resistance value in the case where the 4-terminal input differential amplifier circuit shown in FIG. 22 and FIG. 23 is operated as a comparison and judgment circuit not supplying negative feedback between the input and the output. Further, FIG. 29 is a graph of the change of the operating current-input voltage dependency due to the source resistance value in this case. Note that in FIG. 28 and FIG. 29, the abscissa indicates the input signal voltage on the inverted input terminal IN(−) side.

Where it operates as the operation amplifier circuit in which the negative feedback is applied to between the input and the output, for an easy understanding, as the operation of the 4-terminal input differential amplifier circuit of the present example, the case where the input signal voltage changes at only $IN_1(+)$ among input terminals $IN_1(+)$, $IN_2(+)$, $IN_1(-)$ and $IN_2(-)$. Namely, the differential signals are input to only one of the two pairs of differential input terminals. For this reason, the amplitudes of the output terminals DFO(+) and DFO(−) become halves of those of the case where the differential signals are input to both of the two pairs of input terminals.

The source voltages $VR_{02}$ and $VR_{12}$ of the transistors $MI_{02}$ and $MI_{12}$ in the differential pair to which the differential signals are not input, the voltage $v_{S2}$ of the node $VS_2$, and the operating currents $ID_{02}$ and $ID_{12}$ become substantially constant under the input voltage condition of the case where all of the four input terminals are held at the analog ground voltage AGND. On the other hand, the source voltages $VR_{01}$ and $VR_{11}$ of the transistors $MI_{01}$ and $MI_{11}$ in the differential pair to which the differential signals are input, the voltage $VS_1$ of the node $VS_1$, and the operating currents $ID_{01}$ and $ID_{11}$ are substantially the same as those in the operation of the 2-terminal input differential amplifier circuit.

Namely, in the 4-terminal input differential amplifier circuit mentioned above, the operating voltages and the operating currents of the differential pairs configuring the differential amplifier circuit are substantially the same as those of the differential pair configuring a 2-terminal input differential amplifier circuit.

When it operates as a comparison circuit not supplying negative feedback between the input and the output of the differential amplifier circuit, a 4-terminal input differential amplifier circuit operates in a way whereby the currents of the transistors are equal, that is, $ID_{02}=ID_{12}$, in the differential pair to which the differential signals are not input, that is, the differential pair configured by the transistors $MI_{02}$ and $MI_{12}$. Contrary to this, in the differential pair to which the differential signals are input, that is, the differential pair configured by the transistors $MI_{01}$ and $MI_{11}$, the currents of the transistors are different. Namely, $ID_{02} \approx ID_{12}$. For this reason, it is slightly different from the operation of the 2-terminal input differential amplifier circuit operating as a complete comparison circuit, but has a similar effect to that of the case where negative feedback is supplied between the input and the output. The voltage range in which the linear characteristic is obtained between the input and the output becomes broader, so an increase of the dynamic range of the differential amplifier circuit and an increase of the speed of the operation can be realized.

For example, in a differential amplifier circuit operating when the power supply voltage $V_{DD}$ is 5V, the linear operation region having the input voltage range of AGND±400 mV in the case of no source resistance is enhanced to about AGND+2V to AGND−0.8V by inserting the source resistors.

Note that, in the differential amplifier circuit explained above, differential pairs configured by n-channel MOS transistors were shown as the example, but the present invention is not limited to this. For example, the differential pair can be configured also by p-channel transistors. Further, needless to say it can be configured by bipolar transistors other than MOS transistors.

Further, in the multi-input differential amplifier circuit explained above, the output load circuit of each differential pair is configured by a current mirror circuit or resistor load, but the present invention is not limited to this. It is possible to configure the load circuit by for example pNOS transistors to the gates of which a predetermined bias voltage is supplied or pMOS transistors with both gates and drains connected to the output node.

Second Embodiment

Figure 30:
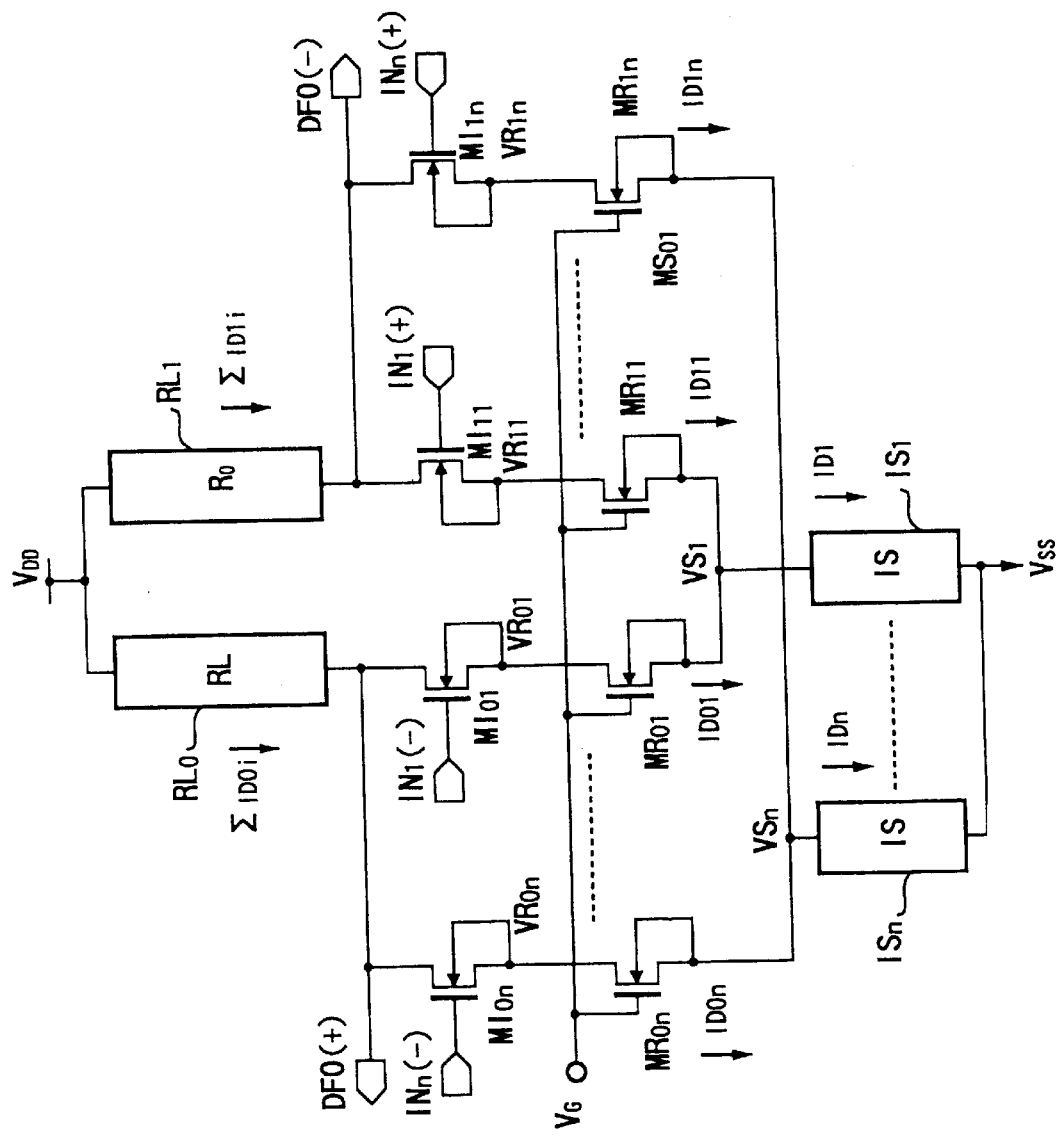
FIG. 30 is a circuit diagram of a second embodiment of a multi-input differential amplifier circuit.

FIG. 30 shows a second embodiment of the multi-input differential amplifier circuit of the present invention. As illustrated, the differential amplifier circuit of the present embodiment has substantially the same configuration as that of the first embodiment of the differential amplifier circuit shown in FIG. 1, but the transistors to the gates of which the predetermined bias voltage is supplied are connected to the source side of the transistors configuring each differential pair in place of the resistance elements. For example, n-channel MOS transistors $MR_{01}$ and $MR_{11}$ are connected between the sources of the transistors $MI_{01}$ and $MI_{11}$ and the node $VS_1$. Further, n-channel MOS transistors $MR_{0n}$ and $MR_{1n}$ are connected between the sources of the transistors $MI_{0n}$ and $MI_{1n}$ and the node $VS_n$. A bias voltage $V_G$ is supplied to the gates of the transistors $MR_1$ and $MR_n$. Note that the bias voltage $V_G$ is a voltage that is set so that the transistors $MR_{01}, MR_{11}, \ldots, MR_{0n}$ and $MR_{1n}$ operate in the non-saturation region and is set at the power supply voltage $V_{DD}$, the common voltage $V_{SS}$, or a predetermined voltage between the power supply voltage $V_{DD}$ and the common voltage $V_{SS}$ according to the configuration and so forth of the circuit.

Figure 31:
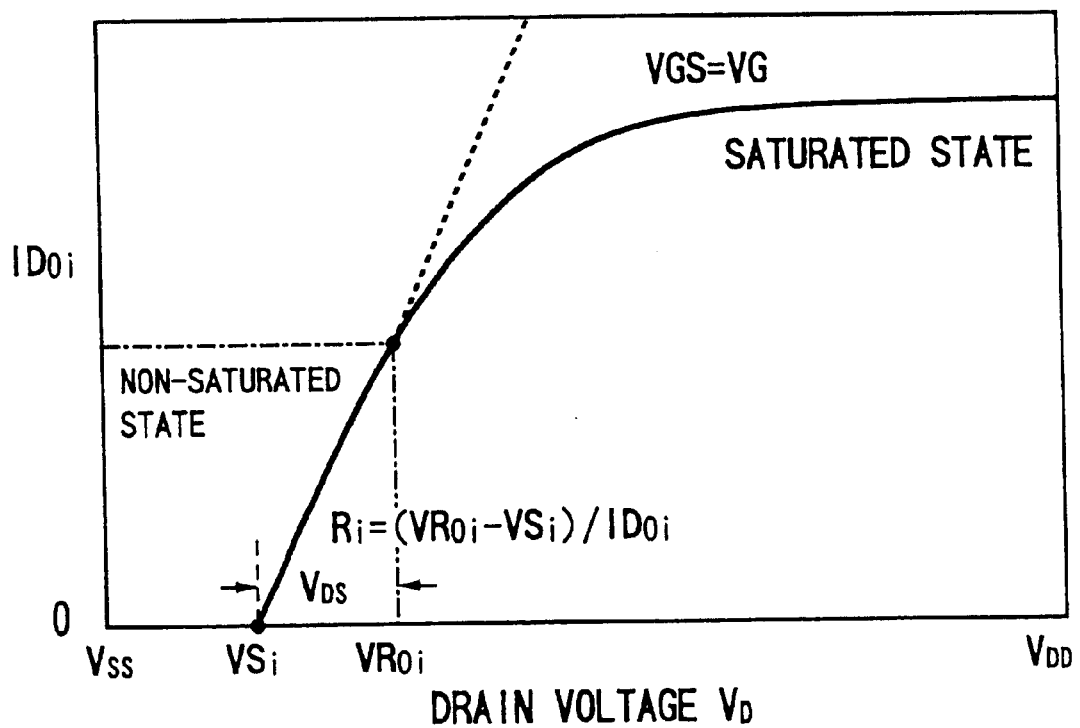
FIG. 31 is a graph of the operational characteristic of transistors acting as the resistors in the second embodiment of the differential amplifier circuit according to the present invention.

FIG. 31 is a graph of the operating characteristics of the transistors $MR_{01}, MR_{11}, \ldots, MR_{0n}$ and $MR_{1n}$ in the second embodiment shown in FIG. 30. Here, for example, it shows the relationship of the current and the drain voltage of the transistor $MR_{0i}$ (i=1, 2, . . . , n). In FIG. 31, the abscissa indicates the drain voltage VD of the transistor, and the ordinate indicates the current $ID_{0i}$ of the transistor.

As illustrated, when the drain voltage $V_D$ of the transistor is lower than the voltage $VR_{0i}$, the current $ID_{0i}$ flowing through the transistor changes in proportion to the drain voltage $V_D$. At this time, the transistor equivalently has a characteristic as a resistance element. The resistance value $R_i$ thereof is represented by the following equation:

$$R_i = (VR_{0i} - V_{Si})/ID_{0i} \tag{55}$$

In equation (55), $VR_{0i}$ is the source voltage of the transistor $MI_{0i}$ or $MI_{1i}$ configuring the differential pair as shown in FIG. 30, while $V_{Si}$ is the source voltage of the transistor $MR_{0i}$ or $MR_{1i}$ configuring the source resistor.

When the drain voltage $V_D$ of the transistor exceeds the voltage $VR_{01}$, the transistor enters the saturation region. In this case, the linear relationship disappears between the current $ID_{0i}$ flowing through the transistor and the drain voltage $V_D$. When the gate voltage $V_G$ is high like the power supply voltage $V_{DD}$, as illustrated, the rates of change of the current $ID_{0i}$ and the drain voltage $V_D$ are held at almost constant ratios. For this reason, in the multi-input differential amplifier circuit shown in FIG. 30, by setting the bias voltage $V_G$ to be input to the gates of the transistors $MR_{01}$ $MR_{11}, \ldots, MR_{0n}$ and $MR_{1n}$ at a high voltage, for example, the power supply voltage $V_{DD}$, the transistors act as resistance elements.

In the first and second embodiments mentioned above, the sources of the transistors configuring the differential pairs are connected to the current sources for supplying the operating currents to the differential pairs via the resistance elements or the transistors to the gates of which the predetermined bias voltage is supplied. Namely, in the multi-input differential amplifier circuit of the present invention, the sources of the transistors configuring the differential pair are separated by the resistance elements or the transistors acting as the resistance elements.

Third Embodiment

Figure 32:
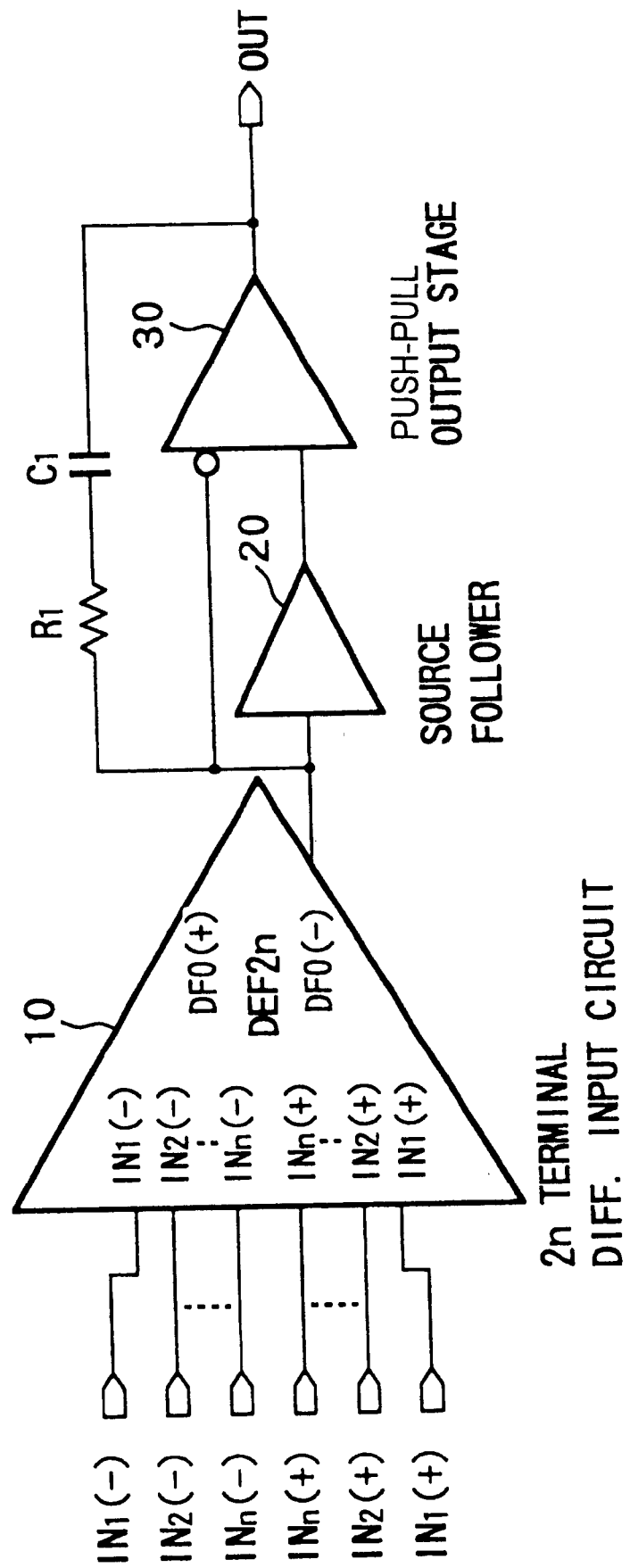
FIG. 32 is a circuit diagram of an example of the configuration of a third embodiment of the differential amplifier circuit according to the present invention.
Figure 33:
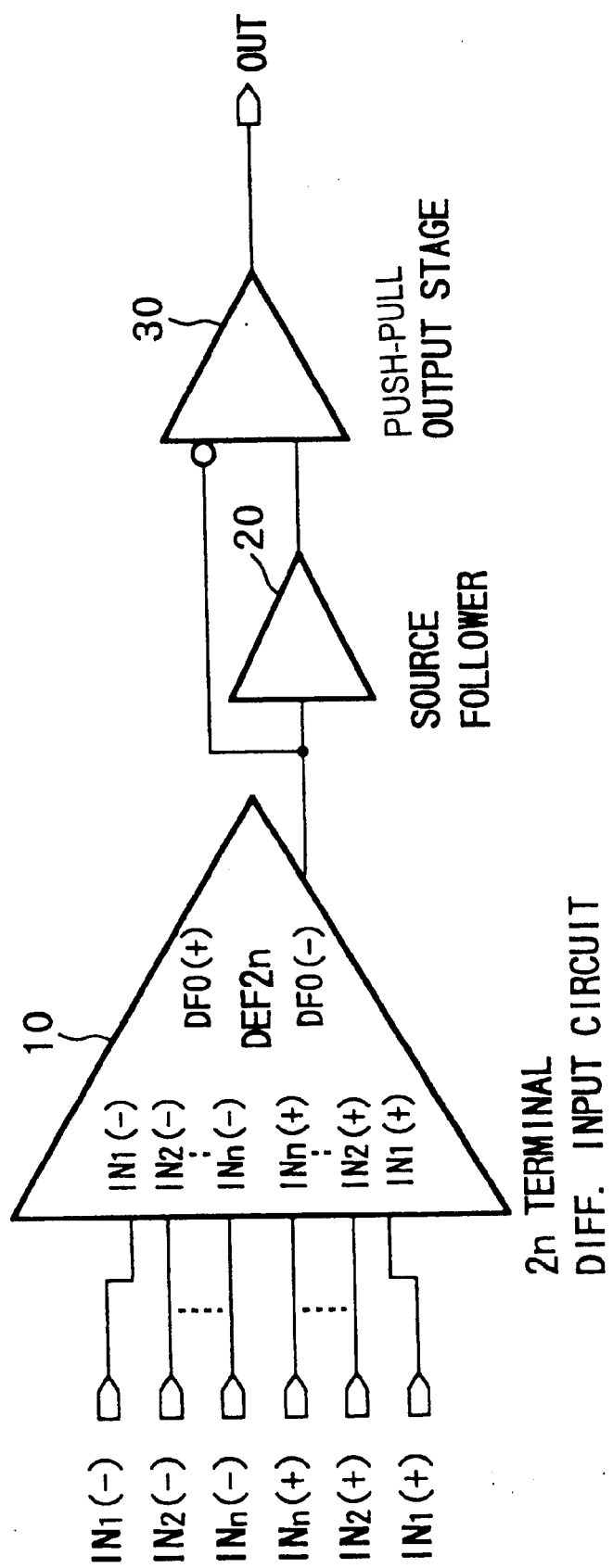
FIG. 33 is a circuit diagram of another example of the configuration of the third embodiment of the differential amplifier circuit according to the present invention.
Figure 34:
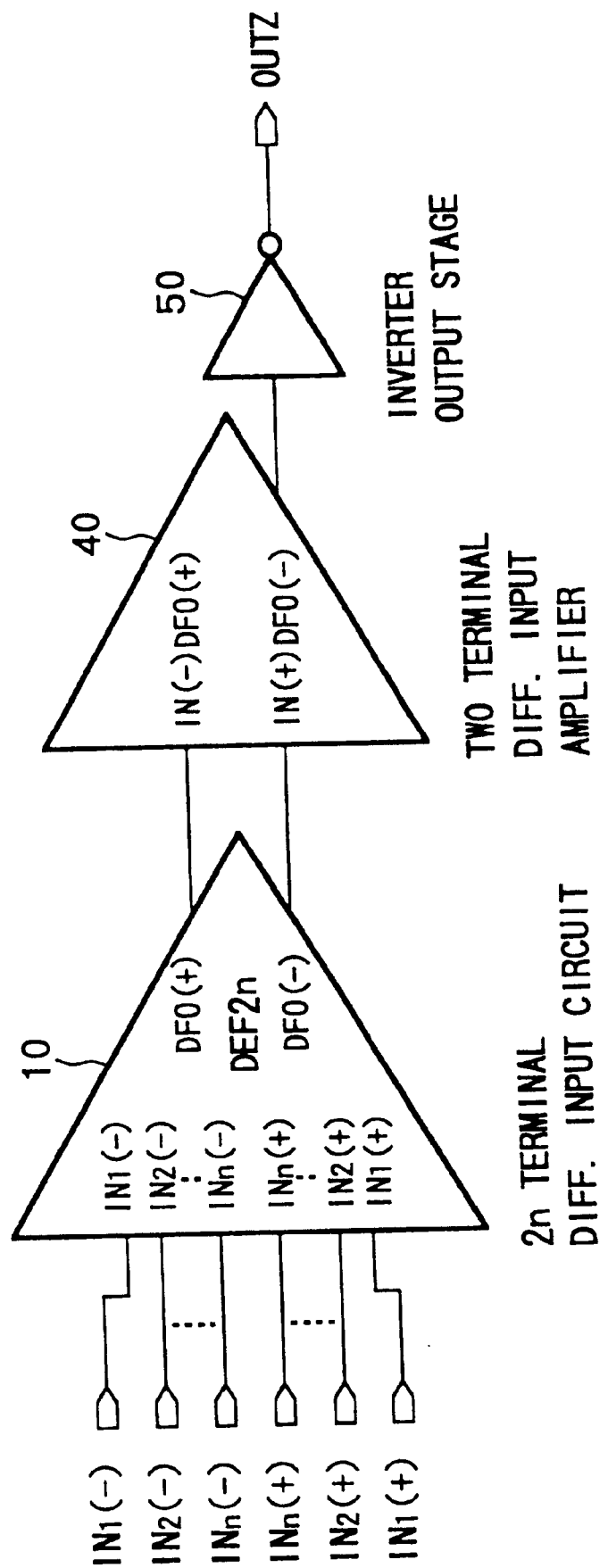
FIG. 34 is a circuit diagram of another example of the configuration of the third embodiment of the differential amplifier circuit according to the present invention.

FIG. 32, FIG. 33, and FIG. 34 show examples of the configuration of a multi-input amplifier circuit and multi-input comparison circuit configured using the differential amplifier circuit of the present invention. Note that, in these circuits, the multi-input differential amplifier circuit shown in FIG. 30 mentioned above is used as the multi-terminal differential input circuit (DEF2n).

FIG. 32 shows the example of the configuration of a multi-input amplifier circuit configured by a differential input circuit of 2n-input terminals (DEF2n) 10, a source follower 20, and the push-pull output stage 30.

As illustrated, the input terminal of the source follower 20 is connected to the inverted output terminal DFO(−) of the differential input circuit 10. The output signal from the inverted output terminal DFO(−) of the differential input circuit 10 and the output signal of the source follower 20 are input to the push-pull output stage 30.

As illustrated, in order to prevent oscillation when applying negative feedback between the input and the output of the differential amplifier circuit, the phase compensation resistance element $R_1$ and capacitor $C_1$ are connected in series between the output terminal OUT of the push-pull output stage and the inverted output terminal DFO(−) of the differential input circuit 10.

FIG. 33 shows an example of the configuration of a comparison circuit configured by the 2n-input terminal differential input circuit 10, the source follower 20, and the push-pull output stage 30.

As illustrated, the circuit configuration of the present example is substantially the same configuration as that of the multi-input amplifier circuit shown in FIG. 32. Note that since the circuit of the present example is used as a comparison circuit, the phase compensation circuit comprising the phase compensation resistance element $R_1$ and capacitor $C_1$ connected in series shown in FIG. 32 is omitted.

FIG. 34 shows an example of the configuration of a differential amplifier circuit configured by the 2n-input terminal differential input circuit 10, a 2-terminal input differential amplifier circuit 40, and an inverter output stage 50.

As illustrated, in the differential amplifier circuit of the present example, the inverted output terminal DFO(−) and the non-inverted output terminal DFO(+) of the 2n-terminal differential input circuit 10 are connected to the non-inverted input terminal In(+) and the inverted input terminal In(−) of the 2-terminal input differential amplifier circuit 40. The inverted output terminal DFO(−) of the 2-terminal input differential amplifier circuit 40 is connected to the input terminal of the inverter output stage 50.

Fourth Embodiment

FIG. 35 to FIG. 40 show examples of the concrete configuration of the multi-input amplifier circuit and the multi-input comparison circuit configured using the differential amplifier circuit of the present invention. Note that, in these circuits, a 4-terminal or 6-terminal input differential amplifier circuit is configured by using the multi-input differential amplifier circuit of the first and second embodiments shown in FIG. 1 and FIG. 30.

Figure 35:
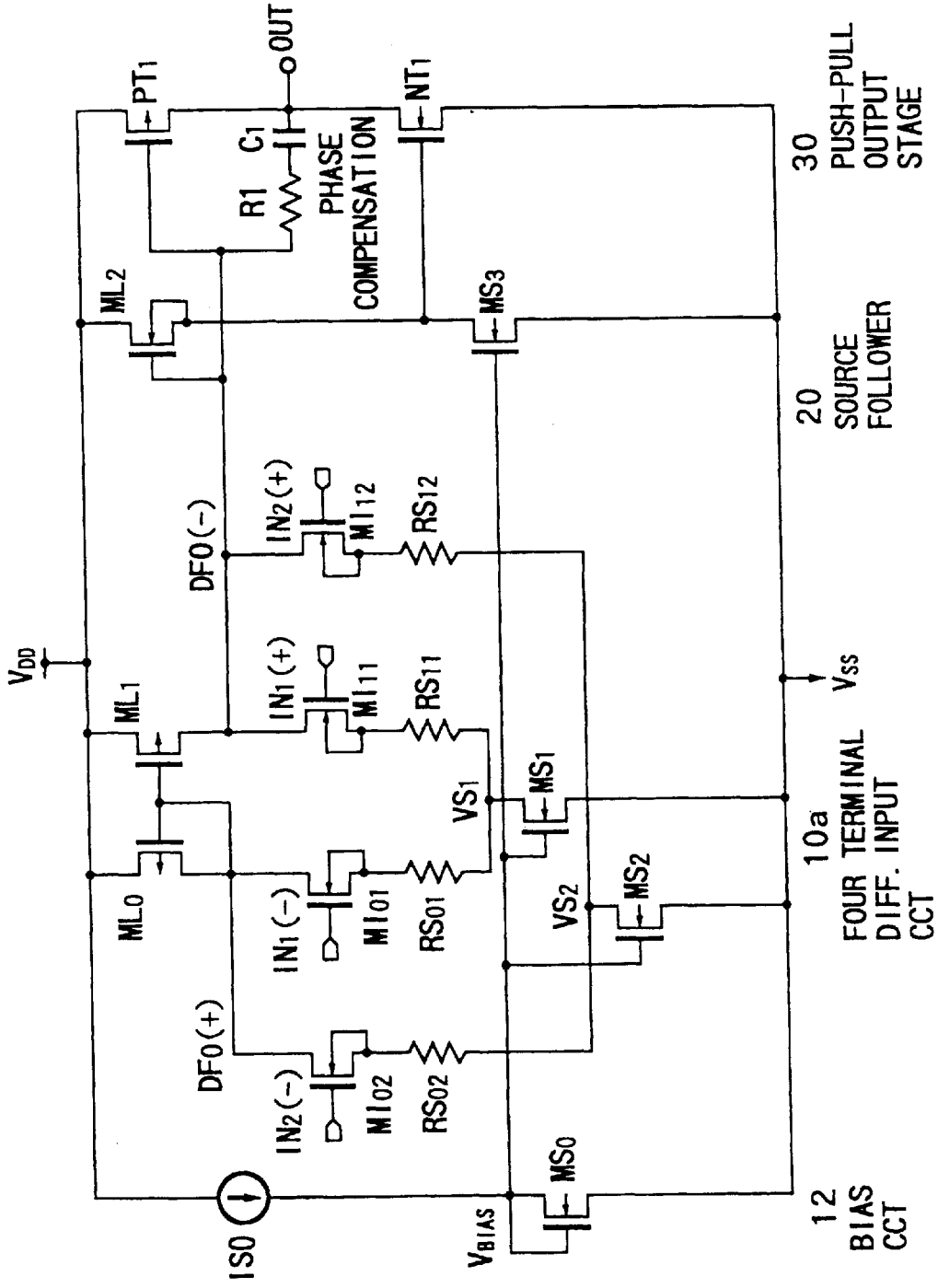
FIG. 35 is a circuit diagram of an example of the configuration of a fourth embodiment of the differential amplifier circuit according to the present invention.

FIG. 35 shows an example of the multi-input differential amplifier circuit configured by the 4-terminal input differential input circuit 10a, source follower 20, push-pull output stage 30, and a bias circuit 12.

The bias circuit 12 is configured by a current source $IS_0$ and an nMOS transistor $MS_0$ connected in series between the supply line of the power supply voltage $V_{DD}$ and the common voltage $V_{SS}$. The gate and the drain of the transistor $MS_0$ are commonly connected to the current source $IS_0$, while the source is connected to the common voltage $V_{SS}$. The bias voltage $V_{BIAS}$ is output from the connection point of the gate and the drain of the transistor $MS_0$.

The 4-terminal input differential input circuit is configured by two differential pairs configured by nMOS transistors $MI_{01}$, $MI_{11}$, $MI_{02}$, and $MI_{12}$. Further, the pMOS transistors $ML_0$ and $ML_1$ configure the current mirror circuit, while that current mirror circuit configures the output load circuit of the differential input circuit.

In the differential pair configured by the transistors $MI_{01}$ and $MI_{11}$, the gates of the transistors $MI_{01}$ and $MI_{02}$ are connected to the differential input terminals IN(+) and IN(-). The drains of the transistors $Mi_{01}$ and $MI_{11}$ are connected to the output terminals DFO(+) and DFO(-), and the sources are connected to the node $VS_1$ via the resistance elements $RS_{01}$ and $RS_{11}$.

The nMOS transistor $MS_1$ configures the current source for supplying the operating current to the transistors $MI_{01}$ and $MI_{12}$. The drain of the transistor $MS_1$ is connected to the node $VS_1$, the source is connected to the common voltage $V_{SS}$, and the bias voltage $V_{BIAS}$ generated by the bias circuit 12 is input to the gate.

In substantially the same way as the above description, in the differential pair configured by the transistors $MI_{02}$ and $MI_{12}$, the sources of the transistors $MI_{02}$ and $MI_{12}$ are connected to the $VS_2$ via the resistance elements $RS_{02}$ and $RS_{12}$, and the operating current is supplied to the node $VS_2$ by the transistor $MS_2$ to the gate of which the bias voltage $V_{BIAS}$ is supplied.

The source follower 20 is configured by the nMOS transistors $ML_2$ and $MS_3$. The transistors $ML_2$ and $MS_3$ are connected in series between the supply line of the power supply voltage $V_{DD}$ and the common voltage $V_{SS}$. The gate of the transistor $ML_2$ is connected to the inverted output terminal DFO(-) of the 4-terminal input differential input circuit 10a, while the source is connected to the gate of the transistor $NT_1$ configuring the push-pull output stage 30. The gate of the transistor $MS_3$ is supplied with the bias voltage $V_{BIAS}$. Namely, the transistor $MS_3$ configures the current source for supplying the operating current to the emitter of the transistor $ML_2$.

In the push-pull output stage 30, a pMOS transistor $PT_1$ and an nMOS transistor $NT_1$ are connected in series between the supply line of the power supply voltage $V_{DD}$ and the common voltage $V_{SS}$. The gate of the transistor $PT_1$ is connected to the inverted output terminal DFO(-) of the 4-terminal input differential input circuit 10a, while the gate of the transistor $NT_1$ is connected to the source of the transistor $ML_2$ configuring the source follower 20. The output terminal OUT is formed by the connection point of the transistors $PT_1$ and $NT_1$.

The resistance element $R_1$ and the capacitor $C_1$ are connected in series between the output terminal OUT and the inverted output terminal DFO(-) of the 4-terminal input differential input circuit 10a. The phase compensation circuit is configured by the resistance element $R_1$ and the capacitor $C_1$. The phase compensation circuit prevents the oscillation of the circuit when negative feedback is applied.

Figure 36:
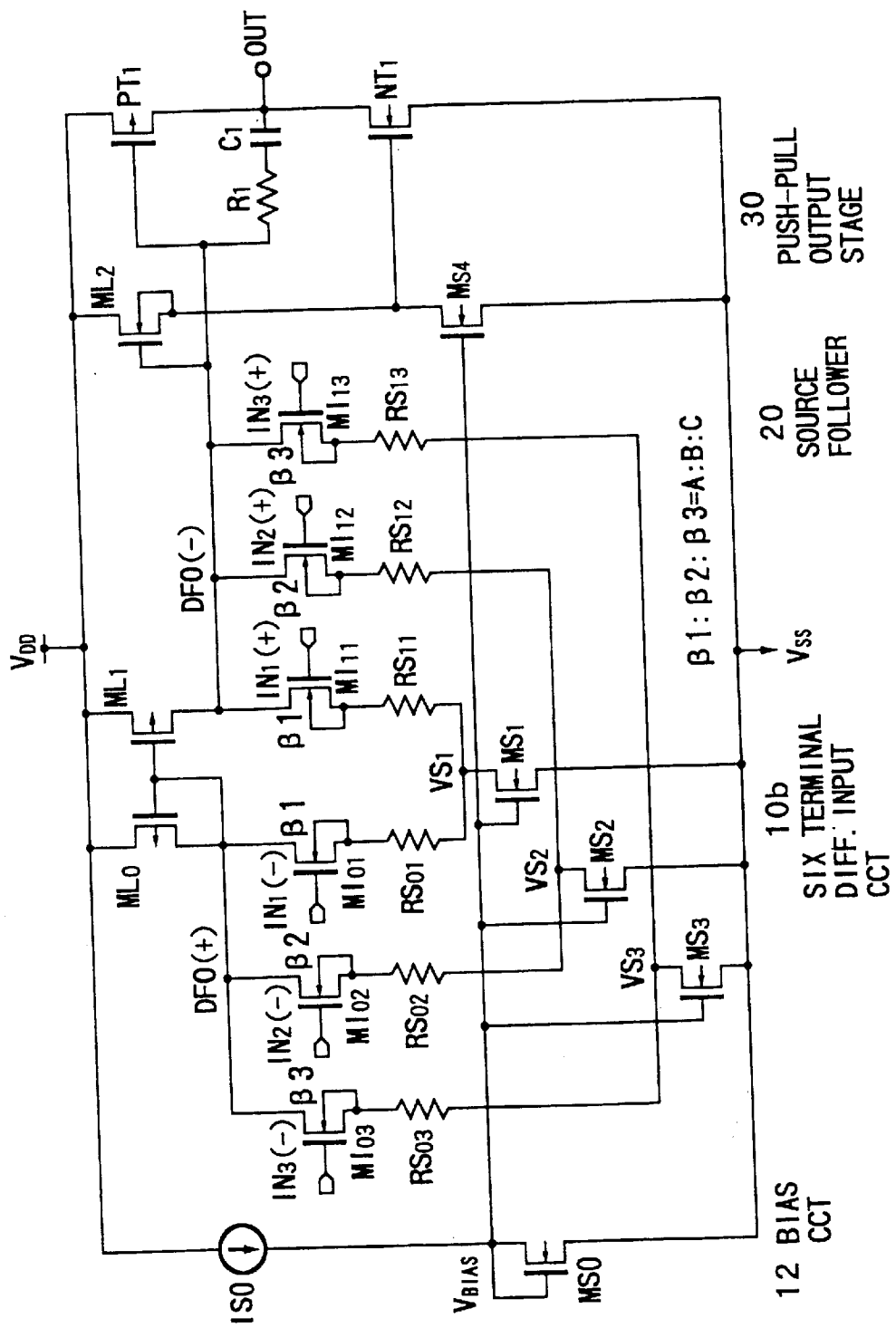
FIG. 36 is a circuit diagram of another example of the configuration of the fourth embodiment of the differential amplifier circuit according to the present invention.

FIG. 36 shows an example of a multi-input differential amplifier circuit configured by a 6-terminal input differential input circuit 10b, source follower 20, push-pull output stage 30, and bias circuit 12.

In the multi-input differential amplifier circuit of the present example, except for the 6-terminal input differential input circuit 10b, the bias circuit 12, the source follower 20, and the push-pull output stage 30 have the same configurations as those of the partial circuits of the example of the circuit shown in FIG. 35. Below, an explanation will be made of the configuration of the multi-input differential input circuit of the present example centered on the 6-terminal input differential input circuit 10b.

As illustrated, in the 6-terminal input differential input circuit 10b, three differential pairs are configured by the transistors $MI_{01}$, $MI_{02}$, and $MI_{03}$ and $MI_{11}$, $MI_{12}$, and $MI_{13}$. The gates of the transistors $MI_{11}$, $MI_{12}$, and $MI_{13}$ configure positive side input terminals, while the gates of the transistors $MI_{01}$, $MI_{02}$, and $MI_{03}$ configure negative side Input terminals. The drains of the positive side transistors are connected to the inverted output terminal DFO(-), while the drains of the negative side transistors are connected to the non-inverted output terminal DFO(+). The pMOS transistor $ML_0$ is connected between the supply line of the power supply voltage $V_{DD}$ and the non-inverted output terminal DFO(+), while the pMOS transistor $ML_1$ is connected between the supply line of the power supply voltage $V_{DD}$ and the inverted output terminal DFO(-). The gates of the transistors $ML_0$ and $ML_1$ are connected to each other, and the connection point thereof is connected to the drain of the transistor $ML_0$. Namely, the current mirror circuit is configured by these transistors. That current mirror circuit configures the load circuit of the 6-terminal Input differential Input circuit.

Here, when the current amplification rate of the transistors $MI_{01}$ and $MI_{11}$ configuring the three differential pairs is $\beta_1$, the current amplification rate of the transistors $MI_{02}$ and $MI_{12}$ is $\beta_2$, the current amplification rate of the transistors $MI_{03}$ and $MI_{13}$, is $\beta_3$, and $\beta_1:\beta_2:\beta_2=A:B:C$, the ratio of the current amplification rates of the transistors $MS_1$, $MS_2$, and $MS_3$ acting as the current sources for supplying the operating currents to the differential pairs is set at A:B:C in the same way as the transistors configuring the differential pair. Further, where the resistance value of the resistance elements $RS_{01}$, and $RS_{11}$ connected between the sources of the transistors configuring each differential pair and the current source is $R_A$, the resistance value of the resistance elements $RS_{02}$ and $RS_{12}$ is $R_B$, and the resistance value of the resistance elements $RS_{03}$ and $RS_{13}$ is $R_C$, $R_A:R_B:R_C=(1/A):(1/B):(1/C)$ is set.

The sources of the transistors $MI_{01}$ and $MI_{11}$ are connected via the resistance elements $RS_{01}$ and $RS_{11}$ to the node $VS_1$. The transistor $MS_1$ is connected between the node $VS_1$ and the common voltage $V_{SS}$. Similarly, the sources of the transistors $MI_{02}$ and $MI_{12}$ are connected via the resistance elements $RS_{02}$ and $RS_{12}$ to the node $VS_2$. The transistor $MS_2$ is connected between the node $VS_2$ and the common voltage $V_{SS}$. The sources of the transistors $MI_{03}$ and $MI_{13}$ are connected via the resistance elements $RS_{03}$ and $RS_{13}$ to the node vs3. The transistor $MS_3$ is connected between the node $VS_3$ and the common voltage $V_{SS}$.

The bias voltage $V_{BIAS}$ generated by the bias circuit 12 is supplied to the gates of the transistors $MS_1$, $MS_2$, and $MS_3$. Namely, the current sources for supplying the operating currents to the differential pairs are configured by the transistors $MS_1$, $MS_2$, and $MS_3$.

In the multi-input differential amplifier circuit configured in this way, the differential input signals input to the differential input terminals $IN_1(+)$ and $IN_1(-)$, $IN_2(+)$ and $IN_2(-)$, and $IN_3(+)$ and $IN_3(-)$ are weighted with the ratio of A:B:C, and the amplified signals are output from the output terminal OUT of the push-pull output stage.

Figure 37:
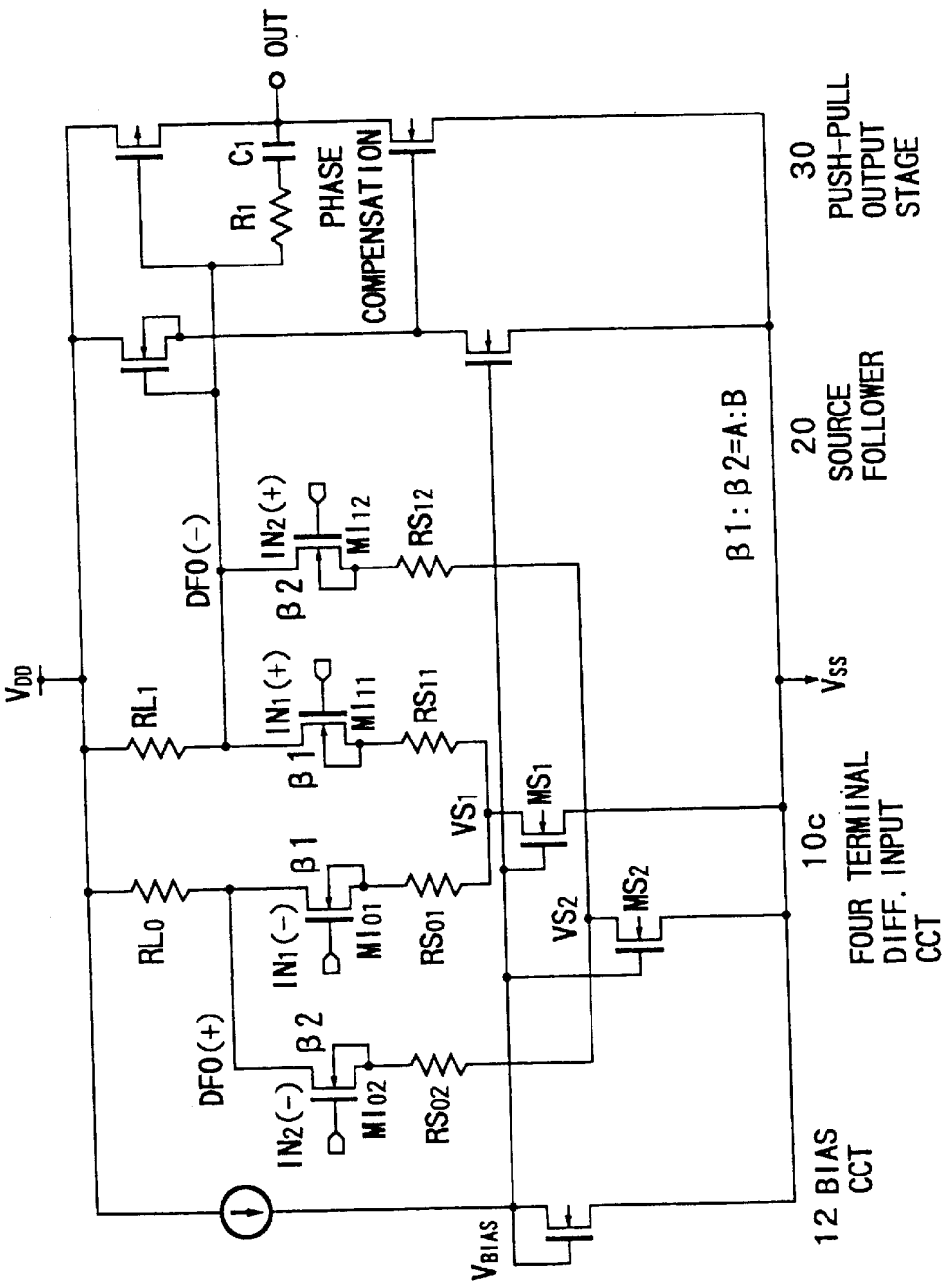
FIG. 37 is a circuit diagram of another example of the configuration of the fourth embodiment of the differential amplifier circuit according to the present invention.

FIG. 37 shows the example of another circuit of the multi-input differential amplifier circuit configured by a 4-terminal input differential input circuit 10c, the source follower 20, push-pull output stage 30, and the bias circuit 12. Except for the 4-terminal input differential input circuit 10c, the rest of the components have the same configuration as those of the partial circuits of the example of the circuit shown in FIG. 35. Below, an explanation will be made of the configuration of the multi-input differential amplifier circuit of the present example focusing on the 4-terminal input differential input circuit 10c.

As illustrated, the 4-terminal input differential input circuit 10c in the multi-input differential amplifier circuit of the present example has two differential pairs configured by the transistors $MI_{01}$, $MI_{11}$, and $MI_{02}$, $MI_{12}$, the load circuit configured by the resistance elements $RL_0$ and $RL_1$, and the current sources configured by the transistors $MS_1$ and $MS_2$. Namely, in comparison with the 4-terminal input differential input circuit 10a shown in FIG. 35, the output load circuit is configured by the resistance elements $RL_0$ and $RL_1$ in place of the current mirror circuit comprising the transistors $ML_0$ and $ML_1$.

Further, when the current amplification rate of the transistors $MI_{01}$ and $MI_{11}$ configuring the two differential pairs in the circuit of the present example is $\beta_1$, the current amplification rates of the transistors $MI_{02}$ and $MI_{12}$ is $\beta_2$, and $\beta_1:\beta_2=A:B$, the ratio of the current amplification rates of the transistors $MS_1$ and $MS_2$ acting as the current sources for supplying the operating currents to the differential pairs is set at A:B in the same way as the transistors configuring the differential pair. Further, when the resistance value of the resistance elements $RS_{01}$, and $RS_{11}$, connected between the sources of the transistors configuring each differential pair and the current source is $R_A$ and the resistance value of the resistance elements $RS_{02}$ and $RS_{12}$ is $R_B$, $R_A:R_B=(1/A):(1/B)=B:A$ is set.

In the 4-input terminal differential amplifier circuit configured in this way, the differential input signals input to the differential input terminals IN(+) and IN(−) and $IN_2(+)$ and $IN_2(-)$ are weighted with the ratio of A:B, and the amplified signals are output from the output terminal OUT of the push-pull output stage.

Figure 38:
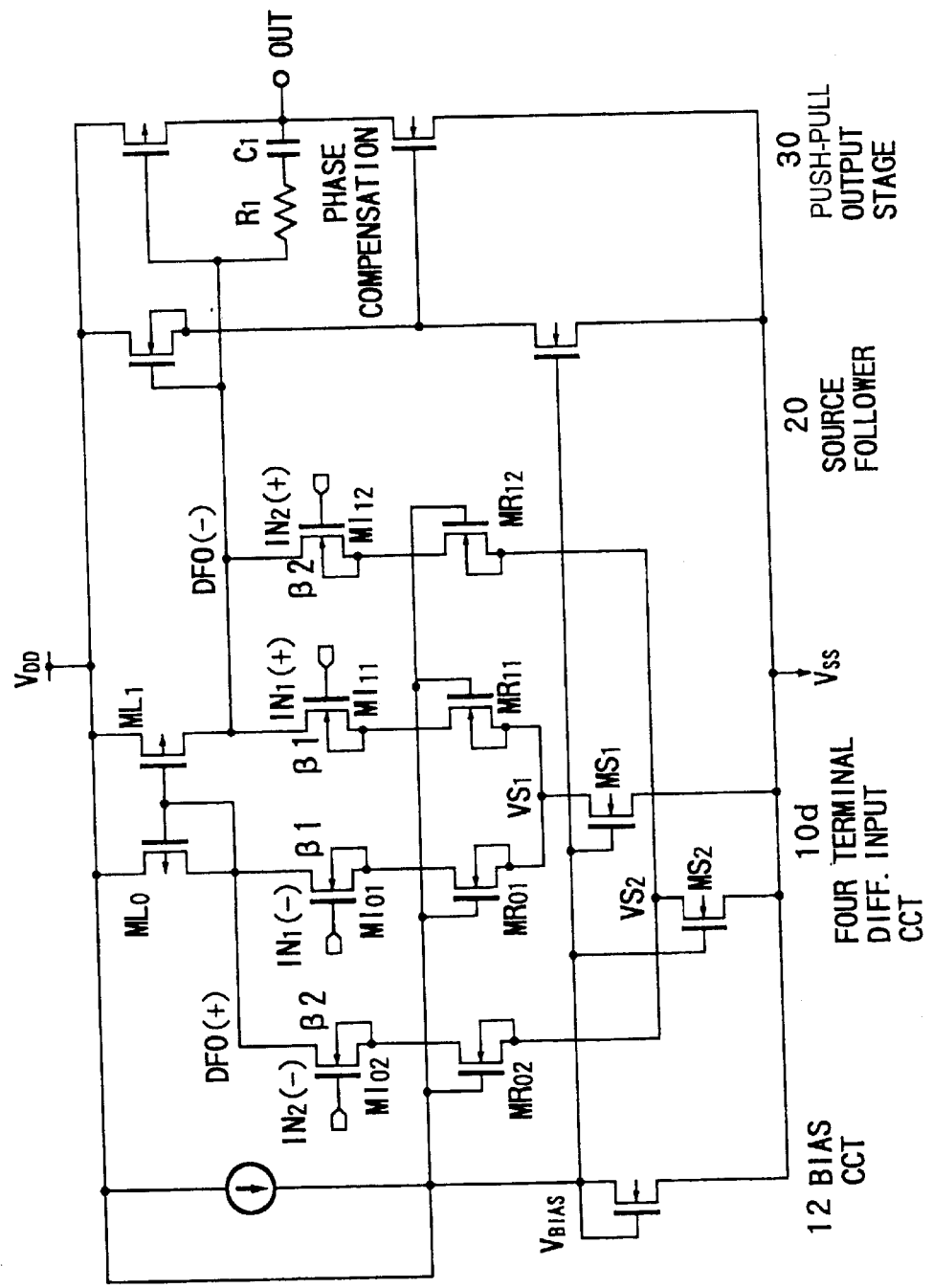
FIG. 38 is a circuit diagram of another example of the configuration of the fourth embodiment of the differential amplifier circuit according to the present invention.

FIG. 38 shows another example of the circuit of the multi-input differential amplifier circuit configured by a 4-terminal input differential input circuit 10d, the source follower 20, push-pull output stage 30, and the bias circuit 12. Except for the 4-terminal input differential input circuit 10d, the rest of the components have the same configuration as those of the comparable partial circuits of the example of the circuit shown in FIG. 35. Below, an explanation will be made of the configuration of the multi-input differential amplifier circuit of the present example focusing on the 4-terminal input differential input circuit 10d.

As illustrated, the 4-terminal input differential input circuit 10d is configured by two differential pairs configured by the transistors $MI_{01}$, $MI_{11}$ and $MI_{02}$, $MI_{12}$, the current mirror circuit comprising the transistors $ML_0$ and $ML_1$ configuring the output load of these differential pairs, the transistors $MR_{01}$, $MR_{11}$, $MR_{02}$, and $MR_{12}$ which are connected to the source side of the transistors $MI_{01}$, $MI_{11}$ and $MI_{02}$, $MI_{12}$ configuring the differential pairs and act as the resistance elements, and the transistors $MS_1$ and $MS_2$ for supplying the operating currents to the differential pairs.

As illustrated, four nMOS transistors $MR_{01}$, $MR_{11}$, $MR_{02}$, and $MR_{12}$ are provided in place of the resistance elements. The transistor $MR_{01}$ is connected between the transistor $MI_{01}$ and the node $VS_1$, and the transistor $MR_{11}$ is connected between the transistor $MI_{01}$ and the node $VS_1$. Similarly, the transistor $MR_{02}$ is connected between the transistor $MI_{02}$ and the node $VS_2$, and the transistor $MR_{12}$ is connected between the transistor $MI_{12}$ and the node $VS_2$.

The power supply voltage $V_{DD}$ is supplied to the gates of the transistors $MR_{02}$, $MR_{11}$, $MR_{02}$, and $MR_{12}$, so these transistors operate in the non-saturation region.

In the multi-input terminal differential amplifier circuit of the present example, when the current amplification rate of the transistors $MI_{01}$ and $MI_{11}$ configuring the two differential pairs is $\beta_1$, the current amplification rate of the transistors $MI_{02}$ and $MI_{12}$ is $\beta_2$, and $\beta_1:\beta_2=A:B$, the ratio of the current amplification rates of the transistors $MS_1$ and $MS_2$ acting as the current sources for supplying the operating currents to the differential pairs is set at A:B in the same way as the transistors configuring the differential pair. Further, where an equivalent resistance of the transistors $MR_{01}$ and $MR_{11}$ which are connected between the source of the transistors configuring each differential pair and the transistor configuring the current source and provided as the resistance elements is $R_A$, and the equivalent resistance of the transistors $MR_{02}$ and $MR_{12}$ is $R_B$, $R_A:R_B=(1/A):(1/B)=B:A$ is set.

In the 4-input terminal differential amplifier circuit configured in this way, the differential input signals input to the differential input terminals IN(+) and IN(−) and $IN_2(+)$ and $IN_2(-)$ are weighted with the ratio of A:B, and the amplified signals are output from the output terminal OUT of the push-pull output stage.

Figure 39:
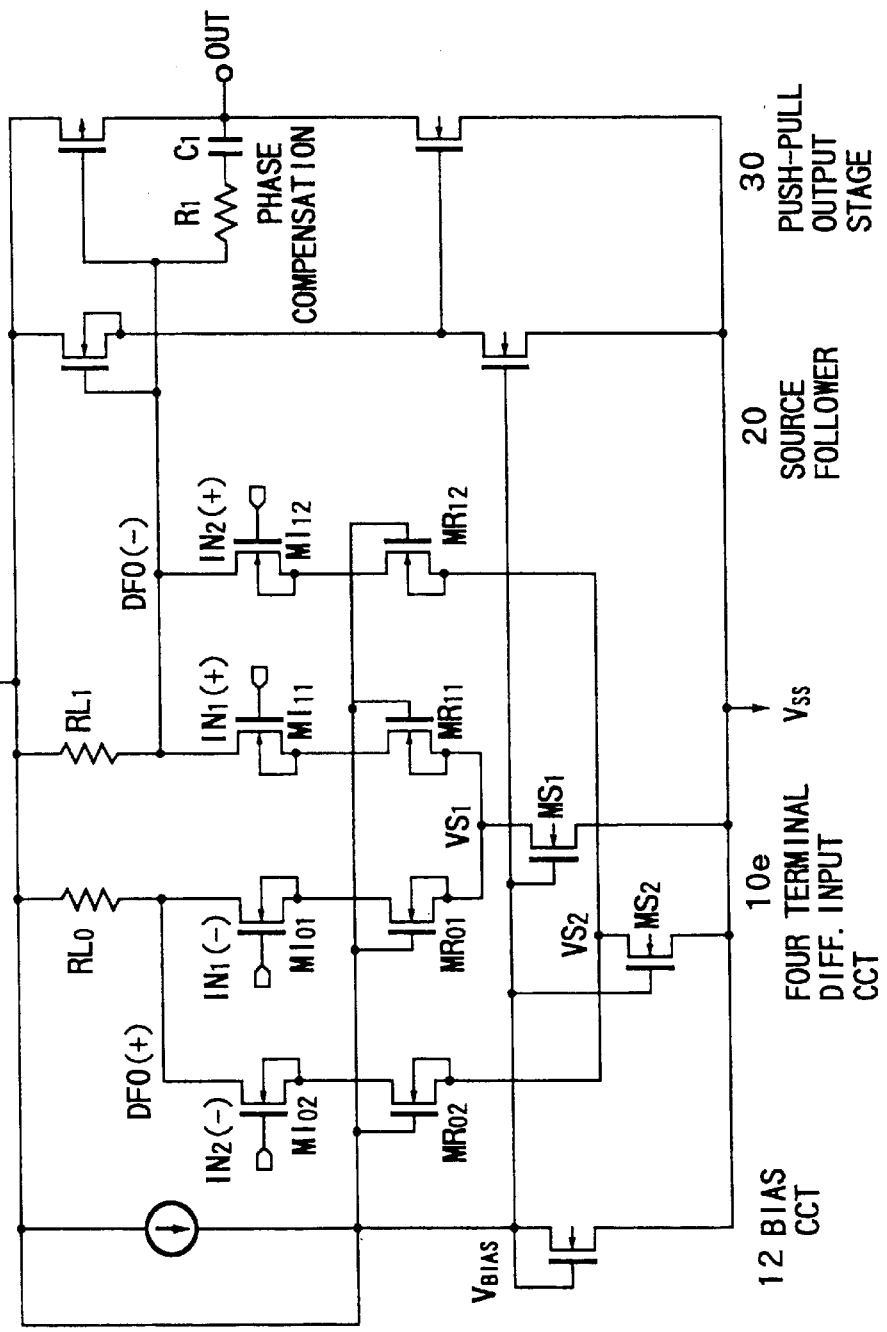
FIG. 39 is a circuit diagram of another example of the configuration of the fourth embodiment of the differential amplifier circuit according to the present invention.

FIG. 39 shows an example of another circuit of the multi-input differential amplifier circuit configured by a 4-terminal input differential input circuit 10e, the source follower 20, push-pull output stage 30, and the bias circuit 12. Except for the 4-terminal input differential input circuit 10e, the rest of the components have the same configuration as those of the comparable partial circuits of the example of the circuit shown in FIG. 38. Below, an explanation will be made of the configuration of the multi-input differential amplifier circuit of the present example focusing on the 4-terminal input differential input circuit 10e.

As illustrated, the 4-terminal input differential input circuit 10e is configured by two differential pairs configured by the transistors $MI_{01}$, $MI_{11}$ and $MI_{02}$, $MI_{12}$, resistance elements $RL_0$ and $RL_1$ configuring the output loads of these differential pairs, the transistors $MR_{01}$, $MR_{11}$, $MR_{02}$, and $MR_{12}$ which are connected to the source side of the transistors $MI_{10}$, $MI_{11}$, and $MI_{02}$, $MI_{12}$ configuring the differential pairs and equivalently act as the resistance elements, and the transistors $MS_1$ and $MS_2$ for supplying the operating currents to the differential pairs.

Namely, in the example of the present circuit, in comparison with the circuit shown in FIG. 38, the resistance elements $RL_0$ and $RL_1$ are used for the output load circuit in place of the current mirror circuit comprising the transistor. The rest of the circuit configuration is substantially the same as that of the example of the circuit shown in FIG. 38.

In the multi-input differential amplifier circuit of the present example, the differential input signals input to the differential input terminals IN(+) and IN(−) and $IN_2(+)$ and $IN_2(-)$ are weighted with the ratio of A:B, and the amplified signals are output from the output terminal OUT of the push-pull output stage.

Figure 40:
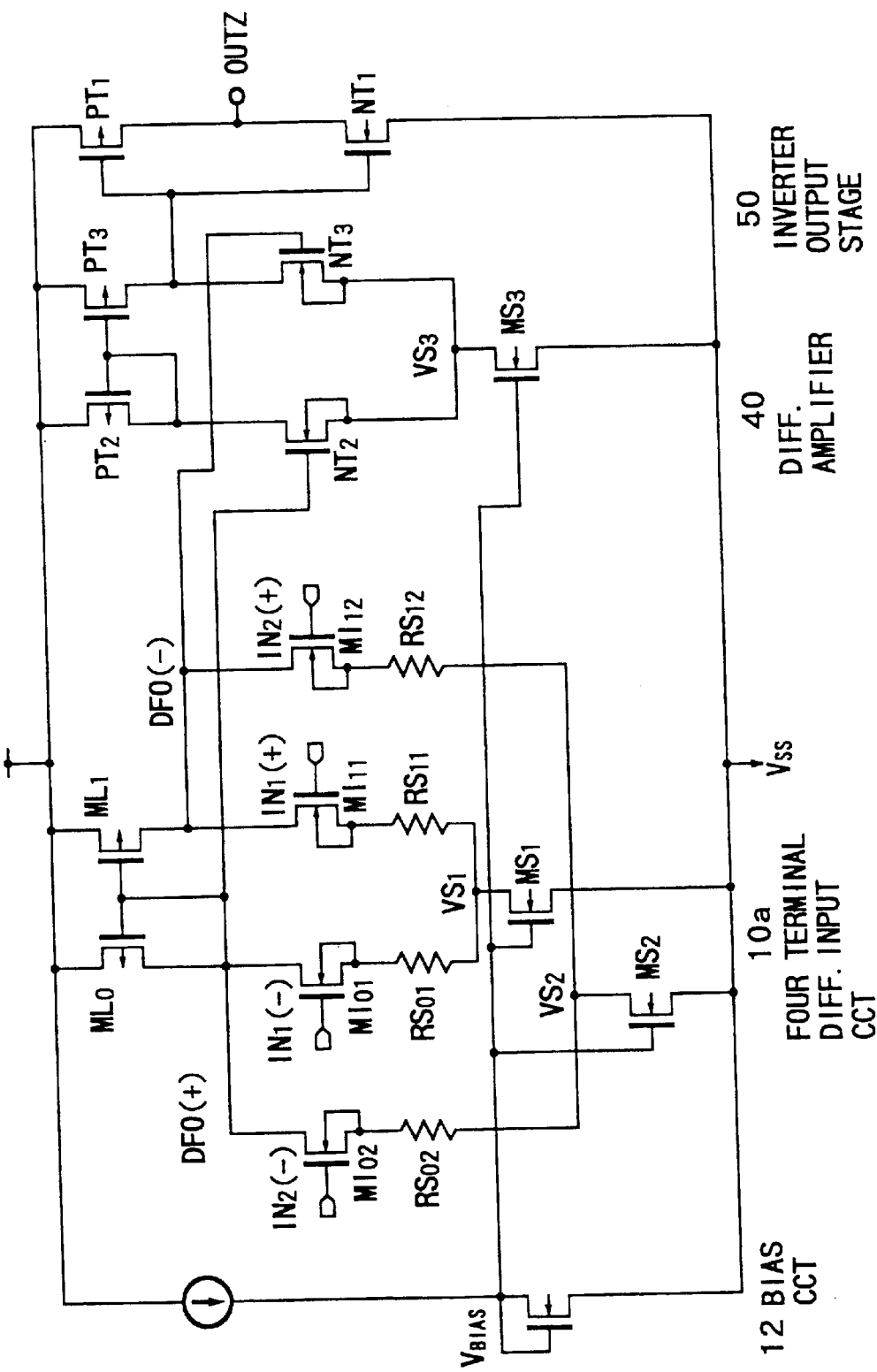
FIG. 40 Is a circuit diagram of another example of the configuration of the fourth embodiment of the differential amplifier circuit according to the present invention.

FIG. 40 shows an example of the multi-input differential amplifier circuit configured by the 4terminal input differential input circuit 10a, differential amplifier circuit 40, inverter output stage 50, and the bias circuit 12. Among them, the 4-terminal input differential input circuit 10a has the same configuration as that of the 4-terminal input differential input circuit 10a in the example of the circuit shown in FIG. 35, therefore, here, this partial circuit is indicated by assigning the same reference numeral 10a as that of FIG. 35.

The differential amplifier circuit 40 is configured by the differential pair comprising the nMOS transistors $NT_2$ and $NT_3$, the current mirror circuit comprising the pMOS transistors $PT_2$ and $PT_3$, and the current source configured by the nMOS transistor $MS_3$.

The gate of the transistor $NT_2$ configuring the differential pair is connected to the non-inverted output terminal DFO (+) of the 4-terminal input differential input circuit 10a, while the gate of the transistor $NT_3$ is connected to the inverted output terminal DFO(−). The sources of the transistors $NT_2$ and $NT_3$ are connected to the node vs3.

The sources of the transistors $PT_2$ and $PT_3$ are connected to the supply line of the power supply voltage $V_{DD}$, the gates of these transistors are commonly connected, and the connection point thereof is connected to the drain of the transistor $PT_2$. The drains of the transistors $PT_2$ and $PT_3$ are connected to the drains of the transistors $NT_2$ and $NT_3$. Namely, the current mirror circuit comprising the transistors $PT_2$ and $PT_3$ configures the load circuit of the differential amplifier circuit 40.

The drain of the transistor $MS_3$ is connected to the node $VS_3$, and the source is connected to the common voltage $V_{SS}$. The bias voltage $V_{BIAS}$ generated by the bias circuit 12 is supplied to the gate of the transistor $MS_3$. The transistor $MS_3$ forms the current source for supplying the operating current to the differential pair configured by the transistors $NT_2$ and $NT_3$.

The inverter output stage 50 is configured by the pMOS transistor $PT_1$ and the nMOS transistor $NT_1$. The transistors $PT_1$ and $NT_1$ are connected in series between the supply line of the power supply voltage $V_{DD}$ and the common voltage $V_{SS}$, the gates of these transistors are connected to each other, and the connection point thereof is connected to the output terminal of the differential amplifier circuit 40, that is, the connection point of the drains of the transistor $PT_3$ and the transistor $NT_3$. The connection point of the drains of the transistor $PT_1$ and the transistor $NT_1$ forms an output terminal OUTZ of the inverter output stage 50.

In the multi-input differential amplifier circuit shown in FIG. 40, the differential input signals input to the differential input terminals IN(+) and IN(−), $IN_2(+)$ and $IN_2(−)$ are amplified at the 4-terminal input differential input circuit 10a, and the amplified differential signals are output to the non-inverted output terminal DFO(+) and the inverted output terminal DFO(−) of the 4-terminal input differential input circuit 10a. The output differential signals of the 4-terminal input differential input circuit 10a are further amplified by the differential amplifier circuit 40, and the obtained amplified signals are inverted via the inverter output stage 50 and output from the output terminal OUTZ of the inverter output stage 50 as single end signals.

Fifth Embodiment

Figure 41:
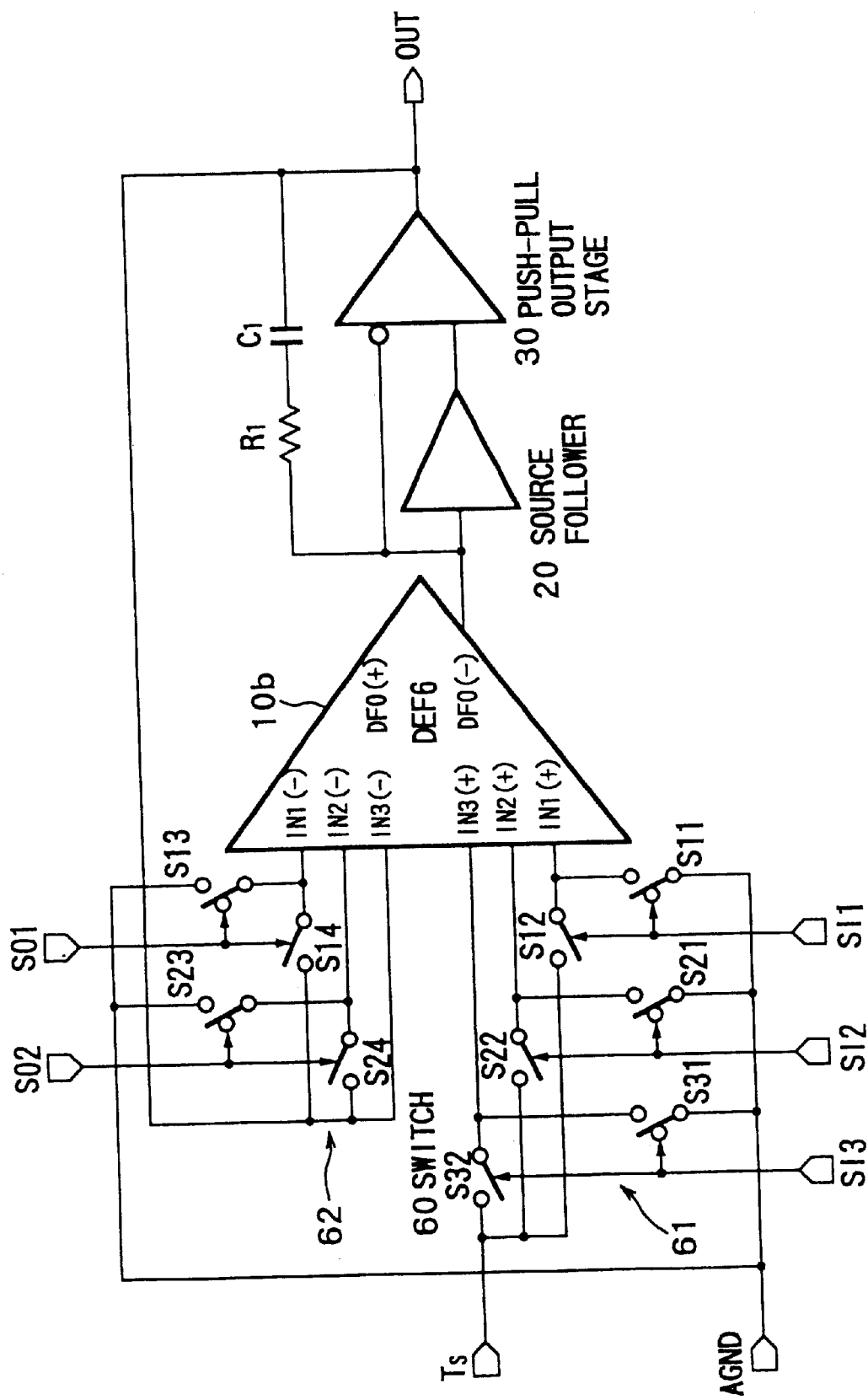
FIG. 41 is a circuit diagram of an example of the configuration of a fifth embodiment of the differential amplifier circuit according to the present invention.

FIG. 41 shows an embodiment of the multi-input differential amplifier circuit configured by a switch circuit 60 for switching the input to the input terminals of the differential input circuit, 6-terminal input differential input circuit 10b, source follower 20, and the push-pull output stage 30.

The switch circuit 60 is configured by a positive side switch circuit 61 and a negative side switch circuit 62. The positive side switch circuit 61 is configured by switches S11, S12, S21, S22, S31, and S32. The switches S11 and S12 are controlled by a control signal SI1, the switches S21 and S22 are controlled by a control signal SI2, and the switches S31 and S32 are controlled by a control signal SI3.

The negative side switch circuit 62 is configured by switches S13, S14, S23, and S24. The switches S13 and S14 are controlled by a control signal SO1, and the switches S23 and S24 are controlled by a control signal SO2.

The positive side input terminals $IN_1(+)$, $IN_2(+)$, and $IN_3(+)$ of the 6-terminal input differential input circuit 10b are connected to a signal input terminal $T_S$ when the control signals SI1, SI2, and SI3 are at a high level, while are connected to the analog ground voltage AGND when the control signals SI1, SI2, and SI3 are at a low level.

The negative side input terminals $IN_1(−)$, $IN_2(−)$, and $IN_S(−)$ are connected to the output terminal OUT when the control signals SO1 and SI2 are at high level and are connected to the analog ground voltage AGND when the control signals SO1 and SI2 are at a low level.

In the example of the circuit of FIG. 41, the negative side input terminal IN3(−) is connected to the output terminal OUT of the push-pull output stage 30, therefore the negative feedback is always applied.

The 6-terminal input differential input circuit 10b has the same configuration as that of for example the 6-terminal input differential input circuit 10b shown in FIG. 26 in the fourth embodiment mentioned above. Here, it is indicated by assigning the same reference numeral 10b as that of FIG. 36 to this partial circuit.

As mentioned above, the 6-terminal input differential input circuit 10b is set so that conductances of the transistors configuring the differential input elements, the resistance elements connected to the source side of the transistors, and the transistor acting as the current source for supplying the operating current to the differential pair are different for every differential pair. For this reason, the differential input signals input to the differential input terminals $IN_1(+)$ and $IN_1(−)$, $IN_2(+)$ and $IN_2(−)$, and $IN_3(+)$ and $IN_S(−)$ are weighted and amplified. Here, assume for example the differential input signals input to the differential input terminals $IN_1(+)$ and $IN_1(−)$, $IN_2(+)$ and $IN_2(−)$, and $IN_3(+)$ and $IN_3(−)$ are weighted with the ratio of 1:2:3.

In the multi-input differential amplifier circuit configured in this way, since the negative feedback is applied, the following equation is obtained:

$$A \cdot V_{IN1}(+) + B \cdot V_{IN2}(+) + C \cdot V_{IN3}(+) = A \cdot V_{IN1}(-) + B \cdot V_{IN2}(-) + C \cdot V_{IN3}(-) \quad (56)$$

In equation (56), $V_{IN1}(+)$, $V_{IN2}(+)$, and $V_{IN3}(+)$ are input signal voltages to the positive side input terminals $IN_1(+)$, $IN_2(+)$, and $IN_3(+)$, and $V_{IN1}(−)$, $V_{IN2}(−)$, and $V_{IN3}(−)$ are input signal voltages to the negative side input terminals $IN_1(−)$, $IN_2(−)$, and $IN_3(−)$.

When the analog ground voltage AGND is 0V, the input signal voltage of the signal input terminal $T_S$ is $v_{in}$, and the output signal voltage of the output terminal OUT is $v_{out}$, the switching by the switch circuit 60 is represented by the following equation:

$$V_{INi}(+) = SI_i \cdot v_{in} \quad (i=1 \text{ to } 3)$$

$$V_{INj}(-) = SO_j \cdot v_{out} \quad (j=1 \text{ to } 2)$$

$$V_{IN3}(-) = v_{out} \qquad (57)$$

In equation (57), it is assumed that the signals $SI_i$ and $SO_j$ are "1" at a high level, while are "0" at a low level.

When assuming that A, B, and C in equation (56) are 1, 2, and 3, the following equations (58) and (59) are obtained from equations (56) and (57):

$$1SI_1 \cdot v_{in} + 2SI_2 \cdot v_{in} + 3SI_3 \cdot V_{in} = 1SO_1 \cdot v_{out} + 2SO_2 \cdot v_{out} + 3v_{out} \quad (58)$$

$$v_{out} = \{(1 \cdot SI_1 + 2 \cdot SI_2 + 3 \cdot SI_S)/(1 \cdot SO_1 + 2 \cdot SO_2 + 3)\} \cdot v_{in} {}_{-G \cdot vin} \quad (59)$$

In equation (59), G is the gain of the multi-input differential amplifier circuit of the present embodiment. As the numerator of the gain G, any integer from 0 to 6 can be set by the signals $SI_1$, $SI_2$, and $SI_3$, and as the denominator, any integer from 3 to 6 can be set by the signals SO, and SO2. For this reason, it is possible to set any gain G in 0, 1/6, 1/5, 1/4, 1/3, 2/5, 1/2, 2/3, 3/5, 3/4, 4/5, 5/6, 1, 6/5, 5/4, 4/3, 3/2, 5/3, and 2.

Also for making good use of such a high functional processing circuit, a linear input-output characteristic must be obtained with respect to the wide input voltage range in the multi-input differential amplifier circuit.

Sixth Embodiment

Figure 42:
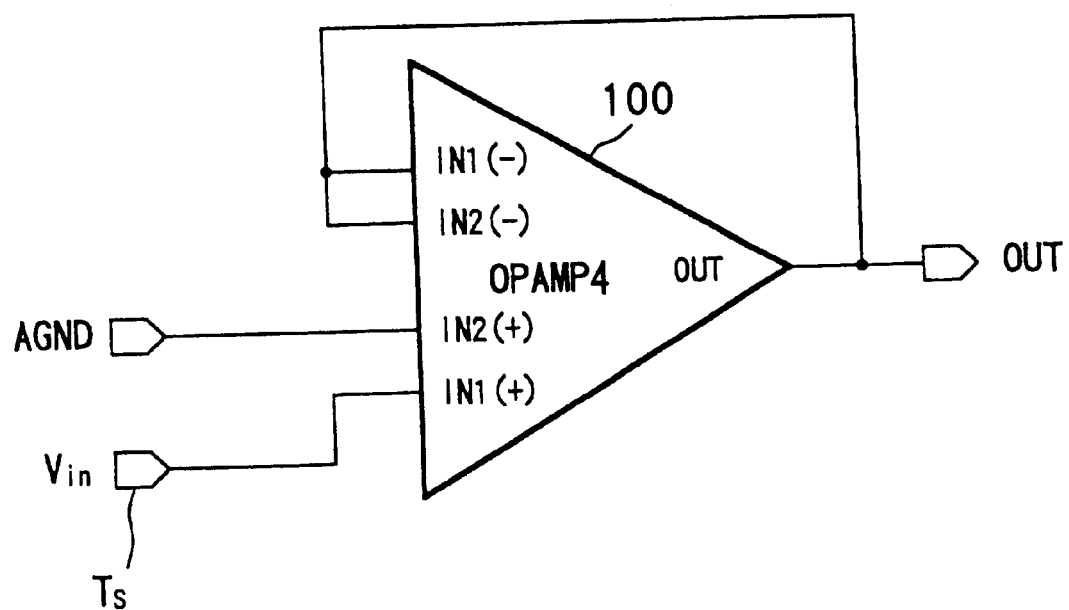
FIG. 42 is a circuit diagram of an example of the configuration of a sixth embodiment of the differential amplifier circuit according to the present invention.

FIG. 42 is a circuit diagram of an embodiment of the operational amplifier circuit of a gain of 1/2 configured by using the 4-terminal input differential amplifier circuit.

As illustrated, the operational amplifier circuit of the present embodiment (OPAMP4) is configured by a 4-terminal input differential amplifier circuit 100. Both of the inverted input terminals $IN_1(-)$ and $IN_2(-)$ of the 4-terminal input differential amplifier circuit 100 are connected to the output terminal OUT. The non-inverted input terminal $IN_1(+)$ is connected to the input terminal $T_S$ of the input signal $v_{in}$, and the non-inverted input terminal $IN_2(+)$ is connected to the analog ground voltage AGND.

Note that the 4-terminal input differential amplifier circuit 100 of the present embodiment has the same configuration as that of the 4-terminal input differential amplifier circuit 10 shown in FIG. 35 or FIG. 38.

In the 4-terminal input differential amplifier circuit of the present embodiment, the output signal $v_{out}$ is represented by the following equation with respect to the input signal $V_{in}$:

$$2v_{out} = v_{in} \quad (60)$$

Namely, the gain G of the differential amplifier circuit becomes $(G = V_{out}/V_{in} = 1/2)$.

Figure 43:
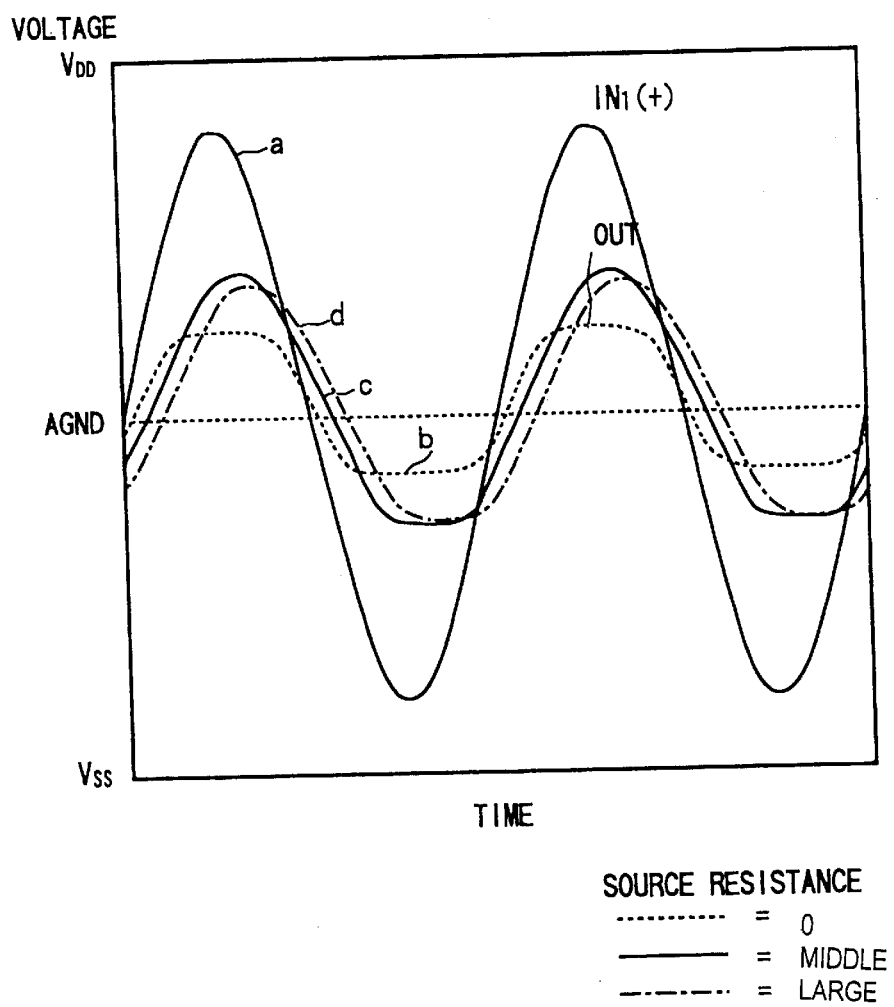
FIG. 43 is a waveform diagram of the operation of the differential amplifier circuit of the sixth embodiment.

FIG. 43 shows a waveform at the operation of the differential amplifier circuit of the present embodiment. In FIG. 43, a indicates the input signal $v_{in}$, b indicates the output signal when there is no source resistor, c indicates the output signal when the source resistance is a medium extent, and d indicates the waveform of the output signal $v_{out}$ when the source resistance is large.

As shown in FIG. 43, when resistances are not connected to the source side of the transistors configuring the differential pair, that is, in the case of the conventional multi-input differential amplifier circuit, when the voltage level of the input signal $v_{in}$ approaches the power supply voltage $V_{DD}$ or the common voltage $V_{SS}$, the peak part of the output signal indicated in b is clamped, and distortion occurs in the output signal. Contrary to this, when the resistors are connected to the source side of the transistors as in the present embodiment, the distortion of the signal is reduced. For example, the power supply voltage $V_{DD}$ side of the output signal is not clamped much at all. Only the common voltage $V_{SS}$ side is slightly clamped.

Namely, by connecting resistances to the source side of the transistors configuring the differential pair, the linear characteristic of the differential amplifier circuit is improved, the input voltage range is enhanced, and the dynamic range becomes wider.

Figure 44:
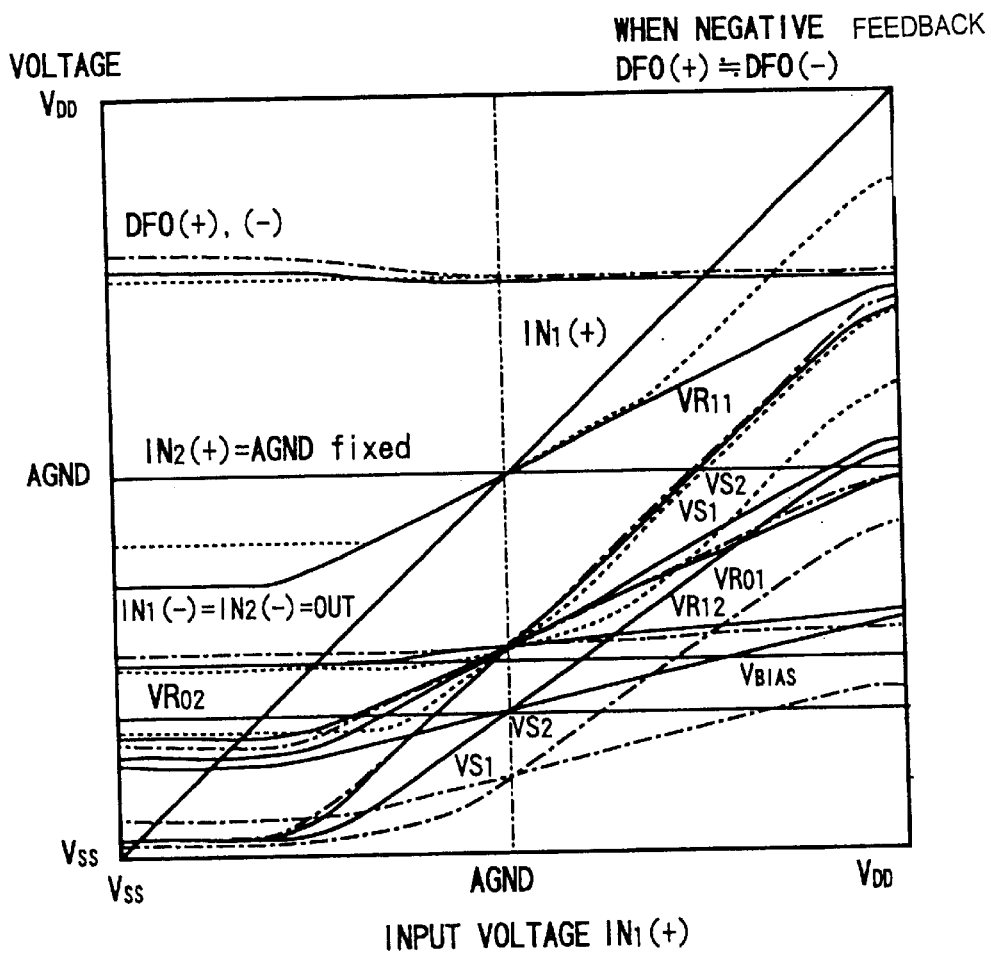
FIG. 44 is a graph of the internal voltage-input voltage dependency due to the source resistance of a differential input circuit part of the operational amplifier circuit of a ½ gain using the differential amplifier circuit of the sixth embodiment.

FIG. 44 is a graph of the change of the internal operating voltage-input voltage dependency due to the source resistance value of the differential input circuit part of the operation amplifier circuit of a 1/2 gain using the multi-input differential amplifier circuit of the present embodiment. Further, FIG. 45 is a graph of the change of the operating current-input voltage dependency due to the source resistance value of the differential input circuit part.

Figure 45:
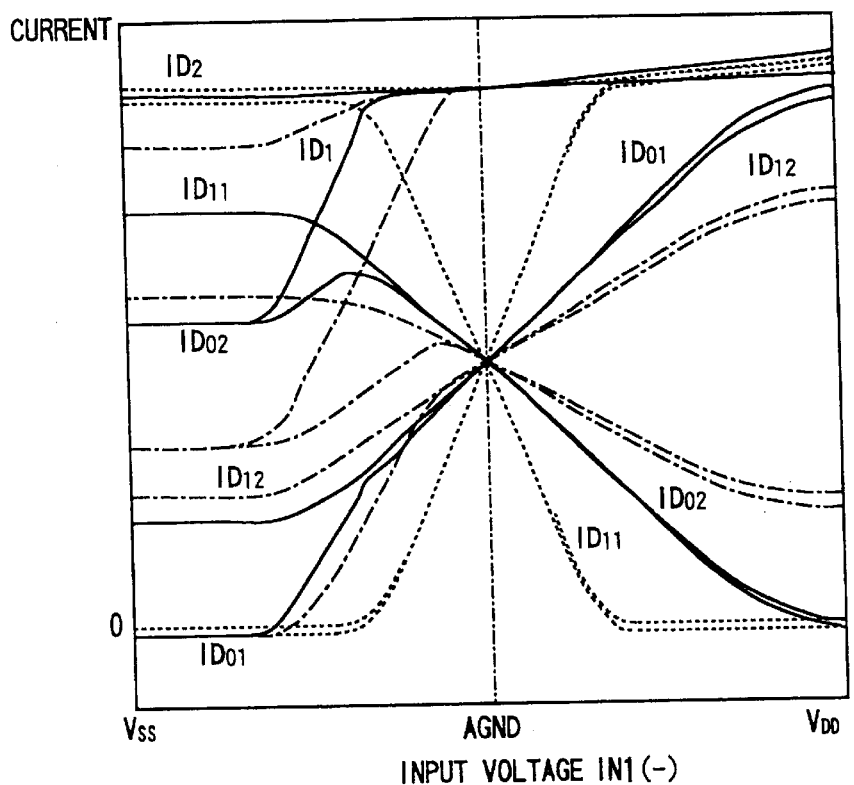
FIG. 45 is a graph of the current-input voltage dependency due to the source resistance of a differential input circuit part of the operational amplifier circuit of a ½ gain using the differential amplifier circuit of the sixth embodiment.

It is obvious also from the characteristics of FIG. 44 and FIG. 45 that the input voltage range in which a linear characteristic is obtained between the input and output voltages is enhanced by connecting the resistances to the source side of the transistors configuring the differential pair.

Seventh Embodiment

Figure 46:
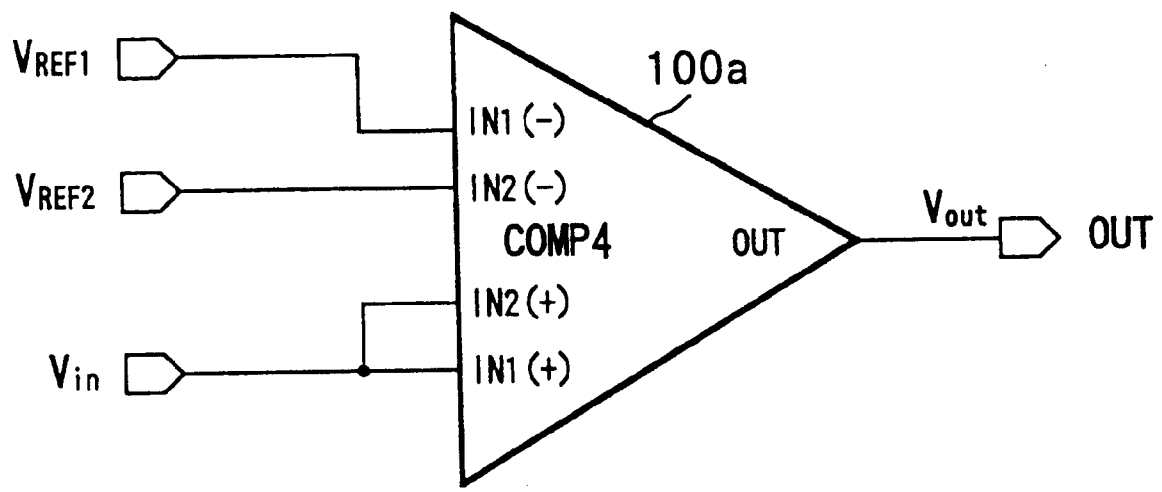
FIG. 46 is a circuit diagram of the configuration of a comparison circuit of a seventh embodiment of the differential amplifier circuit according to the present invention.

FIG. 46 shows an embodiment of a 4-terminal input comparison circuit (COMP4) configured by a 4-terminal input differential amplifier circuit 10a. As the 4-terminal input differential amplifier circuit 10a configuring the comparison circuit of the present embodiment, one the same as the 4-terminal input differential amplifier circuit 100 configuring the operation amplifier circuit shown in FIG. 42 can be used. Note that since the present embodiment configures a comparison circuit, the phase correction circuit in the differential amplifier circuit can be omitted.

As shown in FIG. 46, the inverted input terminals $IN_1(-)$ and $IN_2(-)$ of the 4-terminal input differential amplifier circuit 100a are connected to the input terminals of the reference voltages $V_{REF1}$ and $V_{REF2}$. Both of the non-inverted input terminals $IN_1(+)$ and $IN_2(+)$ are connected to the input terminal of the input signal $v_{in}$.

In the comparison circuit configured in this way, when the level of the input signal $v_{in}$ cuts across $(V_{REF1} + V_{REF2})/2$, the level of the output signal $v_{out}$ changes.

Figure 47:
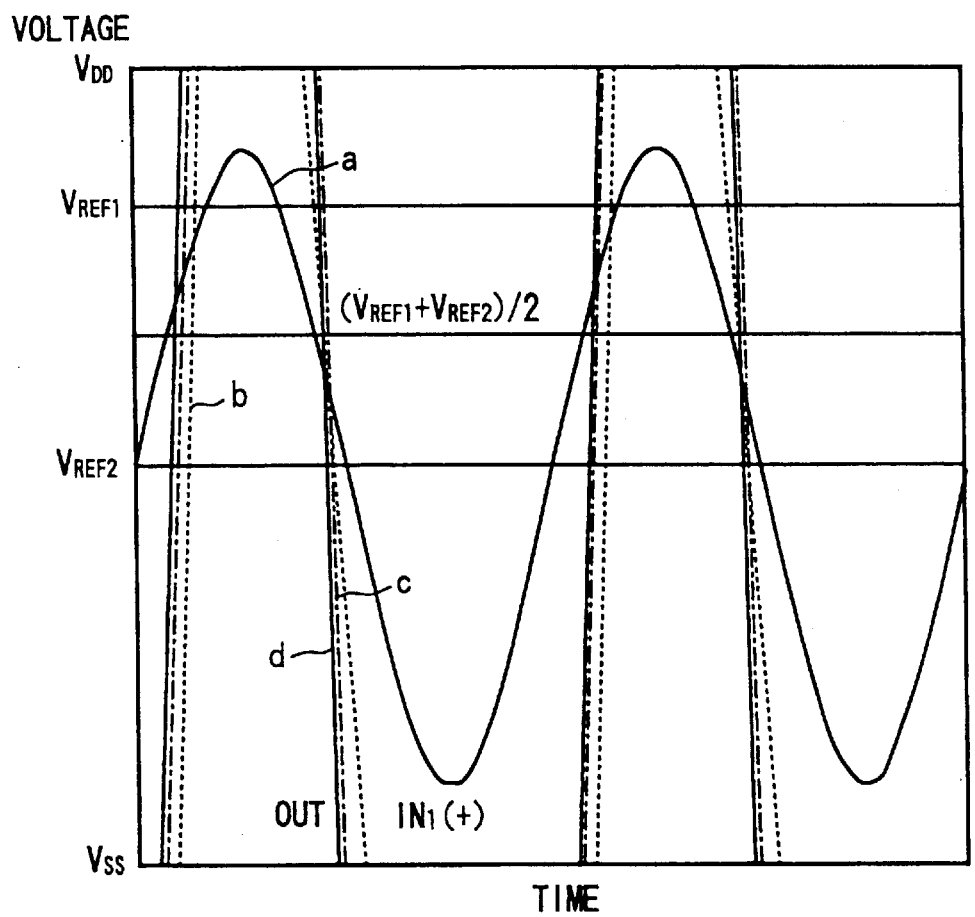
FIG. 47 is a waveform diagram of the operation of the differential amplifier circuit of the seventh embodiment.

FIG. 47 indicates the relationship of a timing of the level change of the input signal and the output signal and the value of the resistances connected to the source side of the transistors configuring the differential pair. In the same figure, a indicates the input signal $v_{in}$, b indicates the output signal where there is no source resistor, c indicates the output signal in the case where the source resistance is of an intermediate extent, and d indicates the waveform of the output signal $v_{out}$ when the source resistance is large.

As illustrated, after a predetermined delay time elapses after the level of the input signal $v_{in}$ rises and then exceeds $(V_{REF1} + V_{REF2})/2$, the level of the output signal changes from a low level to high level. Conversely, after the predetermined delay time elapses after the level of the input signal $v_{in}$ falls and becomes smaller than $(V_{REF1} + V_{REF2})/2$, the level of the output signal changes from a high level to low level.

When resistances are not connected to the source side of the transistors configuring the differential pair, that is, in the conventional multi-input differential amplifier circuit, when using the level of $(V_{REF1} + V_{REF2})/2$ as a reference, the delay time up to the change of the output signal $v_{out}$ with respect to the change of the input signal $v_{in}$ is large. This is because, the comparison and judgment are not carried out at the level of $(V_{REF1} + V_{REF2})/2$ in actuality since the input range of the linear characteristic of the multi-input differential amplifier circuit is narrow.

As in the present embodiment, by connecting the resistances to the source side of the transistors configuring the differential pair, the delay time after the input signal $v_{in}$ traverses $(V_{REF1} + V_{REF2})/2$ until the level of the output signal $v_{out}$ changes has become sufficiently small.

In this way, when the comparison circuit is configured by a multi-input differential amplifier circuit in which resistances are connected to the source side of the transistors configuring the differential pair, the characteristic is enhanced and the delay time inherent in the comparison circuit can be shortened.

Eighth Embodiment

Figure 48:
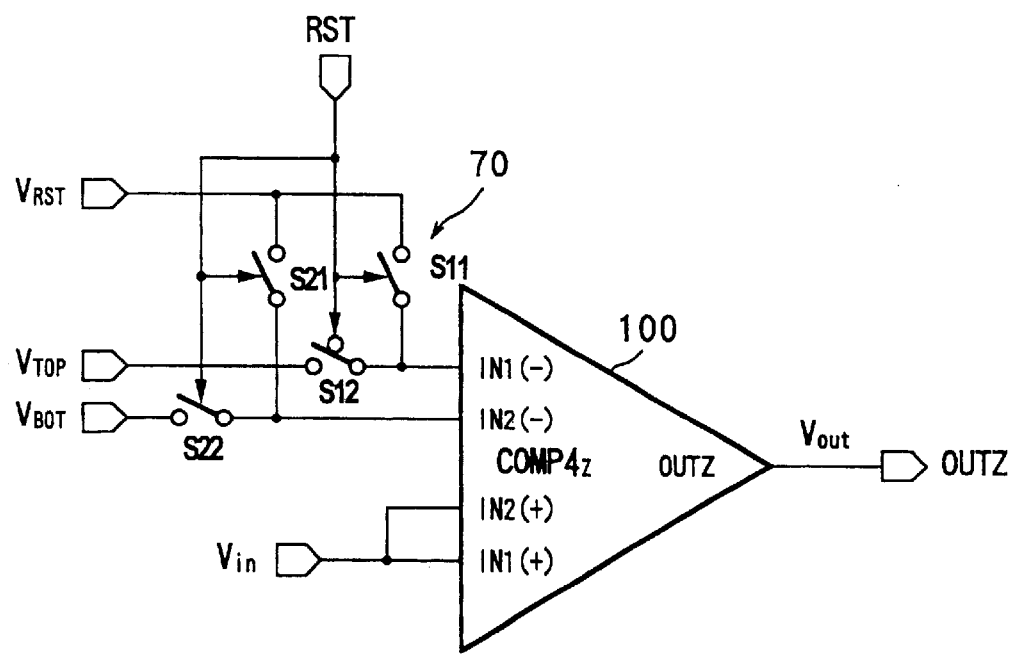
FIG. 48 is a circuit diagram of the configuration of a comparison and judgment circuit of an eighth embodiment of the differential amplifier circuit according to the present invention.
Figure 49:
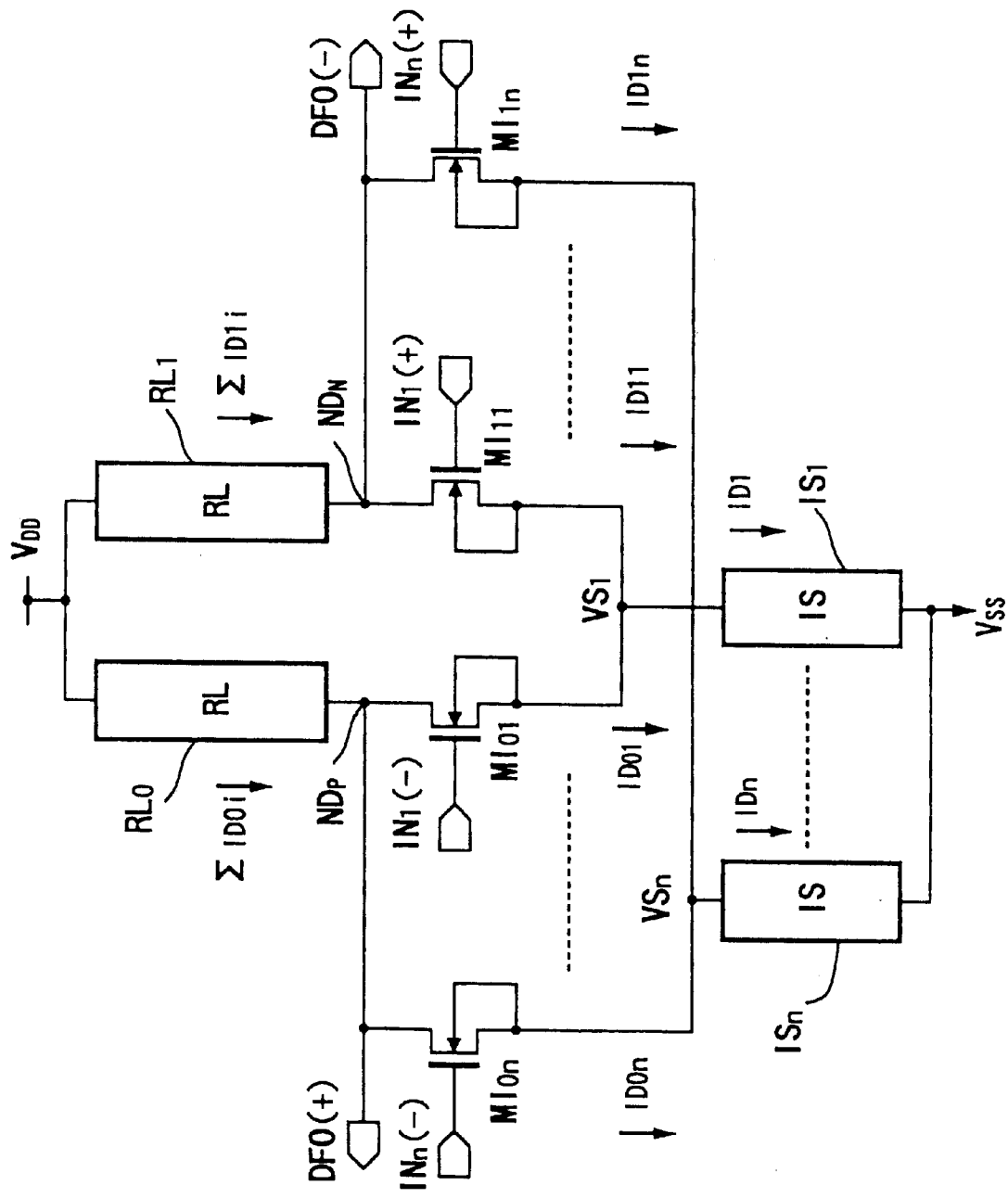
FIG. 49 is a circuit diagram of an example of a conventional multi-input differential amplifier circuit.
Figure 50:
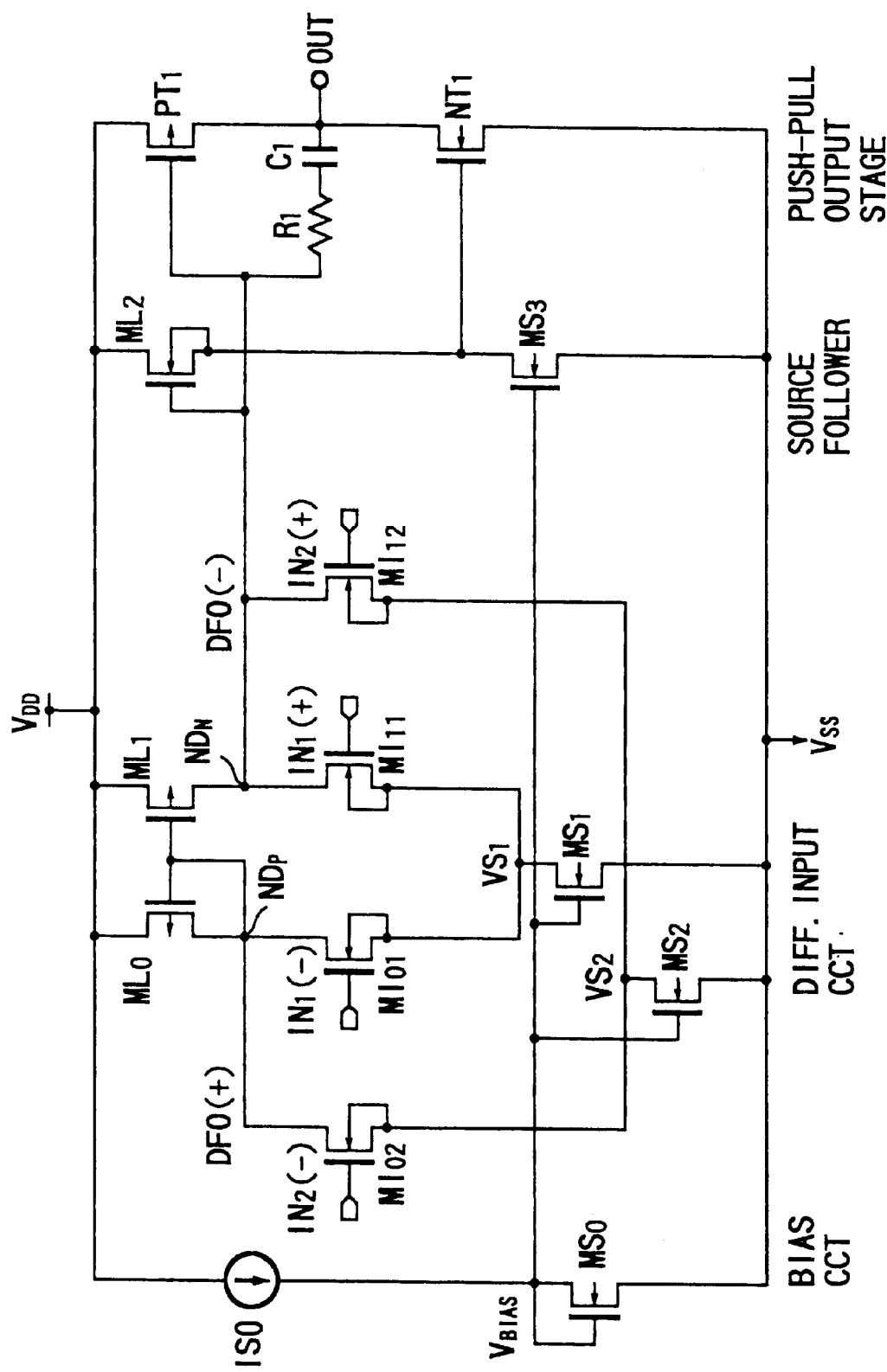
FIG. 50 is a circuit diagram of an example of the configuration of a conventional multi-input differential amplifier circuit.
Figure 51:
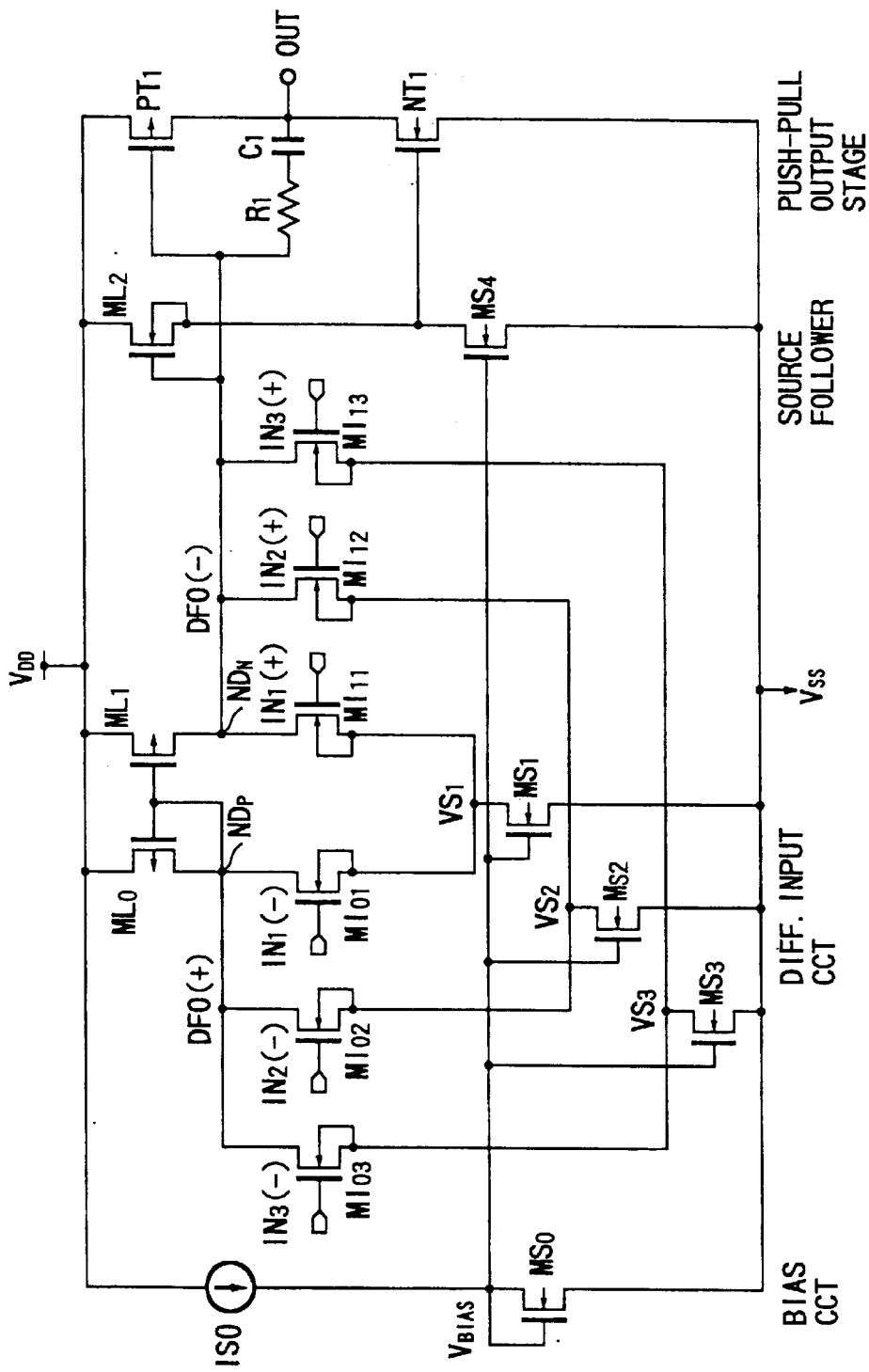
FIG. 51 is a circuit diagram of another example of the configuration of a conventional multi-input differential amplifier circuit.

FIG. 48 shows an embodiment of the comparison and judgment circuit configured by the 4-terminal input differential amplifier circuit 100 and a switch circuit 70 for switching the input to the differential amplifier circuit 100.

As illustrated, the switch circuit 70 is configured by switches S11, S12, S21, and S22. These switches are controlled by a control signal RST. For example, when the control signal RST is at a high level, the inverted input terminals $IN_1(-)$ and $IN_2(-)$ of the 4-terminal input differential amplifier circuit 100 are connected to the input terminal of a reset voltage $V_{RST}$, while when the control signal RST is at low level, the inverted input terminals $IN_1(-)$ and $IN_2(-)$ are connected to the output terminal having for example an upper limit value $V_{TOP}$ and a lower limit value $V_{BOT}$ of a peak detection circuit.

In the comparison and judgment circuit configured by the 4-terminal input differential amplifier circuit as in the present embodiment, for example, when the control signal RST is at a high level, the level of the input signal $v_{in}$ and $V_{RST}/2$ are compared and the level of the output signal $V_{out}$ is set according to the result thereof. On the other hand, when the control signal RST is at a low level, the level of the input signal $v_{in}$ and the level of $(V_{TOP}+V_{BOT})/2$ are compared, and the level of the output signal $v_{out}$ is set according to the result of the comparison. In the same way as the other embodiments mentioned above, for example, by connecting resistances to the source side of the transistors configuring the differential pair of the 4-terminal input differential amplifier circuit 100, the linear input-output characteristic can be obtained with respect to a sufficiently wide input voltage range in the differential amplifier circuit 100. As a result, the characteristic of the comparison and judgment circuit can be enhanced.

As explained above, according to the multi-input differential amplifier circuit of the present invention, the voltage range in which a linear characteristic can be obtained between the input and the output can be broadened and the dynamic range can be extended. For this reason, there is the advantage that the performances of the processing circuit and the comparison and judgment circuit configured by the differential amplifier circuit can be enhanced.

While the invention has been described with reference to specific embodiment chosen for purpose of illustration, it should be apparent that numerous modifications could be made thereto by those skilled in the art without departing from the basic concept and scope of the invention.

What is claimed is:

1. A multi-input type differential amplifier circuit having at least two pairs of positive and negative input terminals, comprising:
    at least two differential pairs, each comprising a first and a second transistor with control gates which are respectively connected to said positive and negative input terminals, with terminals which are connected to first and second output terminals, and with other terminals which are connected to current supply nodes via first and second resistors,
    at least two current sources for supplying operating currents to said current supply nodes in said differential pairs, and
    first and second load circuits being connected between said first and second output terminals and a supply line connectible to a first power supply voltage.

2. A multi-input type differential amplifier circuit as set forth in claim 1, wherein said current sources for supplying the operating current to said differential pairs are each configured by a transistor with a control gate to which a predetermined bias voltage is applied, with one terminal which is connected to said current supply node, and with another terminal which is connected to the supply line connectible to a second power supply voltage.

3. A multi-input type differential amplifier circuit as set forth in claim 1, wherein said first and second load circuits are configured by resistors connected between said first and second output terminals and the supply line connectible to said first power supply voltage.

4. A multi-input type differential amplifier circuit as set forth in claim 1, wherein
    said first and second load circuits are configured by resistors connected between said first and second output terminals and the supply line connectible to said first power supply voltage and
    still other terminals of the first and second transistors, respectively, are connected in common and the connection points are connected, respectively, to the first and second output terminals.

5. A multi-input type differential amplifier circuit having at least two pairs of positive and negative input terminals, comprising:
    at least two differential pairs each comprising a first and a second transistor with control gates which are respectively connected to said positive and negative input terminals, with terminals which are connected to first and second output terminals, and with other terminals which are connected to current supply nodes via third and fourth transistors,
    at least two current sources for supplying operating currents to said current supply nodes in said differential pairs,
    first and second load circuits being connected between said first and second output terminals and a supply line connectible to a first power supply voltage, and
    a predetermined bias voltage being applied to the control gates of said third and fourth transistors.

6. A multi-input type differential amplifier circuit as set forth in claim 5, wherein said current source for supplying the operating current to said each differential pair is configured by a transistor to the control gate of which the predetermined bias voltage is applied, one terminal of which is connected to said current supply node, and the other terminal of which is connected to the supply line connectible to a second power supply voltage.

7. A multi-input type differential amplifier circuit as set forth in claim 5, wherein said first and second load circuits are configured by resistors connected between said first and second output terminals and the supply line connectible to said first power supply voltage.

8. A multi-input type differential amplifier circuit as set forth in claim 5, wherein
    said first and second load circuits are configured by resistors connected between said first and second output terminals and the supply line connectible to said first power supply voltage and
    still other terminals of the first and second transistors, respectively, are connected in common and the connection points are connected, respectively, to the first and second output terminals.

* * * * *